(12) United States Patent
Hatakeyama et al.

(10) Patent No.: US 8,431,892 B2
(45) Date of Patent: Apr. 30, 2013

(54) DETECTOR AND INSPECTING APPARATUS

(75) Inventors: Masahiro Hatakeyama, Tokyo (JP); Shoji Yoshikawa, Tokyo (JP); Kenichi Suematsu, Tokyo (JP); Tsutomu Karimata, Tokyo (JP); Nobuharu Noji, Tokyo (JP)

(73) Assignee: Ebara Corporation, Tokyo (JP)

( * ) Notice: Subject to any disclaimer, the term of this patent is extended or adjusted under 35 U.S.C. 154(b) by 88 days.

(21) Appl. No.: 12/899,270

(22) Filed: Oct. 6, 2010

(65) Prior Publication Data

US 2011/0024623 A1 Feb. 3, 2011

Related U.S. Application Data

(62) Division of application No. 12/063,604, filed as application No. PCT/JP2006/315812 on Aug. 10, 2006, now Pat. No. 7,928,382.

(30) Foreign Application Priority Data

Aug. 12, 2005 (JP) .................................. 2005-234079

(51) Int. Cl.
*G01N 23/00* (2006.01)
*G21K 7/00* (2006.01)

(52) U.S. Cl.
USPC ........... 250/306; 250/307; 250/310; 250/311; 250/492.2

(58) Field of Classification Search .................. 250/306, 250/307, 310, 311, 492.2
See application file for complete search history.

(56) References Cited

U.S. PATENT DOCUMENTS

| 5,665,968 | A | 9/1997 | Meisburger et al. |
| 7,084,406 | B2 | 8/2006 | Knippelmeyer |
| 7,928,382 | B2 * | 4/2011 | Hatakeyama et al. ........ 250/310 |

(Continued)

FOREIGN PATENT DOCUMENTS

| JP | 58-159192 U | 5/1985 |
| JP | 60-065967 U | 5/1985 |

(Continued)

OTHER PUBLICATIONS

European Search Report dated Oct. 28, 2009, issued in corresponding European Patent Application No. 06782616.

(Continued)

*Primary Examiner* — Jack Berman
*Assistant Examiner* — Meenakshi Sahu
(74) *Attorney, Agent, or Firm* — Westerman, Hattori, Daniels & Adrian, LLP

(57) ABSTRACT

An inspecting apparatus for reducing a time loss associated with a work for changing a detector is characterized by comprising a plurality of detectors 11, 12 for receiving an electron beam emitted from a sample W to capture image data representative of the sample W, and a switching mechanism M for causing the electron beam to be incident on one of the plurality of detectors 11, 12, where the plurality of detectors 11, 12 are disposed in the same chamber MC. The plurality of detectors 11, 12 can be an arbitrary combination of a detector comprising an electron sensor for converting an electron beam into an electric signal with a detector comprising an optical sensor for converting an electron beam into light and converting the light into an electric signal. The switching mechanism M may be a mechanical moving mechanism or an electron beam deflector.

26 Claims, 31 Drawing Sheets

U.S. PATENT DOCUMENTS

| | | |
|---|---|---|
| 2001/0017878 A1 | 8/2001 | Nozoe et al. |
| 2003/0116717 A1 | 6/2003 | Knippelmeyer |
| 2004/0065827 A1 | 4/2004 | Kienzle et al. |
| 2004/0238740 A1* | 12/2004 | Kohama et al. ............... 250/310 |
| 2005/0045821 A1* | 3/2005 | Noji et al. .................... 250/311 |

FOREIGN PATENT DOCUMENTS

| | | |
|---|---|---|
| JP | 11-345585 A | 12/1999 |
| JP | 2000-149853 A | 5/2000 |
| JP | 2003-157791 A | 5/2003 |
| JP | 2003-208865 A | 7/2003 |
| JP | 2004-134374 A | 4/2004 |
| JP | 2004-327121 A | 11/2004 |

OTHER PUBLICATIONS

International Search Report of PCT/JP2006/315812, date of mailing Nov. 21, 2006.

* cited by examiner

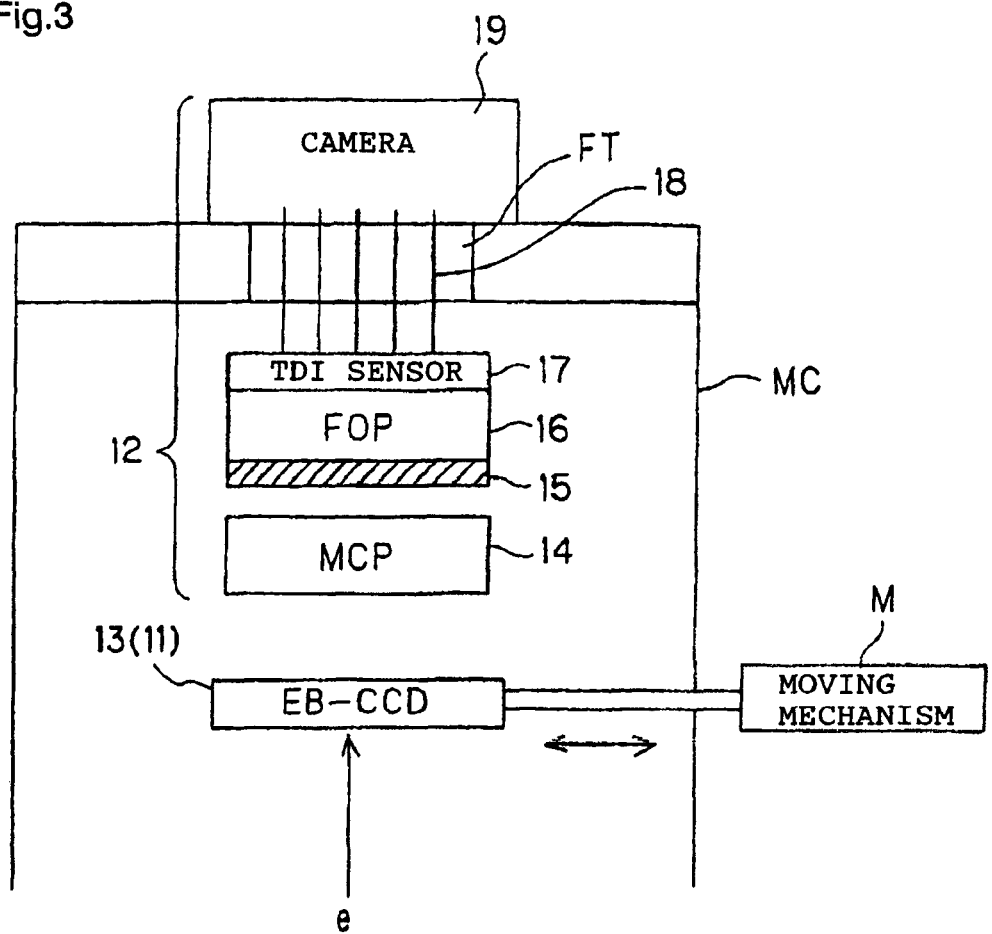

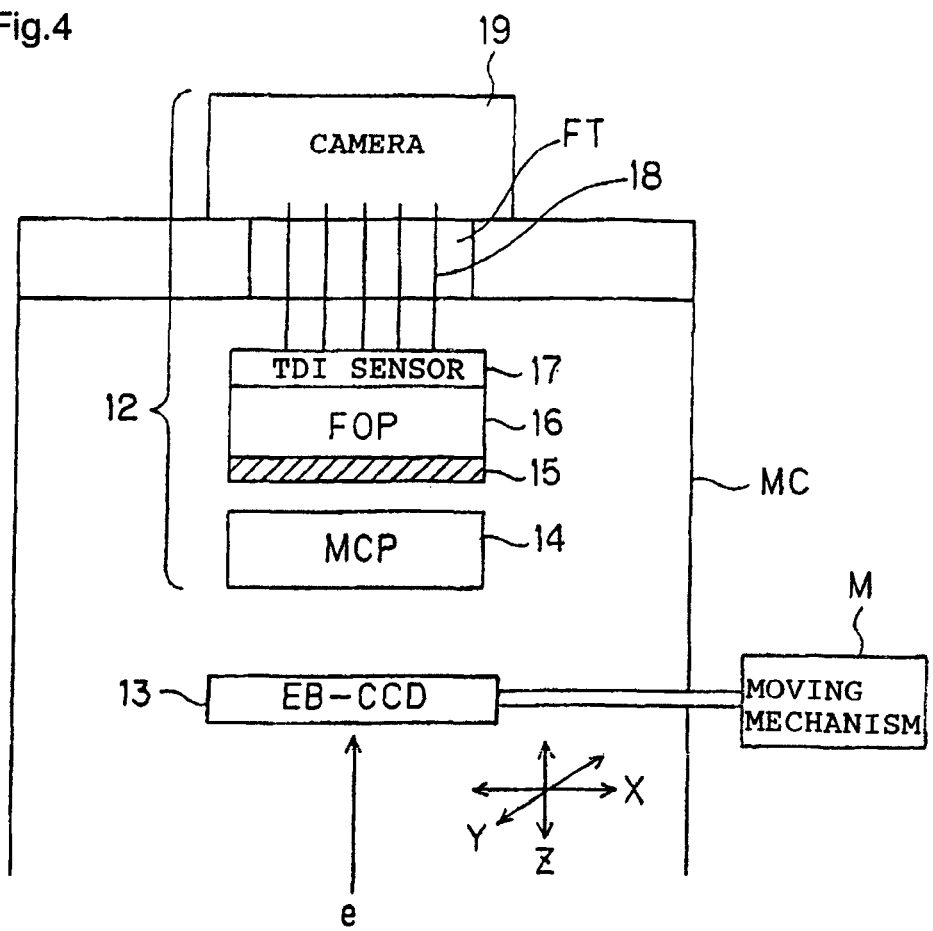

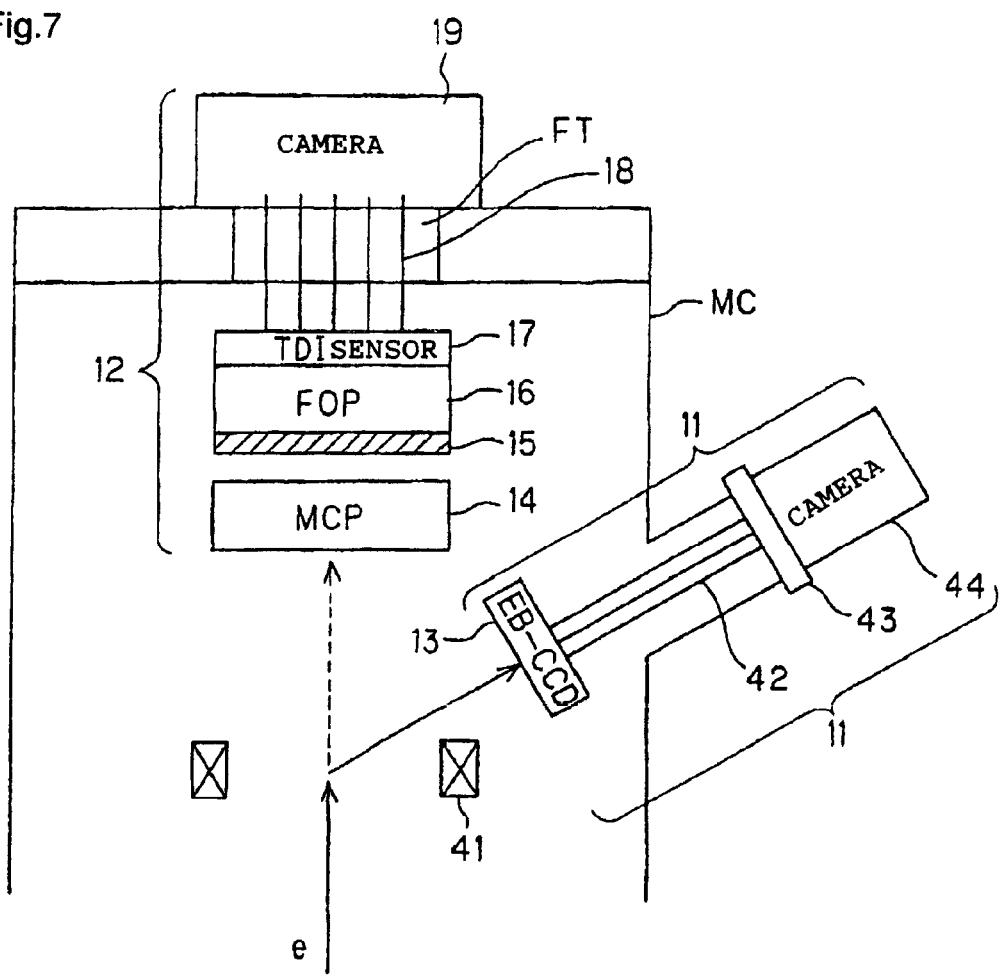

(j=4000  i=500)

(A)　　　　　　　　　　(B)

DETECTOR AND INSPECTING APPARATUS

CROSS-REFERENCE TO RELATED APPLICATION

This application is a divisional application of U.S. Ser. No. 12/063,604, filed Feb. 12, 2008, which is a 371 of International Application No. PCT/JP2006/315812 filed on Aug. 10, 2006, which is based upon and claims the benefit of priority from the prior Japanese Patent Application No. 2005-234079, filed on Aug. 12, 2005, the entire contents of all of which are incorporated herein by reference.

TECHNICAL FIELD

The present invention relates a detector for capturing electron beams or optical signals. More particularly, the present invention relates to an inspecting apparatus which has two ore more detectors disposed within a single barrel, one of which is selected in accordance with the amount of electronic or optical signals or an S/N ratio, thereby allowing for detection and measurement of images on the surface of a sample.

With the use of this inspecting apparatus, a sample can be efficiently inspected for evaluating the structure on the surface thereof, observing the surface in enlarged view, evaluating the material thereof, inspecting an electrically conductive state thereof, and the like. Accordingly, the present invention relates to a method of accurately and reliably inspecting highly dense patterns having a minimum line width of 0.15 μm or less for defects at a high throughput, and a device manufacturing method which involves inspecting patterns halfway in a device manufacturing process.

BACKGROUND ART

A conventional inspecting apparatus switches a detector comprising an electron sensor for detecting electrons and a detector comprising an optical sensor for detecting light for use in detecting electrons or light. Particularly, one detector is switched to the other as mentioned above for capturing electrons or light emitted from the same object to detect the amount of electrons or light and a changing amount thereof, or capturing an image. For example, electron or light incident conditions are adjusted on the basis of conditions detected by a CCD (charge coupled device) based detector, followed by replacing the CCD detector with a TDI (time delay integration) detector to make a high-speed inspection, measurement, and the like of the object. Specifically, when the incident conditions are adjusted using the TDI sensor, a low scaling factor of image in the adjustments of the incident condition causes secondary electrons from a sample to impinge and not impinge on some regions of a MCP (micro-channel plate), which receives secondary electrons from a sample, resulting in local damages to the MCP. For this reason, the incident conditions are mainly adjusted using a CCD sensor.

An example of a conventional inspecting apparatus is shown in FIGS. 28 and 29. FIG. 28(A) shows a CCD inspecting apparatus 300. The CCD inspecting apparatus 300 comprises a CCD sensor 301 and a camera 302 which are placed in the atmosphere. Secondary electrons emitted from a sample (not shown) are amplified by an MCP 303 and then impinge on a fluorescent plate 304 which converts the secondary electrons into an optical signal representative of the image of the sample. The optical signal output from the fluorescent plate 304 is converted by the optical lens 306 placed in the atmosphere through a feed through 305 formed in a vacuum chamber MC, and focused on the CCD sensor 301 to form the image of the sample in the camera 302.

FIG. 28(B) in turn shows a TDI detector 310, where a TDI sensor 311 is placed within a vacuum chamber MC. A fluorescent plate 313 is disposed in front thereof through light transmission means such as an FOP (fiber optic plate) 3444 or the like, so that secondary electrons from a sample enter the fluorescent plate 313 through the MCP 314, where the secondary electrons are converted into an optical signal which is then transmitted to the TDI sensor 311. An electric signal output from the TDI sensor 311 is transmitted to a camera 317 through a pin 316 provided in a feed through unit 315.

Accordingly, in the case of FIG. 28, a change of the CCD detector 300 to the TDI detector 310 involves changing a unit of a flange and a set of essential parts mounted thereon. Specifically, the inspecting apparatus 300 is opened to the atmosphere, the flange, fluorescent plate 304, optical lens 306, and CCD sensor 301 are removed from the CCD detector 300, and then the feed through flange 315, fluorescent late 313, FOP 3444, TDI sensor 311, and camera 317 of the TDI detector 301 are mounted in unit. For changing the TDI detector 310 with the CCD detector 300, the foregoing works are performed in the reverse procedure to the above. In this regard, light or electrons emitted from a sample under observation may be enlarged by an optical system, and the enlarged electrons or light is amplified, followed by observation of the amplified signal by a detector.

In FIGS. 29(A) and (B), in turn, MCPs 303, 314 and fluorescent plates 304, 313 are disposed within a vacuum chamber MC. Therefore, in the configuration shown in FIG. 29, when a change is made between a CCD detector 300 and a TDI detector 310, elements placed in the atmosphere, i.e., a set including an optical lens 306, a CCD sensor 301, and a camera 302 is changed with a set including a TDI sensor 311, a camera 317, and an optical lens 318, or vice versa.

An apparatus for creating image data of a sample using a detection result thus provided by a detector, and comparing the image data with data on a die-by-die basis to inspect the sample for defects is known (see JP-5-254140423 and JP-6-141416424 for the apparatus).

The conventional scheme as described above, when used, will require not only an immense time for assembly, vacuum abandonment, adjustments and the like involved in the change of the detector, but also works for adjusting the alignment of the electron or optical axis, associated with the change of the detector. For example, assuming that the TDI detector 310 is substituted for the CCD detector 300 for converting a secondary electron beam into an optical signal within the vacuum chamber MC as shown in FIG. 28, works such as stop of the apparatus, purging, opening to the atmosphere, change of the detector, evacuation, breakdown adjustment such as conditioning, adjustment of a beam axis, and the like are performed in order, and a time required therefor amounts to 50 to 429 hours each time. Therefore, assuming that an electro-optical system is adjusted and conditioned, for example, ten times a year, the foregoing works are involved each time, thus resulting in 500 to 4290 hours required therefor.

The configuration shown in FIG. 29 has been conventionally employed for solving the problem inherent in FIG. 28. This configuration is employed because the MCP 303, 314 and fluorescent plates 304, 313 are disposed within the vacuum chamber MC as shown in FIG. 29, so that the unit of the CCD sensor 301 and camera 302 can be readily changed to the unit of the TDI sensor 311 and camera 317 in the atmosphere. However, a problem arises in deterioration of MTF due to the feed through 305 which is made of hermetic optical glass which cannot provide a wide viewing field. As a result, the viewing field generally extends on the order of 1×1 to 10×10 mm at the position of the fluorescent plate, and for providing a wider viewing field, it is necessary to prevent the deterioration of the MFT due to a defective flatness and non-uniformity of the optical glass and fluctuations in focus, and it is also necessary to prevent deteriorations in MTF and luminance by providing an optical lens which has a viewing field approximately five to six times wider. An optical lens system which achieves this requires a highly accurate and expensive lens, resulting in a cost 10 to 15 times higher, by way of example. Further, since the optical system is increased in size by a factor of 5 to 15, the resulting inspecting apparatus may be unavailable if there are limitations to the height of the apparatus.

DISCLOSURE OF THE INVENTION

To solve the problems mentioned above, the present invention provides an inspecting apparatus characterized by comprising:

a plurality of detectors each for receiving an electron beam emitted from a sample to acquire image data representative of the sample; and a switching mechanism for causing the electron beam to be incident on one of the plurality of detectors, wherein the plurality of detectors are disposed within the same vacuum chamber.

Also, the present invention provides a defect inspecting apparatus comprising:

a primary optical system having an electron gun for emitting a primary electron beam for guiding the primary electron beam to a sample; and a secondary optical system for guiding a secondary electron beam emitted from the sample to a detection system, characterized in that the detection system comprises:

a first EB-CCD sensor for adjusting the optical axis of an electron beam;

an EB-TDI sensor for capturing an image of the sample; and a second EB-CCD sensor for evaluating a defective site based on the image captured by the EB-TDI sensor.

Further, the present invention provides a defect inspecting method for inspecting a sample for defects in a defect inspecting apparatus having a primary optical system for guiding the primary electron beam to a sample, and a secondary optical system for guiding a secondary electron beam emitted from the sample to a detection system. The defect inspecting method is characterized by:

adjusting an optical axis using the EB-CCD sensor;

capturing an image of a sample using the EB-TDI sensor;

specifying a defective site on the sample from the image captured by the EB-TDI sensor;

capturing an image of the defective site on the sample using the EB-CCD sensor; and comparing the image of the defective site captured by the EB-TDI sensor with the image of the defective site captured by the EB-CCD sensor to determine a false defect or a true defect.

As described above, the present invention disposes a plurality of detectors within a vacuum chamber and can detect an electronic or an optical signal using one of the detectors. A detector suitable for electrons or light to be captured is selected in accordance with the amount of signal, the S/N ratio and the like, and a signal is applied to the selected detector to perform required detecting operations.

Advantageously, in this way, it is possible to not only save a time taken to change one detector to another but also perform works such as beam condition adjustments, inspection, measurement and the like by immediately using an optimal detector when it is needed. Further, a signal can be applied to the detector while minimizing degradations in image quality without lower MTF or image distortions due to optical lenses and lens systems. In this regard, the MTF and contrast are used as indexes for the resolution.

For example, the surface of a sample can be inspected, measured, and observed at high speeds by capturing a still image and adjusting the optical axis using a CCD detector, and subsequently directing a beam into a TDI detector to capture image without changing the detector, as has been previously required.

In the past, detectors are change from one to another upon adjustments to a variety of use conditions, so that the changing works are generally performed approximately ten times a year on average. Specifically, 1000 hours (10×100) have been spent for the changing works every year, but according to the present invention, such a loss of time can be reduced. Also, when a vacuum chamber is opened to the atmosphere, particles and dust are likely to stick to the inner wall of the vacuum chamber and parts within the vacuum chamber, but the present invention can eliminate such a risk. Also, since parts in the vacuum environment can be prevented from surface oxidization due to the exposure to the atmosphere, voltages and magnetic flux generated from electrodes, magnetic poles and the like can be used with stability without influences of unstable operations possibly resulting from oxidized parts. Particularly, in an aperture having a small diameter such as an NA opening on which an electron beam impinges, it is thought that during the exposure to the atmosphere, moisture and oxygen in the air stick to the aperture to promote the sticking and production of contamination, but the present invention solves such a problem.

For adjusting an electro-optical system for guiding an electron beam generated from the surface of a sample such as a wafer to a detector, signals often concentrate on a sensor. In other words, the sensor simultaneously includes an area which exhibits a higher signal strength and an area which exhibits a lower signal strength. As a result, if the area of higher signal strength is damaged, the sensor is rendered non-uniform in sensitivity. If an inspection or a measurement is made using such a sensor which is non-uniform in sensitivity, the result of the measurement involves large variations because a smaller signal representative of an image is captured in the non-uniform area, leading to a false defect. Even if the intensity of incident electrons or the like is uniform, an output signal from a damaged area varies in strength, resulting in a non-uniform sensor output. It is thought that erroneous measurements can be made due to such non-uniform output of the sensor. Such a problem can be solved by the present invention.

In the inspecting apparatus according to the present invention, a beam irradiated to a sample may be an electron beam or light such as UV light, DUV light, laser light or the like, or a combination of an electron beam and light. Any of reflected electrons, secondary electrons, back scattered electrons, and Auger electrons may be used for the electron beams to capture a required image. When using light such as UV light, DUV light, laser light or the like, an image is detected by optical electrons. It is also possible to detect defects on the surface of a sample using scattered light which occurs when such light is irradiated to the surface of the sample. A quartz fiver or a hollow fiber can be used to efficiently introduce light such as UV light, DUV light, laser light or the like onto the surface of the sample.

When a combination of an electron beam and light is used for irradiating the surface of a sample therewith, it is possible to solve a problem of the inability to uniformly irradiate the sample with electrons due to charge-up which causes a change in the potential on the surface when an electron beam alone is used. Accordingly, by using light which can be irradiated irrespective of the potential on the surface, electrons can be stably and efficiently captured from the surface of the sample for use in image capturing. For example, when the sample is irradiated with UV light, not only optical electrons are generated, but also a number of electrons are excited to a metastable state, so that free electrons are increased when an electron beam is irradiated thereto, resulting in an efficient emission of secondary electrons.

Semiconductor devices can be manufactured at a high throughput and with a high yield rate by applying the inspecting apparatus according to the present invention to an inspection of wafers for defects halfway in a manufacturing process.

BRIEF DESCRIPTION OF THE DRAWINGS

FIG. 1-2
A front elevation showing main components of an inspecting apparatus which is one embodiment of a charged particle beam apparatus according to the present invention, viewed along a line A-A in FIG. 1-3.
FIG. 1-3
A plan view of main components of the inspecting apparatus shown in FIG. 1-2, viewed along a line B-B in FIG. 1-2.
FIG. 1-4
A diagram showing an exemplary modification to the configuration shown in FIG. 1-3.
FIG. 1-5
A cross-sectional view showing a mini-environment apparatus in FIG. 1-2, taken along a line C-C
FIG. 1-6
A diagram showing a loader housing in FIG. 1-2, viewed along a line D-D in FIG. 1-3.
FIG. 1-7
Diagrams showing the configuration of an electron beam calibration mechanism, where (A) is a side view, and (B) is a plan view.
FIG. 2
A diagram showing the general configuration of an inspecting apparatus.
FIG. 3
A diagram schematically showing a first embodiment of an inspecting apparatus according to the present invention.
FIG. 4
A diagram schematically showing a second embodiment of an inspecting apparatus according to the present invention.
FIG. 5
A diagram schematically showing a third embodiment of an inspecting apparatus according to the present invention.
FIG. 6
A diagram schematically showing a fourth embodiment of an inspecting apparatus according to the present invention.
FIG. 7
A diagram schematically showing a fifth embodiment of an inspecting apparatus according to the present invention.
FIG. 24
FIGS. 24(A), 24(B), and 24(C) are diagrams for describing step-and-repeat performed in the inspecting apparatus according to the present invention.
FIG. 25
FIGS. 25(A) and 25(B) are diagrams showing alignment marks in the step-and-repeat performed in the inspecting apparatus according to the present invention.

Figure 26:
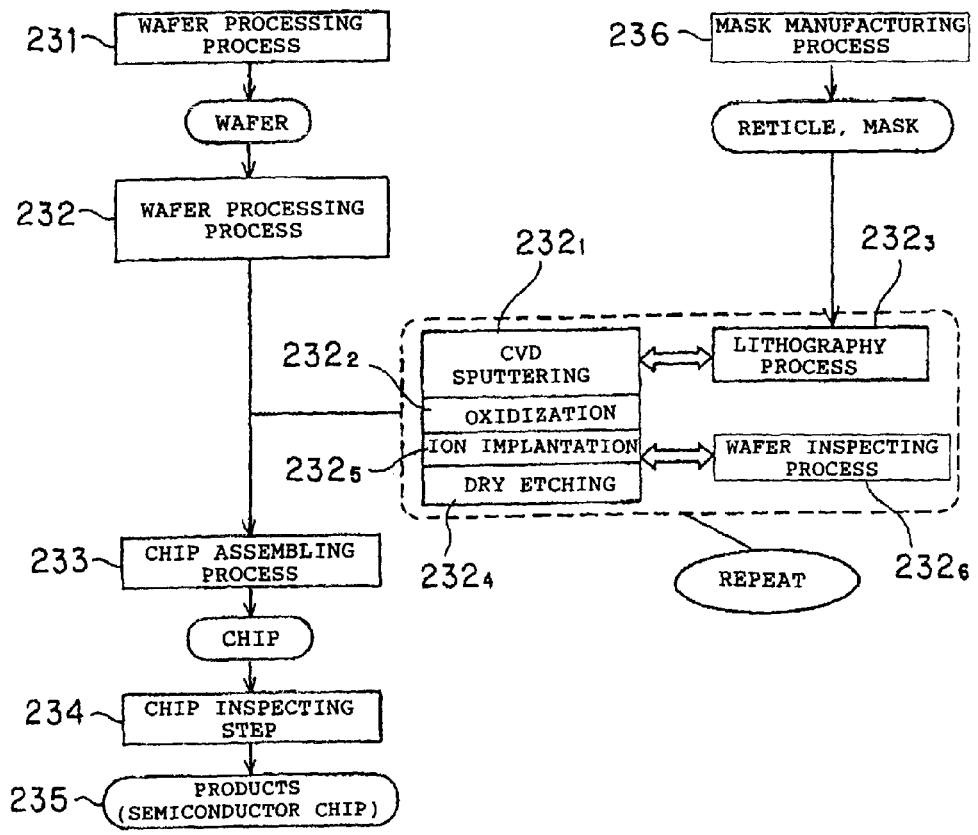
FIG. 26
A flow diagram showing a process which constitutes a semiconductor device manufacturing method.

A flow diagram showing processes which make up a wafer processing process in FIG. 26.

FIG. 28

Figure 28:
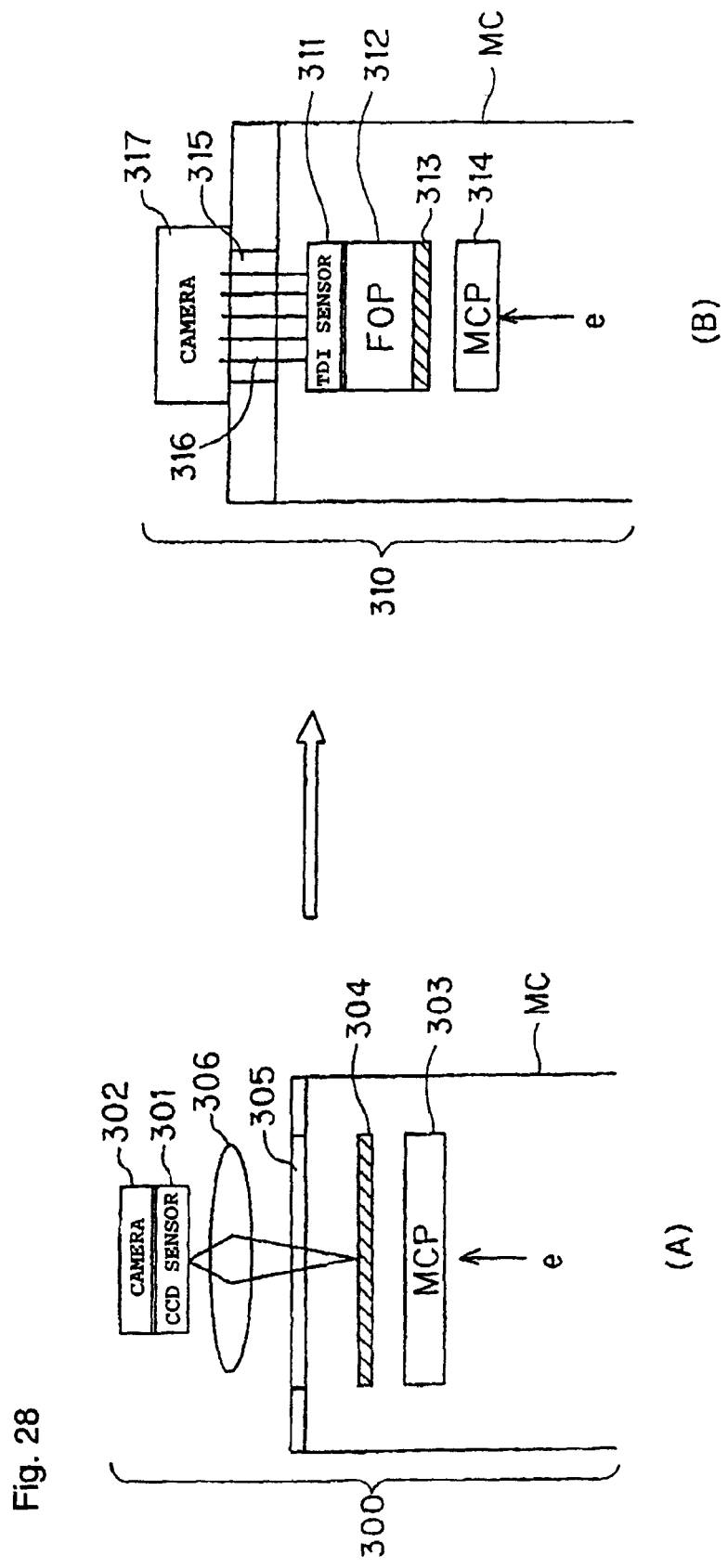

FIGS. 28(A) and 28(B) are diagrams for describing a conventional inspecting apparatus.

FIG. 29

Figure 29:
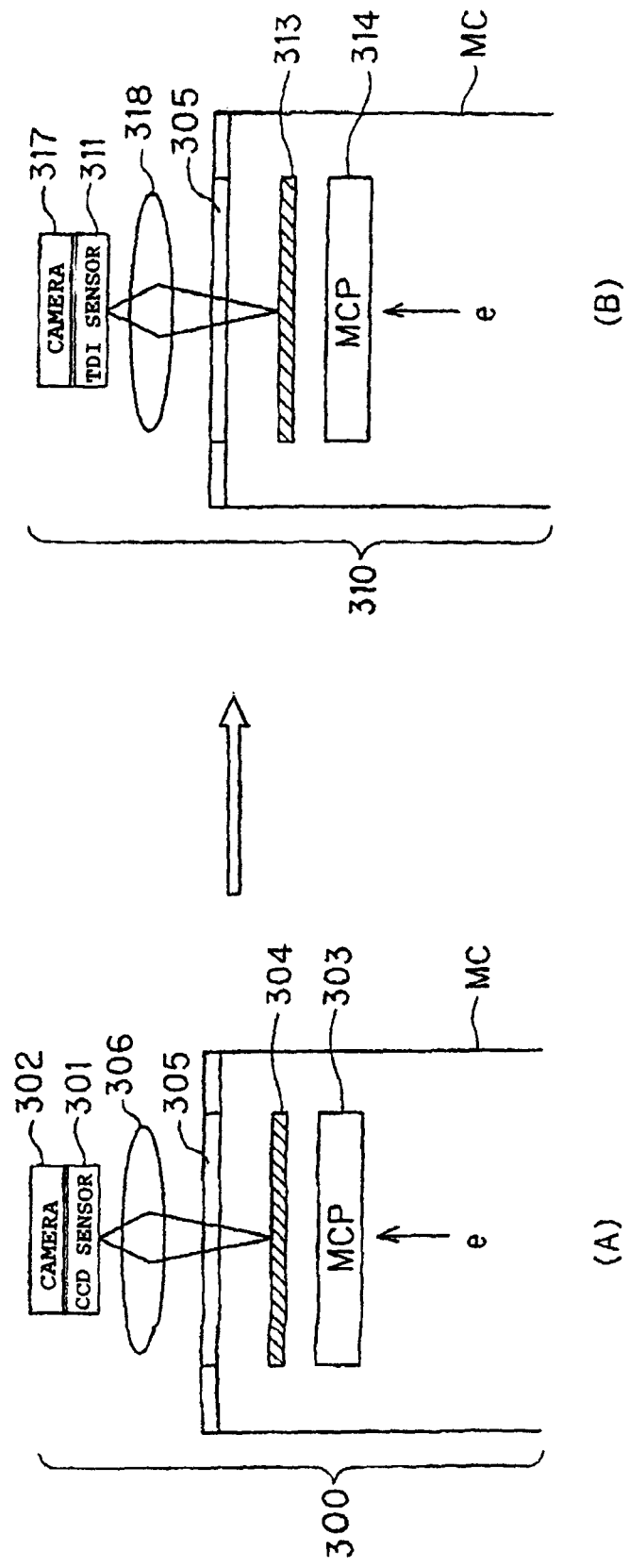

FIGS. 29(A) and 29(B) are diagrams for describing a conventional inspecting apparatus.

BEST MODE FOR CARRYING OUT THE INVENTION

First, the general configuration of a semiconductor inspection system will be described with reference to FIG. 1-1. The semiconductor inspection system comprises an inspecting apparatus, a power supply rack, a control rack, an image processing rack, a deposition apparatus, an etching apparatus, and the like. Roughing vacuum pumps such as a dry pump are installed outside of a clean room. Main components within the inspecting apparatus comprises an electron beam vacuum chamber, a vacuum transfer system, a main housing which contains a stage, a vibration isolator, turbo molecular pump, and the like.

When viewing the inspection system from a functional standpoint, the electron beam vacuum chamber is mainly composed of an electro-optical system, a detection system, an optical microscope, and the like. The electro-optical system is composed of an electron gun, lenses and the like, while the transfer system is composed of a vacuum transfer robot, an atmosphere transfer robot, a cassette loader, a variety of position sensors, and the like.

The deposition apparatus, etching apparatus, and washing apparatus (not shown) may be installed side by side near the inspecting apparatus or incorporated in the inspecting apparatus. They are used, for example, to prevent a sample from being charged, or to clean the surface of the sample. A sputter scheme, when used, can provide both functions of deposition and etching.

Thought not shown, in some applications, associated apparatuses may be installed side by side near the inspecting apparatus, or these associated apparatuses may be incorporated in the inspecting apparatus for use therewith. Alternatively, these associated apparatuses may be incorporated in the inspecting apparatus. For example, a chemical mechanical polishing apparatus (CMP) and a washing apparatus may be incorporated in the inspecting apparatus, or alternatively, a CVD (chemical vacuum deposition) apparatus may be incorporated in the inspecting apparatus, in which case the area required for installation, and the number of units for transferring samples can be saved, a transfer time can be reduced, and other advantages can be provided. Likewise, a deposition apparatus such as a plating apparatus may be incorporated in the inspecting apparatus. Also, the inspecting apparatus can be used in combination with a lithography apparatus in a similar manner.

In the following, one embodiment of an inspecting apparatus according to the present invention will be described with reference to the drawings, as a semiconductor inspecting apparatus for inspecting a substrate or a wafer formed with patterns on the surface thereof as an object under inspection.

Figure 1:
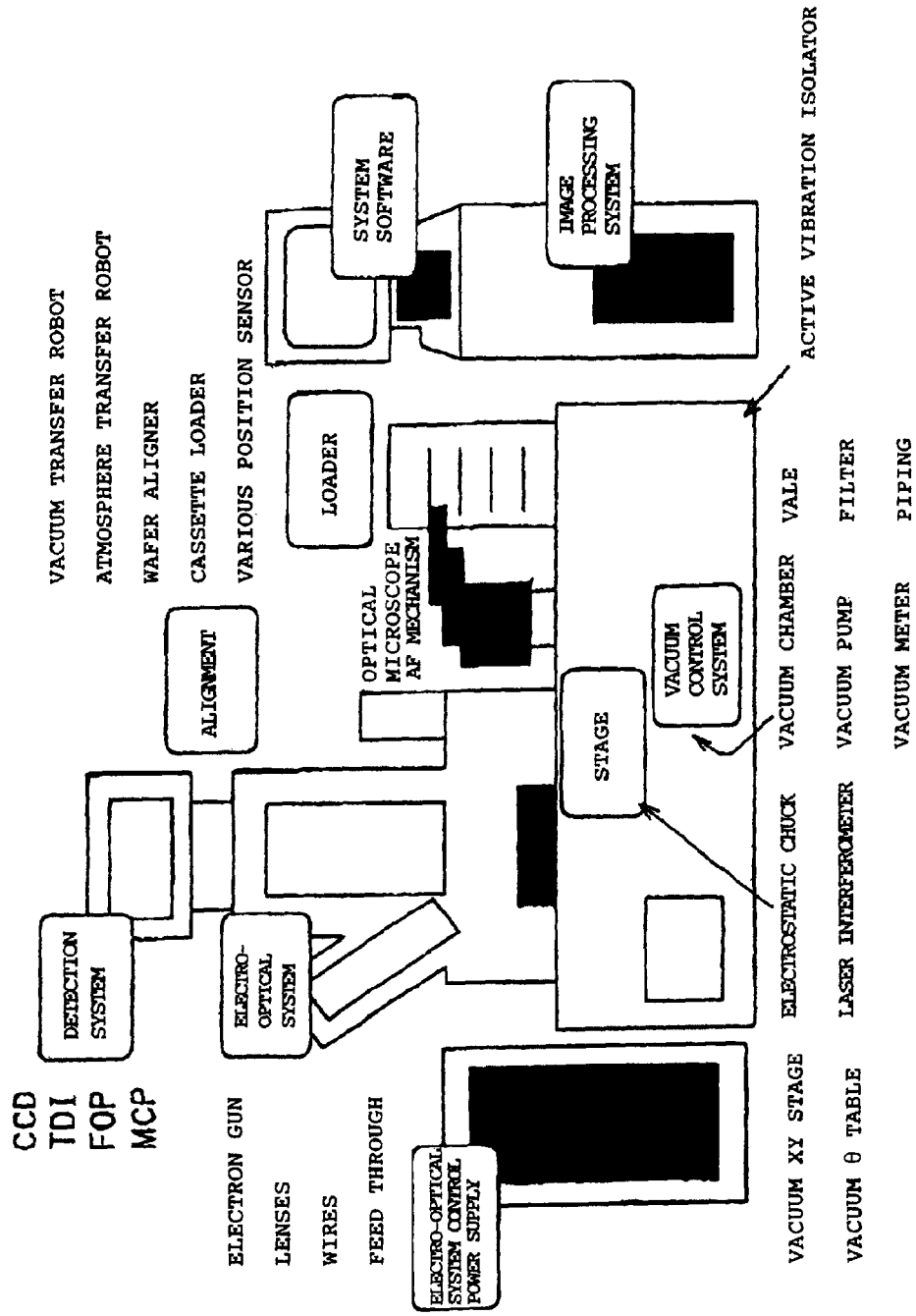
FIG. 1-1
A diagram generally showing the configuration of a semiconductor inspection system.
Figures 1, 2:
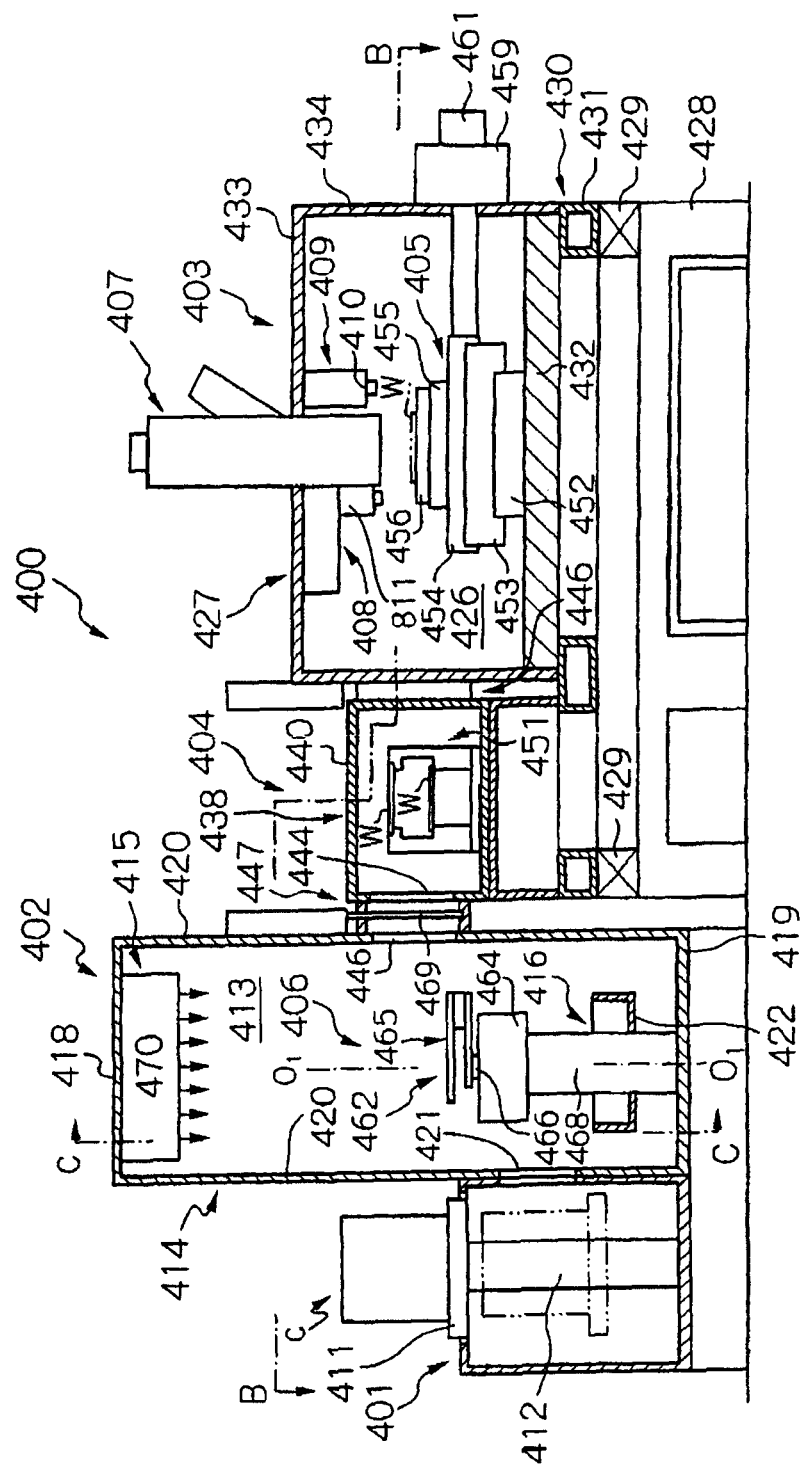
Figures 1, 2, 3:
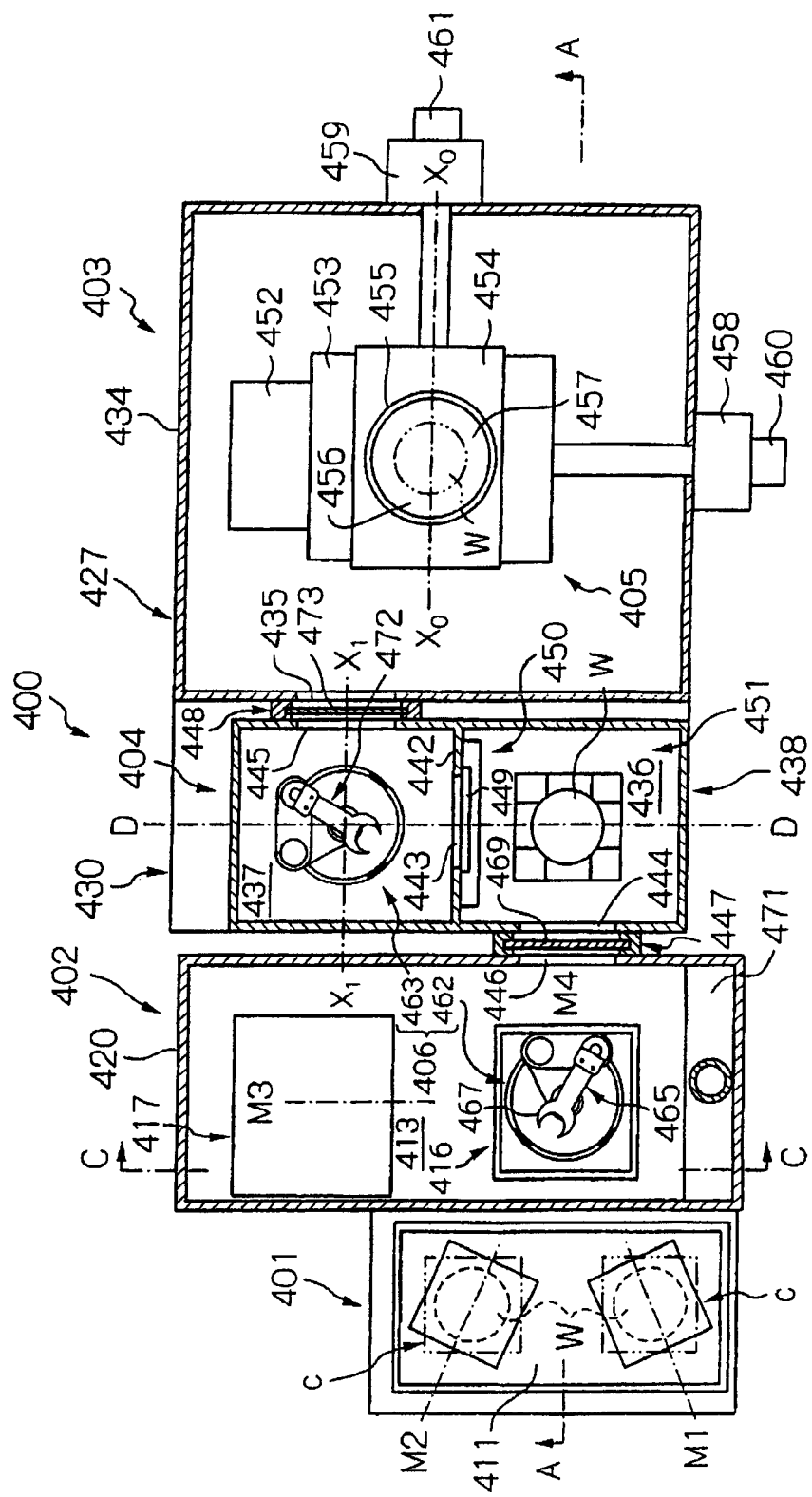

Main components of the semiconductor inspecting apparatus of this embodiment are shown in front elevation and plan view in FIGS. 1-2 and 1-3. The semiconductor inspecting apparatus 400 of this embodiment comprises a cassette holder 401 for holding a cassette which stores a plurality of wafers W; a mini-environment device 402; a main housing 403 which defines a working chamber; a loader housing 404 disposed between the mini-environment device 402 and main housing 403 for defining two loading chambers; a loader 406 for loading a wafer from the cassette holder 401 onto the stage device 405 disposed within the main housing 403; and an electro-optical system 407 attached to the vacuum housing. These components are laid out in a positional relationship as illustrated in FIGS. 1-2 and 1-3.

The semiconductor inspecting apparatus 400 also comprises a pre-charge unit 408 disposed in the main housing 403 in vacuum; a potential application mechanism (not shown) for applying a potential to a wafer W; an electron beam calibration mechanism (described later with reference to FIG. 1-7), and an optical microscope 410 which forms part of an alignment controller 409 for positioning a wafer W on the stage device.

The cassette holder 401 is configured to hold a plurality (two in this embodiment) of cassettes c (for example, closed cassettes such as SMIF, FOUP manufactured by Assist Co.) in which a plurality (for example, twenty-five) wafers W are placed side by side in parallel, oriented in the vertical direction. In this embodiment, the cassette holder 401 is a type adapted to automatically load the cassette c, and comprises, for example, an up/down table 411, and an elevating mechanism 444 for moving the up/down table 411 up and down. The cassette c can be automatically set on the up/down table 411 in a state indicated by chain lines in FIG. 1-3. After the setting, the cassette c is automatically rotated to a state indicated by solid lines in FIG. 1-3 so that it is directed to the axis of pivotal movement of a first carrier unit within the mini-environment chamber.

It should be noted that substrate or wafers accommodated in the cassette c are subjected to an inspection which is generally performed after a process for processing the wafers or in the middle of the process within semiconductor manufacturing processes. Specifically, accommodated in the cassette are wafers which have undergone a deposition process, CMP, ion implantation and so on; wafers formed with wiring patterns on the surface thereof; or wafers which have not been formed with wiring patterns. Since a large number of wafers accommodated in the cassette c are spaced from each other in the vertical direction and arranged side by side in parallel, and the first carrier unit has an arm which is vertically movable, a wafer at an arbitrary position can be held by the first carrier unit which will be described later in detail.

In FIGS. 1-2 and 1-5, the mini-environment device 402 comprises a housing 414 defining a mini-environment space 413 that is controlled for the atmosphere; a gas circulator 415 for circulating a gas such as clean air within the mini-environment space 413 to execute the atmosphere control; a discharger 416 for recovering a portion of air supplied into the mini-environment space 413 to discharge the same; and a prealigner 417 for roughly aligning a sample, i.e., a wafer placed in the mini-environment space 413. The housing 414 has a top wall 418, bottom wall 419, and peripheral wall 420 which surrounds four sides of the housing 414, to provide a structure for isolating the mini-environment space 413 from the outside. Also, a sensor may be provided within the environment space for observing the cleanness such that the apparatus can be shut down when the cleanness exacerbates.

An access port 421 is formed in a portion of the peripheral wall 87 of the housing 414 that is adjacent to the cassette holder 401. A shutter device of a known structure may be provided near the access port 421 for closing the access port 421 from the mini-environment device side. An air supply unit may not be provided within the mini-environment space but outside thereof.

The discharger 416 comprises a suction duct 422 disposed at a position below the wafer carrying surface of the carrier unit and below the carrier unit; a blower 423 disposed outside the housing 414; and a conduit 424 for connecting the suction duct 422 to the blower 423. The discharger 416 aspires a gas flowing down around the carrier unit and including particle, which could be produced by the carrier unit, through the suction duct 422, and discharges the gas outside the housing 414 through the conduit 424 and the blower 423.

The prealigner 417 disposed within the mini-environment space 413 optically or mechanically detects an orientation flat (which refers to a flat portion formed along the outer periphery of a circular wafer and hereinafter called as orientation flat) formed on the wafer, or one or more V-shaped notches formed on the outer peripheral edge of the wafer, and previously aligns the position of the wafer in a rotating direction about the axis O-O at an accuracy of approximately ±one degree. The prealigner is responsible for a rough alignment of the wafer.

In FIGS. 1-2 and 1-3, the main housing 403, which defines a working chamber 426, comprises a housing body 427 that is supported by a housing supporting device 430 carried on a vibration blocking device, i.e., vibration isolator 429 disposed on a base frame 428. The housing supporting device 430 comprises a frame structure 431 assembled into a rectangular form. The housing body 427 comprises a bottom wall 432 mounted on and securely carried on the frame structure 431; a top wall 433; and a peripheral wall 434 which is connected to the bottom wall 432 and the top wall 433 and surrounds four sides of the housing body 427, and isolates the working chamber 426 from the outside.

In this embodiment, the housing body and the housing supporting device 430 are assembled into a rigid construction, and the vibration isolator 429 blocks vibrations from the floor, on which the base frame 428 is installed, from being transmitted to the rigid structure. A portion of the peripheral wall 434 of the housing 427 that adjoins the loader housing 404 is formed with an access port 435 for introducing and removing a wafer therethrough. The working chamber 426 is kept in a vacuum atmosphere by a vacuum device (not shown) of a known structure. A controller 2 is disposed below the base frame 428 for controlling the operation of the overall apparatus.

In FIGS. 1-2, 1-3, and 1-6, the loader housing 404 comprises a housing body 438 which defines a first loading chamber 436 and a second loading chamber 438. The housing body 438 comprises a bottom wall 439; a top wall 440; a peripheral wall 441 which surrounds four sides of the housing body 438; and a partition wall 442 for partitioning the first loading chamber 436 and the second loading chamber 438 to isolate the two loading chambers from the outside. The partition wall 442 is formed with an aperture, i.e., an access port 443 for passing a wafer W between the two loading chambers. Also, a portion of the peripheral wall 441 that adjoins the mini-environment device 402 and the main housing 403, is formed with access ports 444 and 445. The housing body 438 of the loader housing 404 is carried on and supported by the frame structure 431 of the housing supporting device 430. This prevents the vibrations of the floor from being transmitted to the loader housing 404 as well.

The access port 444 of the loader housing 404 is in alignment with the access port 446 of the housing 414 of the mini-environment device 402, and a shutter device 447 is provided for selectively blocking a communication between the mini-environment space 413 and the loading chamber 436. Likewise, the access port 445 of the loader housing 404 is in alignment with the access port 435 of the housing body 427, and a shutter device 448 is provided for selectively blocking a communication between the loading chamber 438 and the working chamber 426 in a hermetic manner.

Further, the opening formed through the partition wall 442 is provided with a shutter device 450 for closing the opening with a door 449 to selectively block a communication between the first and second loading chambers in a hermetic manner.

Within the first loading chamber 436, a wafer rack 451 is disposed for supporting a plurality (two in this embodiment) of wafers spaced in the vertical direction and maintained in a horizontal state. The loading chambers 436, 438 are controlled for the atmosphere to be maintained in a high vacuum state (at a vacuum degree of $10^{-5}$ to $10^{-6}$ Pa) by a vacuum evacuator (not shown) in a conventional structure including a vacuum pump, not shown. In this event, the first loading chamber 436 may be held in a low vacuum atmosphere as a low vacuum chamber, while the second loading chamber 438 may be held in a high vacuum atmosphere as a high vacuum chamber, to effectively prevent contamination of wafers. The employment of such a loading housing structure including two loading chambers allows a wafer W to be carried, without significant delay from the loading chamber the working chamber. The employment of such a loading chamber structure provides for an improved throughput for the defect inspection, and the highest possible vacuum state around the electron source which is required to be kept in a high vacuum state.

The first and second loading chambers 436, 438 are connected to vacuum pumping pipes and vent pipes for an inert gas (for example, dried pure nitrogen) (neither of which are shown), respectively. In this way, the atmospheric state within each loading chamber is attained by an inert gas vent (which injects an inert gas to prevent an oxygen gas and so on other than the inert gas from attaching on the surface).

In the inspecting apparatus of the present invention which uses electron beams, when representative lanthanum hexaboride ($LaB_6$) used as an electron source for an electro-optical system is once heated to such a high temperature that causes emission of thermal electrons, it is critical that it is not exposed to oxygen within the limits of possibility so as not to shorten the lifetime. However, by carrying out the atmosphere control as mentioned above at a stage before introducing the wafer into the working chamber in which the electro-optical system is disposed, the foregoing can be more certainly carried out.

The stage device 405 comprises a fixed table 452 disposed on the bottom wall 432 of the main housing 403; a Y-table 453 movable in a Y direction on the fixed table (the direction vertical to the drawing sheet in FIG. 1-2); an X-table 454 movable in an X direction on the Y-table 453 (in the left-to-right direction in FIG. 1-2); a turntable 455 rotatable on the X-table; and a holder 456 disposed on the turntable 455. A wafer W is releasably held on a wafer carrying surface 551 of the holder 456. The holder may be of a known structure which is capable of releasably chucking a wafer by means of a mechanical or electrostatic chuck feature.

The stage device 405 uses servo motors, encoders and a variety of sensors (not shown) to operate the plurality of tables 453-455 mentioned above to permit highly accurate alignment of a wafer W held on the carrying surface 130 by the holder 456 in the X direction, Y direction and Z-direction (the Z-direction is the up-down direction in FIG. 1-2) with respect to electron beams irradiated from the electro-optical system, and in a direction (θ direction) about the axis normal to the wafer supporting surface. In this regard, the alignment in the Z-direction may be made such that the position on the carrying surface of the holder, for example, can be finely adjusted in the Z-direction. In this event, a reference position on the carrying surface is sensed by a position measuring device using a laser of an extremely small diameter (a laser interference range finder using the principles of interferometer) to control the position by a feedback circuit, not shown. Additionally or alternatively, the position of a notch or an orientation flat of a wafer is measured to sense a plane position or a rotational position of the wafer relative to the electron beam to control the position of the wafer by rotating the turntable by a stepping motor which can be controlled in extremely small angular increments.

In order to maximally prevent particle produced within the working chamber 426, servo motors 131, 132 and encoders 133, 134 for the stage device 405 are disposed outside the main housing 403.

It is also possible to establish a basis for signals which are generated by previously inputting a rotational position, and X-Y-positions of a wafer relative to the electron beams in a signal detecting system or an image processing system, later described.

The loader 406 comprises a robot-based first carrier unit 462 disposed in the housing 414 of the mini-environment device 402, and a robot-based second carrier unit 463 disposed in the second loading chamber 438.

The first carrier unit 462 has a multi-node arm 465 for rotation about an axis $O_1$-$O_1$ relative to a driver 464. While an arbitrary structure may be applied to the multi-node arm, this embodiment employs the multi-node arm 465 which has three parts attached for rotation relative to each other. A part of the arm 465 of the first carrier unit 462, i.e., a first part closest to the driver 464 is attached to a shaft 466 which can be rotated by a driving mechanism (not shown) in a general-purpose structure arranged in the driver 464. The arm 465 is rotatable about the axis $O_1$-$O_1$ by the shaft 466, and is telescopical in a radial direction relative to the axis $O_1$-$O_1$ as a whole through relative rotations among the parts. At the leading end of the third part furthest away from the shaft 466 of the arm 465, a chuck 467 is attached for chucking a wafer, such as a mechanical chuck in a general-purpose structure, an electrostatic chuck or the like. The driver 464 is vertically movable by an elevating mechanism 468 in a general-purpose structure.

In this first carrier unit 462, the arm 465 extends toward one of two cassettes c held in the cassette holder 10 in a direction M1 or M2, and a wafer W stored in the cassette c is carried on the arm, or is chucked by the chuck (not shown) attached at the leading end of the arm for removal. Subsequently, the arm is retracted (to the state illustrated in FIG. 1-3), and the arm is rotated to a position at which the arm can extend toward the pre-aligner 417 in a direction M3, and is stopped at this position. Then, the arm again extends to the pre-aligner 417 to transfer the wafer held by the arm thereto. After receiving the wafer from the pre-aligner 417 in a manner reverse to the foregoing, the arm is further rotated and stopped at a position at which the arm can extend toward the first loading chamber 436 (in a direction M4), where the wafer is passed to a wafer receiver 451 within the first loading chamber 436.

It should be noted that when a wafer is mechanically chucked, the wafer should be chucked in a peripheral zone (in a range approximately 5 mm from the periphery). This is because the wafer is formed with devices (circuit wires) over the entire surface except for the peripheral zone, so that if the wafer were chucked at a portion inside the peripheral zone, some devices would be broken or defects would be produced.

The second carrier unit 463 is basically the same as the first carrier unit 462 in structure, and differs only in that the second carrier unit 463 carries a wafer W between the wafer rack 451 and the carrying surface of the stage device 405.

In the loader 406 described above, the first and second carrier units 462, 463 carry wafers from the cassette c held in the cassette holder onto the stage device 405 disposed in the working chamber 426 and vice versa while holding the wafer substantially in a horizontal posture. Then, the arms of the carrier units 462, 463 are moved up and down only when a cassette is extracted from the cassette c and loaded into the same, when a wafer is placed on the wafer lack and is extracted from the same, and when a wafer is placed on the stage device 405 and removed from the same. Therefore, the carrier units 462, 463 can smoothly move even a large wafer which may have a diameter of, for example, 30 cm.

Next, a description will be made in order of the transfer of a wafer from the cassette c supported by the cassette holder 401 to the stage device 405 disposed in the working chamber 426. In this embodiment, as the cassette c is set on the up/down table 411, the up/down table 411 is moved down by the elevating mechanism 412 to bring the cassette c into alignment to the access port 421. As the cassette c is in alignment to the access port 421, a cover (not shown) disposed on the cassette c is opened, whereas a cylindrical cover is arranged between the cassette c and the access port 421 of the mini-environment device 402 to block the cassette c and mini-environment space 402 from the outside. When the mini-environment device 402 is equipped with a shutter device for opening/closing the access port 421, the shutter device is operated to open the access port 421.

On the other hand, the arm 465 of the first carrier unit 462 remains oriented in either the direction M1 or M2 (in the direction M1 in this description), and extends to receive one of wafers stored in the cassette c with its leading end as the access port 421 is opened.

Once the arm 465 has received a wafer, the arm 465 is retracted, and the shutter device (if any) is operated to close the access port 421. Then, the arm 465 is rotated about the axial line $O_1$-$O_1$ so that it can extend in the direction M3. Next, the arm 465 extends to transfer the wafer carried on the leading end thereof or chucked by a chuck onto the pre-aligner 417 which determines a direction in which the wafer is rotated (direction about the center axis perpendicular to the surface of the wafer) within a predetermined range. Upon completion of the positioning, the first carrier unit 462 retracts the arm 465 after the wafer is received from the pre-aligner 417 to the leading end of the arm 465, and takes a posture in which the arm 465 can be extended in the direction M4. Then, the door 469 of the shutter device 447 is moved to open the access ports 226, 436, permitting the arm 465 to place the wafer on the upper shelf or lower shelf of the wafer rack 451 within the first loading chamber 436. It should be noted that before the shutter device 447 opens the access ports to pass the wafer to the wafer rack 451, the opening 443 formed through the partition 442 is hermetically closed by the door 449 of the shutter device 450.

In the wafer transfer process by the first carrier unit 462, clean air flows in a laminar state (as a down flow) from the gas supply unit 231 disposed in the housing body 414 of the mini-environment device 402, for preventing dust from sticking to the upper surface of the wafer during the transfer. Part of air around the carrier unit is aspired from the suction duct 422 of the discharger 416 for emission out of the housing body 414. The remaining air is recovered through the recovery duct 89 arranged on the bottom of the housing body 414, and again returned to the gas supply unit 470.

As a wafer is placed on the wafer rack 451 within the first loading chamber 436 of the loader housing 404 by the first carrier unit 462, the shutter device 447 is closed to hermetically close the loading chamber 436. Then, the loading chamber 436 is brought into a vacuum atmosphere by expelling the air within the loading chamber 436, filling an inert gas in the loading chamber 436, and then discharging the inert gas. The vacuum atmosphere in the loading chamber 436 may have a low degree of vacuum. As the degree of vacuum has reached a certain level in the loading chamber 436, the shutter device 450 is operated to open the access port 442, which has been hermetically closed by the door 449, and the arm 472 of the second carrier unit 463 extends to receive one wafer from the wafer receiver 451 with the chuck at the leading end thereof (placed on the leading end or chucked by a chuck attached to the leading end). As the wafer has been received, the arm 472 is retracted, and the shutter device 450 is again operated to close the access port 443 with the door 449.

It should be noted that before the shutter device 450 opens the access port 443, the arm 472 has previously taken a posture in which it can extend toward the wafer rack 451 in a direction N1. Also, as described above, before the shutter device 450 opens the access port 443, the shutter device 448 closes the access ports 445, 435 with the door 473 to block communications between the second loading chamber 438 and the working chamber 426, and the second loading chamber 438 is evacuated.

Figure 13:
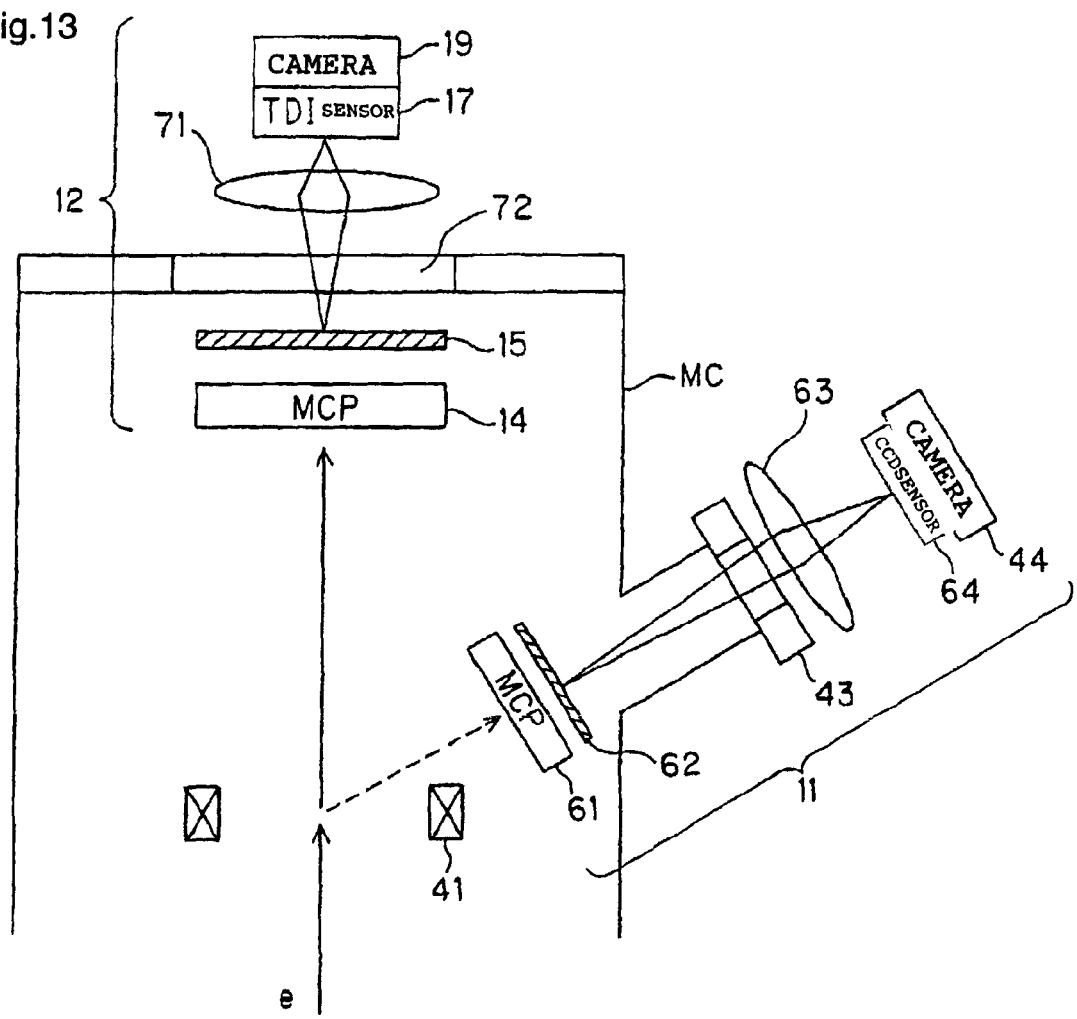
FIG. 13
A diagram schematically showing a ninth embodiment of an inspecting apparatus according to the present invention.

As the shutter device 450 closes the access port 443, the second loading chamber 438 is again evacuated to a degree of vacuum higher than that of the first loading chamber 436. In the meantime, the arm 465 of the second carrier unit 462 is rotated to a position from which the arm 465 can extend toward the stage device 405 within the working chamber 426. On the other hand, in the stage device 405 within the working chamber 426, the Y-table 202 is moved upward, as viewed in FIG. 13, to a position at which the center line $X_0$-$X_0$ of the X-table 203 substantially matches an X-axis line $X_1$-$X_1$ which passes the axis of rotation $O_2$-$O_2$ of the second carrier unit 463. Also, the X-table 203 has moved to a position close to the leftmost position, as viewed in FIG. 1-3, and is waiting at this position.

When the degree of vacuum in the second loading chamber 438 is increased to a level substantially identical to that of the working chamber 426, the door 473 of the shutter device 448 is moved to open the access ports 445, 435, and the arm extends so that the leading end of the arm, which holds a wafer, approaches the stage device 405 within the working chamber 426. Then, the wafer W is placed on the carrying surface 130 of the stage device 405. Once the wafer W has been placed on the stage device 405, the arm is retracted, and the shutter device 448 closes the access ports 445, 435.

The foregoing description has been made on the operation until a wafer in the cassette c is carried and placed on the stage device. For returning a wafer, which has been carried on the stage device and processed, from the stage device into the cassette c, the operation reverse to the foregoing is performed. Since a plurality of wafers are stored in the wafer rack 451, the first carrier unit can carry a wafer between the cassette and the wafer rack while the second carrier unit is carrying a wafer between the wafer rack and the stage device, so that the inspecting operation can be efficiently carried out.

FIGS. 1-7(A) and (B) are diagrams showing an exemplary electron beam calibration mechanism. The electron beam calibration mechanism 480 comprises a plurality of Faraday cups 482, 483 disposed at a plurality of positions on the side of the wafer W placement face 481 on the turntable 455 (FIG. 1-2). The respective Faraday cups are provided to measure a beam current, where the Faraday cup 482 is used for a fine beam of approximately 2 μmϕ, for example, while the Faraday cup 483 is used for a thick beam of approximately 30 μmϕ, for example. The Faraday cup 482 for thin beam measures a beam profile by moving the turntable 455 in steps, while the Faraday cup 483 for thick beam measures the total current amount of beam. The Faraday cups 482, 483 are disposed such that their top surfaces are at the same level as the top surface of the wafer W placed on the placement face 481. In this way, primary electron beams emitted from the electron gun is monitored at all times. This is because the electron gun cannot always emit a consistent electron beam but varies the amount of electron beam emitted therefrom as it is used.

FIG. 2 is a diagram showing the general configuration of an electro-optical system in the inspecting apparatus together with a positional relationship between a sample and a detection system. The electro-optical system is disposed in a vacuum chamber, and comprises a primary electro-optical system (hereinafter simply called the "primary optical system") PR for emitting a primary electron beam which is guided to a sample SL for irradiation to the sample SL; and a secondary electro-optical system (hereinafter simply called the "secondary optical system") SE for guiding secondary electron beams emitted from the sample SL to a detection system DT. The primary optical system PR, which is an optical system for irradiating an electron beam onto the surface of the sample SL under inspection, comprises an electron gun 1 for emitting an electron beam; a lens system 2 comprised of an electrostatic lens for converging the primary electron beam emitted from the electron gun 1; a Wien filter or ExB separator 3; and an objective lens system 4, where the optical axis of the primary electron beam emitted from the electron gun 1 is inclined with respect to an irradiation optical axis of the electron beam (perpendicular to the surface of the sample) which is irradiated to the sample SL. An electrode 5 is disposed between the objective lens system 4 and sample SL. This electrode 5 is in a shape axially symmetric to the irradiation optical axis of the primary electron beam, and has its voltage controlled by a power supply 6.

The secondary optical system SE comprises a lens system 7 comprised of electrostatic lenses for passing therethrough secondary electrons separated from the primary optical system by the ExB separator 3. This lens system 7 functions as an enlarging lens for enlarging a secondary electron image. The detection system DT comprises a detection unit 8 disposed on a focusing plane of the lens system 7, and an image processing unit 9.

The present invention relates to improvements on a detection unit in the inspecting apparatus as described above, and will be described below in greater detail in connection with embodiments of the inspecting apparatus according to the present invention with reference to the drawings. Throughout all drawings, the same reference numerals refer to the same or similar components.

FIG. 3 is a diagram schematically showing a first embodiment of the inspecting apparatus according to the present invention, which comprises a detector having an electron sensor and a detector having an optical sensor both contained in a single chamber. In FIG. 3, a CCD detector 11 and a TDI detector 12 are disposed within a vacuum chamber MC such that an EB-CCD (electron bombardment charge coupled device) sensor 13 of the CCD detector 11 is positioned closer to a sample. In FIG. 3, the CCD detector 11 and TDI detector 12 have their electron incident plane perpendicular to the drawing. The EB-CCD sensor 13 is supported such that it can be translated in the left-to-right direction in the figure by a moving mechanism M disposed outside of the vacuum chamber MC. In this way, the EB-CCD sensor 13 can be selectively moved to a position at which it receives an electron beam e, and to a position at which it directly applies the electron beam e into the TDI detector 12, thus making it possible to selectively use the CCD detector 11 and TDI detector 12. Here, the moving mechanism M moves the EB-CCD sensor to a position at which the optical axis to the EB-CCD sensor, the optical axis to lens conditions (lens intensity, beam deflection condition), and the lens conditions (lens intensity, beam deflection condition) match, when the EB-CCD sensor is moved to the position at which it receives an electron beam. This positioning condition can be mechanically modified by capturing images generated by the EB-CCD and EB-TDI for a sample having a known pattern. Though not shown, the CCD detector 11 comprises a camera connected to the EB-CCD sensor 13, a controller, a frame grabber board, a PC and the like, to capture the output of the EB-CCD sensor 13, display images, and control the CCD detector 11.

The EB-CCD sensor 13, which comprises a plurality of pixels which are two-dimensionally arranged, receives the electron beam e emitted from a sample and outputs a signal representative of a two-dimensional image of the sample. The EB-CCD sensor 13, when the electron beam is directly incident thereon, provides a gain corresponding to the energy of the incident electron beam, i.e., electrons are amplified to accomplish the accumulation of charges, and the charges are read at intervals of defined time (for example 33 Hz) and output as an electric signal of a two-dimensional image of one frame. For example, the EB=CCD sensor 13 used herein has pixels of 650 (horizontal direction)×485 (vertical direction), a pixel size of 14 µm×14 µm, a frame acquisition frequency of 33 Hz, and a gain of 100-1000. In this event, the gain of the EB-CCD sensor 13 is dominated by the energy of incident electrons, and can provide the gain of 300, for example, when the incident energy is 4 keV. The gain can be adjusted by the structure of the EB-CCD sensor 13.

The TDI detector 12, in turn, comprises an MCP 14 for amplifying an electron beam e emitted from a sample; a fluorescent plate 15 for receiving the amplified electron beam for conversion into light; an FOP 16 for transmitting the light generated from the fluorescent plate 15; and a TDI sensor 17 for receiving an optical signal from the FOP 16. The output of the TDI sensor 17 is transmitted to the camera 19 through the pin 18, as swoon in FIG. 28(B). It should be noted that the MCP 14 is disposed when electrons must be amplified, and may be omitted in some cases.

The MCP 14, fluorescent plate 15, FOP 16, and TDI sensor 17 are formed into a single package, where output pins of the TDI sensor 17 is connected to pins 18 of the field through unit FT by wire bonding or another connection means. With the TDI sensor 17 operating at high speeds to provide a large number of pixels, a large number of pins 18 are required, for example, 100 to 1000 pines as the case may be. The camera 19 inputs and outputs image signals in accordance with control signals for image capturing. Though not shown, other than the camera 19, the inspecting apparatus is provided with a power supply and a controller for the camera 19, and an image processing system for capturing and processing an image signal from the camera 19. An image evaluation value can be calculated by processing image data generated by the image processing system, and, for example, when used in a defect inspection, sites of defects, type of defects, size of defects and the like can be extracted and displayed on a screen.

A moving mechanism M is provided outside of the vacuum chamber M for selectively implementing a case where the CCD detector 11 is used and a case where the TDI detector 12 is used, and mechanically coupled to the EB-CCD sensor 13. When the CCD detector 11 is used to align the optical axes of the EB-CCD sensor and EB-TDI sensor, and adjust the lens condition, the moving mechanism M is operated to move the EB-CCD sensor 13 such that its center comes to the position of the optical axis of the electron beam e. In this state, the electron beam e can be sent into the EB-CCD sensor 13 to generate an image signal representative of a two-dimensional image of the sample. When the TDI detector 12 is used after the completion of adjustments to the optical axes and the like, the EB-CCD sensor 13 is moved by the moving mechanism M to a place away from the optical axis of the electro-optical system, for example, to a place spaced by a distance (for example, approximately 5 to 300 mm) at which the EB-CCD sensor 13 does not affect an electron image and an electron trajectory. In this way, the electron beam e is incident on the MCP 14 of the TDI detector 12 without being impeded by the EB-CCD sensor 13. In this regard, a shield is preferably provided for preventing charge-up at a junction at which the moving mechanism M is coupled to the EB-CCD sensor 13 (described later). The provision of such a mechanism eliminates the need for the TDI in the adjustments of the optical axes and the like, so that the MCP is prevented from being locally damaged. In addition, since the EB-CCD sensor and EB-TDI sensor are disposed within the same vacuum chamber, it is not necessary to break the vacuum atmosphere to change the EB-CCD sensor with the EB-TDI sensor.

Also, since the EB-CCD sensor is operated when adjustments are made to the optical axes and the like, the EB-CCD sensor and EB-TDI sensor may be operated for the first one of wafers accommodated in a cassette, and the EB-TDI sensor alone may be operated for the remaining wafers. Alternatively, the EB-CCD sensor may be operated every predetermined number of wafers to readjust the optical axes and the like.

Figures 1, 2, 3, 4:
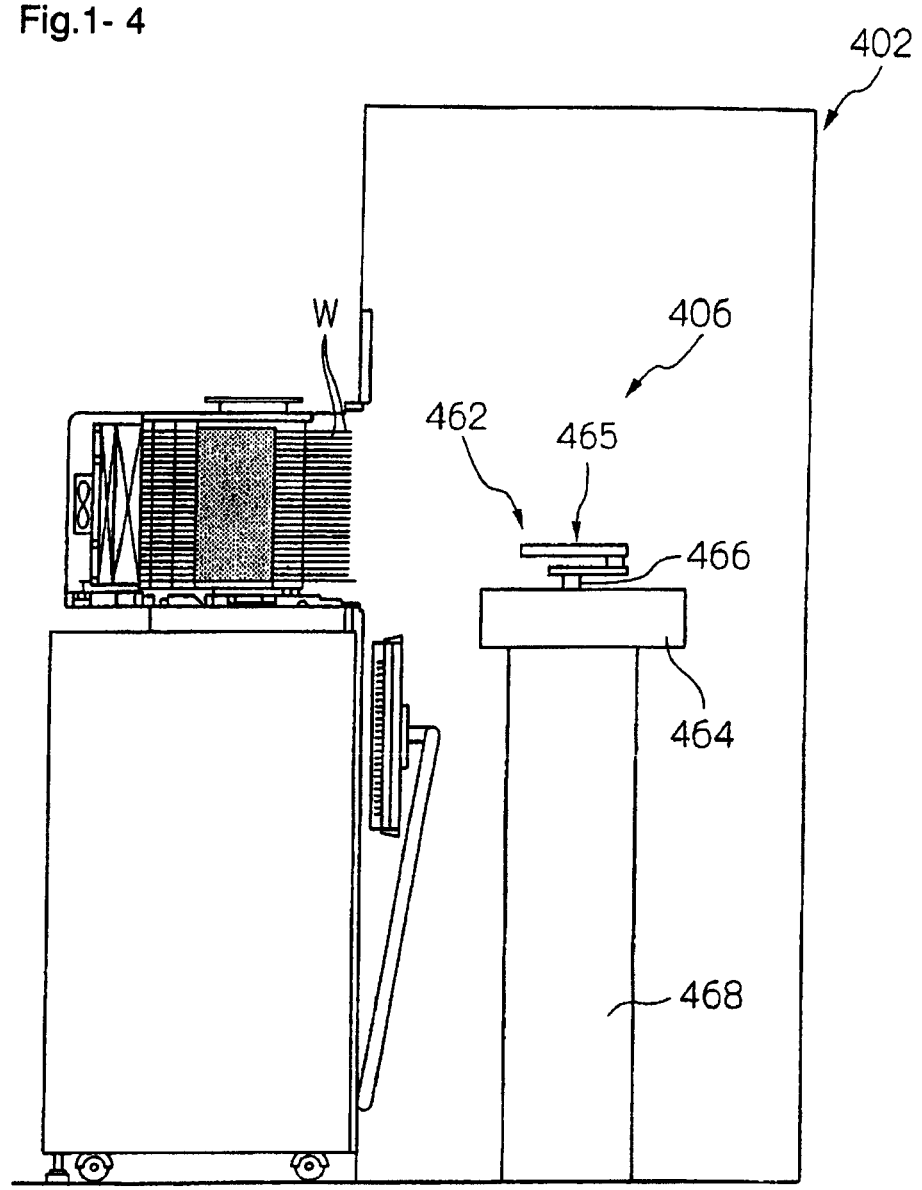

FIG. 4 is a diagram schematically showing a second embodiment of an inspecting apparatus according to the present invention. The moving mechanism M shown in FIG. 3 can simply translate in one axial direction (for example, in the X-direction). Instead, in the second embodiment shown in FIG. 4, the moving mechanism M is configured to be movable in three axial directions (X-, Y-, and Z-directions), to finely adjust the center of the EB-CCD sensor 13 with respect to the center of the optical axis of the electro-optical system. In this regard, an electron deflection mechanism may be provided in front of the EB-sensor 13 (closer to a sample) to adjust the position of the electron beam in order to adjust the optical axis of the electro-optical system.

FIGS. 5(A)-5(C) schematically shown a third embodiment of an inspecting apparatus according to the present invention, where (A) is a view taken from the front, and (B) and (C) are views taken from one side. As shown, the moving mechanism M in this embodiment utilizes rotational movements rather than movements in one axial or three axial directions. It should be noted that the TDI detector 12 does not comprise the MCP because the electron amplification is not needed in this embodiment.

In FIG. 5(A), one end of a rotary shaft 21 is coupled to one end of a flat EB-CCD sensor 13 which contains required circuits, substrates and the like, while the other end of the rotary shaft 21 is coupled to the moving mechanism M. FIGS. 5(B) and 5(C) are views of the configuration shown in FIG. 5(A), taken from the side closer to the moving mechanism M. When the CCD detector 11 is used, the EB-CCD sensor 13 is moved such that the sensor plane thereof is perpendicular to the electron beam e, thus causing the electron beam e to be incident on the EB-CCD sensor 13. When the TDI detector 12 is used, the rotary shaft 21 is rotated by the moving mechanism M, as shown in (C) to move the EB-CCD sensor 13 such that it is in parallel with the optical axis of the electro-optical system. As such, the electron beam e is incident on the fluorescent plate 15 which converts the electron beam e into an optical signal which is then incident on the TDI sensor 17 through the FOP 16.

Figures 1, 2, 3, 4, 5:
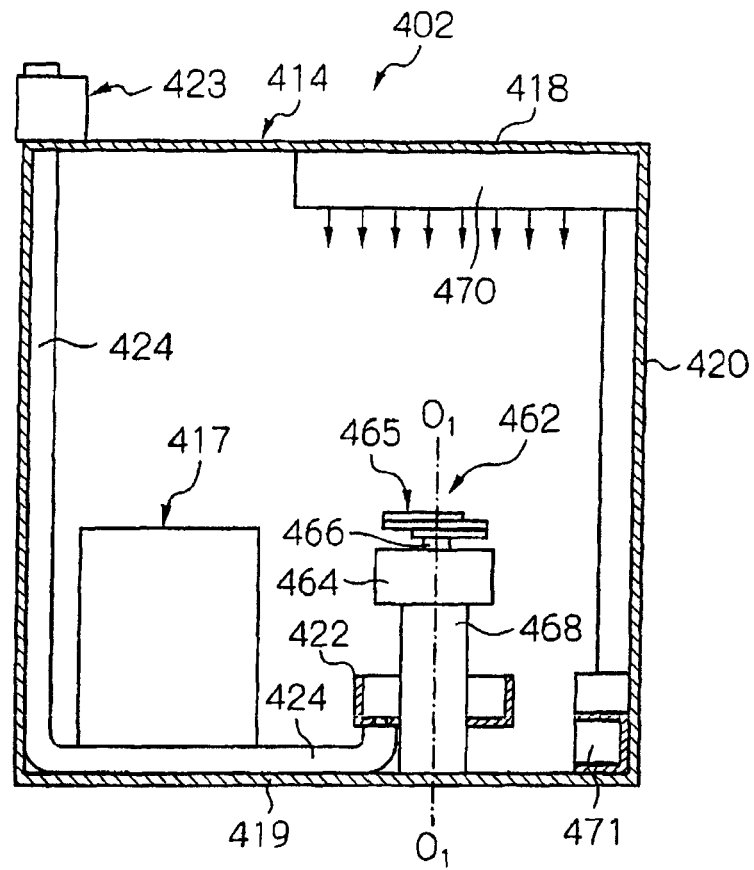

The moving mechanism shown in FIG. 5, which utilizes the rotation, can be advantageously reduced in size and weight, for example, by a factor of two to ten, as compared with the moving mechanism described in connection with FIGS. 3 and 4, which utilizes movements in one or three axial direction.

Figures 1, 2, 3, 4, 5, 6:
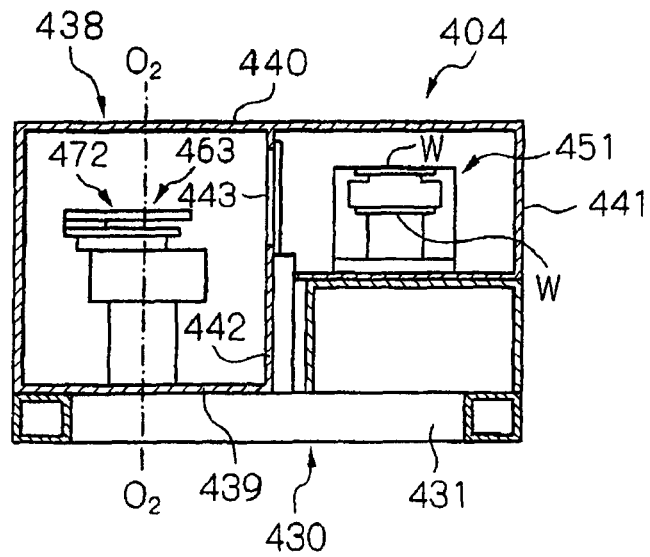

FIG. 6 is a diagram schematically showing a fourth embodiment of an inspecting apparatus according to the present invention, where two EB-TDI sensors are provided instead of the single EB-CCD sensor in the first and third embodiments, such that one can be selected from these EB-CCD sensors and the TDI detector 12. Specifically, a moving mechanism M is coupled to two EB-CCD sensors 131, 132 which differ in performance. For example, the EB-CCD sensor 131 has pixels the size of which is 14×14 μm, while the EB-CCD sensor 132 has pixels, the size of which is 7×7 μm, and these EB-CCD sensors have different electron image resolutions in accordance with their larger and smaller pixel sizes. In other words, an image generated by the EB-CCD sensor having the smaller pixel size (7 μm) achieves a resolution twice or more higher than that generated by the EB-CCD sensor having the larger pixel size (14 μm) in providing an electron image. In this regard, the number of EB-CCD sensors is not limited to two, but three or more EB-CCD sensors may be provided as required.

The inspecting apparatus which comprise the three components, i.e., the EB-CCD sensor 131, EB-CCD sensor 132, and TDI detector 12 placed in the same vacuum chamber M may be used, by way of example, in the following manner. Assuming that the EB-CCD sensor 131 has the pixel size of 14 μm, and the EB-CCD sensor 132 has the pixel size of 7 μm, the EB-CCD sensor 131 is used to adjust the optical axis of the electron beam, adjust the image, and extract electron image acquisition conditions. Next, the EB-CCD sensor 131 is moved by the moving mechanism M to a position away from the optical axis, so that the electron beam is incident on the fluorescent plate 15. An optical signal converted from electrons by the fluorescent plate 15 is incident on the TDI sensor 17 through the FOP 16. In this way, the camera 19 captures electron images in succession using the output of the TDI sensor 17. Thus, it is possible to perform, for example, an inspection of an LSI wafer for defects, an inspection of an exposure mask, and the like. Using or referring to setting conditions for the electro-optical system extracted by the EB-CCD sensor 131, the image capturing in the TDI detector 12 is performed in the camera 19. Such image capturing can be performed simultaneously with an inspection for defects (i.e., on-line) or after the image capturing (i.e., off-line).

In an inspection for defects, information such as the location, type, size and the like of defects can be provided. After the image capturing and inspection for defects in the TDI detector 12, the moving mechanism M is actuated to move the EB-CCD sensor 132 to the position of the optical axis, allowing the EB-CCD sensor 132 to capture images. In this event, since the location of defects has been known from the previously acquired result of the inspection for defect through the image capturing in the TDI detector 12, the EB-CCD sensor 132 performs image capturing for evaluating the defects in greater detail. In this event, in addition to a high-resolution image capturing resulting from the smaller pixel size of the EBG-CCD sensor 132, electron images can be captured with an increased number of electrons taken for an image, or with a longer image capturing duration. When the image capturing time is prolonged to increase the number of electrons acquired per pixel (the number of electrons per pixel), an electron image of miniature defects can be more clearly captured with high contract (high MTF condition) to acquire data. This is because a larger number of electrons per pixel results in a reduction in noise component due to fluctuations in luminance and the like to improve the S/N ratio and MTF. In this way, the EB-CCD sensor 132 having a smaller pixel size can be used to evaluate defects in detail, for example, the type, size and the like of the defects in detail. The ability to evaluate the type of defect in detail can lead to improvements on the process by feeding back information on where and how many defects of the same type have occurred, and the like, to the process.

Fluctuations in luminance are caused by fluctuations in the number of incident electrons, fluctuations in the amount of electrons to light conversion, fluctuations in noise level of the sensor, statistic noise, and the like. Also, when there is an electronic amplifier such as MCP, the fluctuations in the number of electrons by electron amplification constitute a factor as well. Such fluctuation noise can be reduced by increasing the number of electrons, and can be reduced to approximately a root value of an output luminance value at the highest noise fluctuation level (for example, the noise fluctuation level is 700^0.5 with 700 halftone values). Showing an example of the number of electrons per pixel in each detector, the EB-CCD sensor 131 presents 20-1000 per pixel; the EB-CCD sensor 132 200-200000 per pixel; and the TDI detector 12 10-1000 per pixel.

When a plurality of detectors are implemented such that they are switched for use in particular functions as shown in FIG. 6, one and the same inspecting apparatus can perform both inspection and detailed evaluation on defects. Conventionally, a wafer is moved to a dedicated analyzer (review SEM or the like) after an inspection for evaluating the type and size of defects in detail. When the detailed evaluation can be performed in the same apparatus, it is possible to make shorter and more efficient the detail evaluation of the inspection for defects and improvements in process.

Even when a single EB-CCD sensor 13 is provided, as has been described in connection with FIGS. 3 to 5, defects can be evaluated after inspecting the defects through image capturing using the TDI detector 12, in which case the number of acquired electrons per pixel is increased to reduce noise fluctuation components before the defects are evaluated. In this way, the type and size of the defects can be evaluated without using a dedicated defect analyzer, and even if it is used, the defect analyzer can be reduced, and improvements in process and process management can be more efficiently accomplished.

Figures 1, 2, 3, 4, 5, 6, 7:
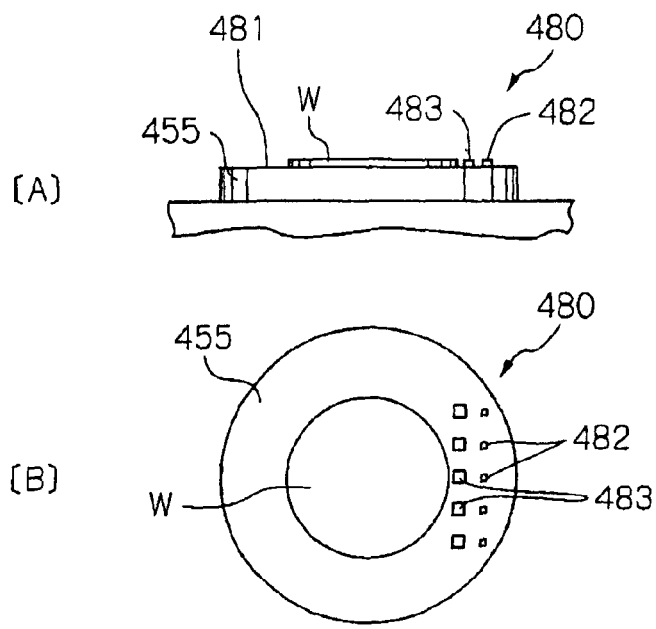
Figure 2:
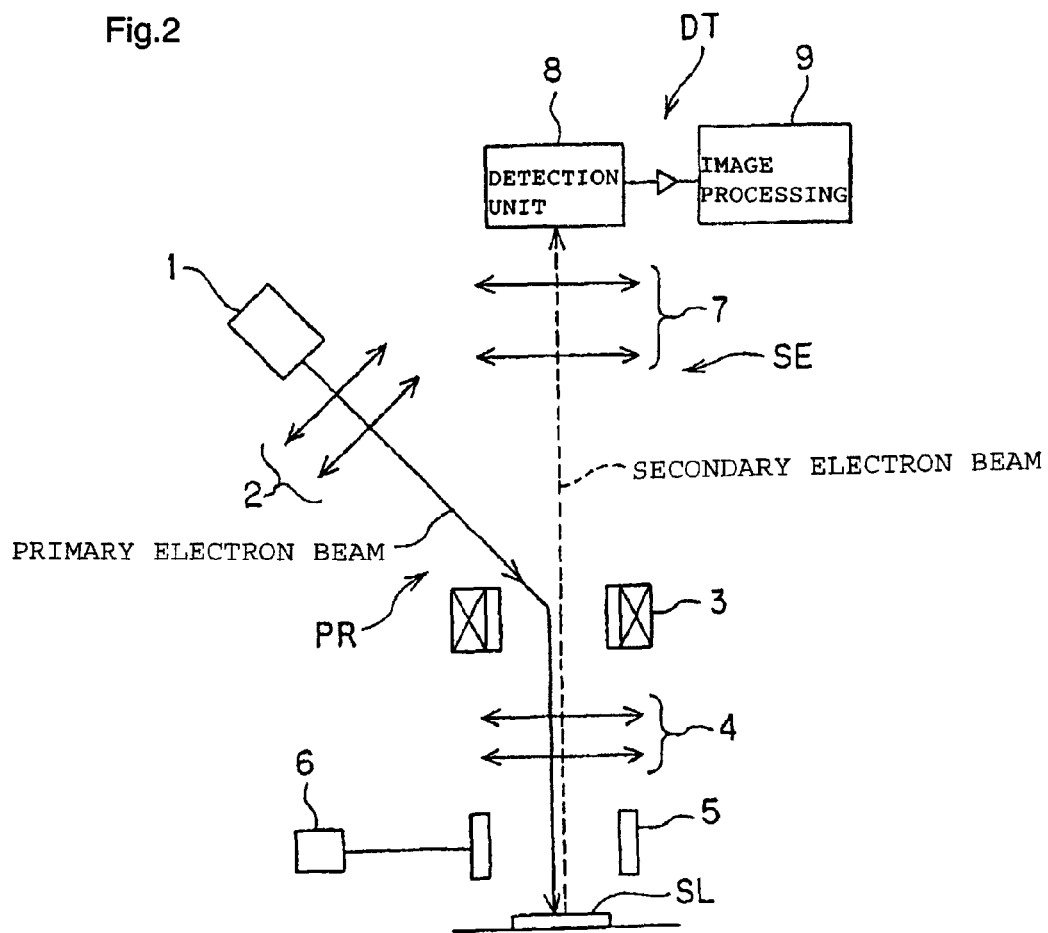
Figure 5:
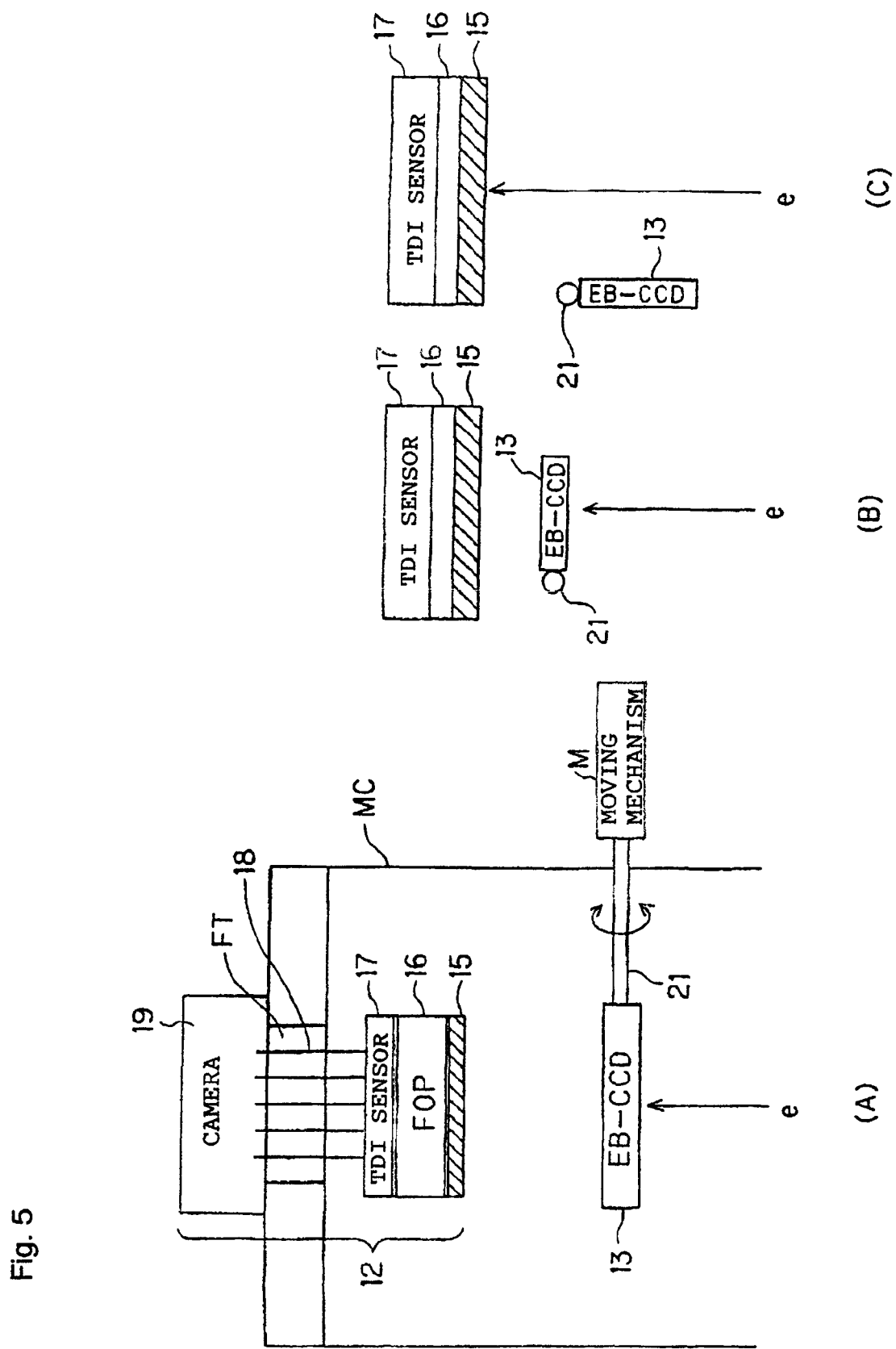
Figure 6:
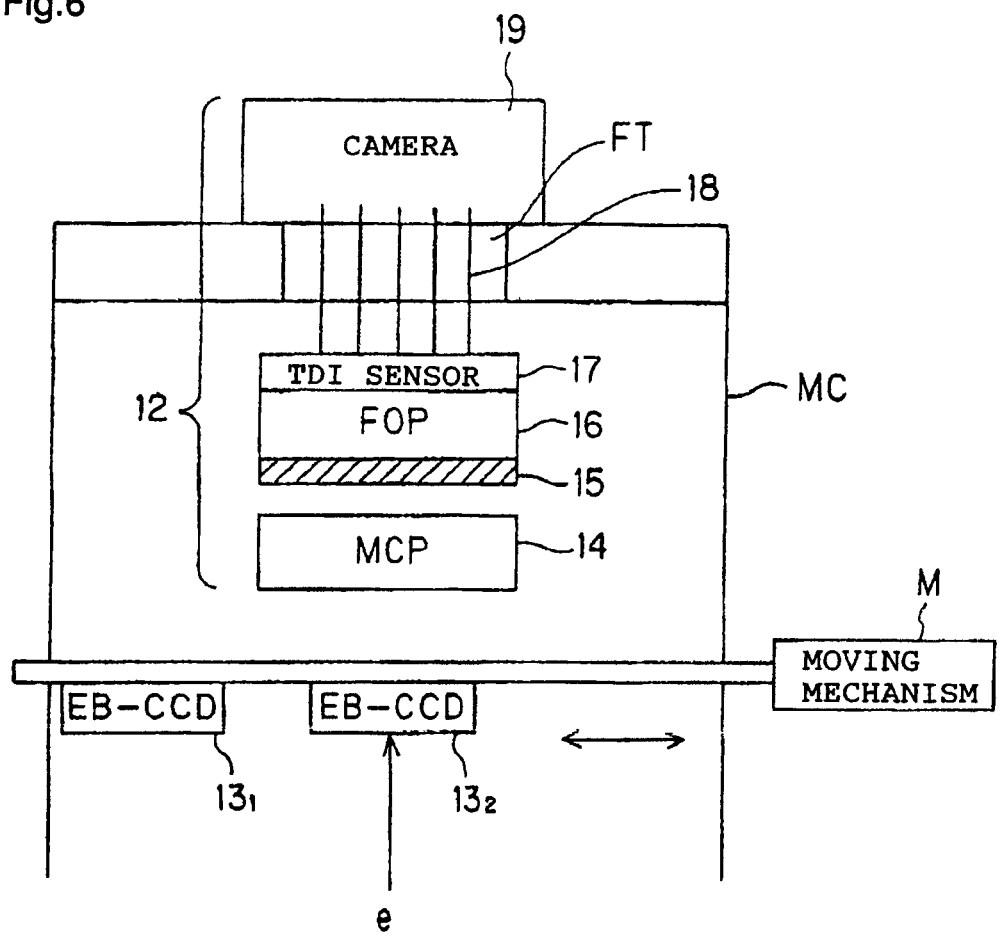

In the embodiment so far described, the mechanism for switching the CCD detector 11 and TDI detector 12 utilizes mechanical movements. In contrast, FIG. 7 is a diagram schematically showing a fifth embodiment of an inspecting apparatus according to the present invention, where an electronic deflector is utilized for a switching mechanism. While this embodiment also uses a single CCD detector 11 and a single TDI detector 12 by selectively switching them, the CCD detector 11 is placed out of the optical axis (trajectory of an electron beam e) at a predetermined angle to the optical axis, as shown. Also, a deflector 41 is disposed on the optical axis for switching the trajectory of the electron beam e between the CCD detector 11 and the TDI detector 12. The deflection angle of the deflector 41 is preferably in the range of 3 to 30°.

This is because excessive deflection of secondary beam would result in distortions in a two-dimensional image and larger aberration.

In this embodiment, the EB-CCD sensor 13 is electrically connected to a camera 44 through a wire 42 and a feed through flange 43. Thus, when the CCD detector 11 is used, the trajectory of the electron beam e is deflected by the deflector 41, such that the electron beam e is perpendicularly incident on the EB-CCD sensor 13. The incident electron beam e is converted into an electric signal by the EB-CCD sensor 13, and the electric signal is transmitted to the camera 44 through the wire 42. On the other hand, when the TDI detector 12 is used, the deflector 41 is not operated. Consequently, the electron beam e is incident on the fluorescent plate 15 directly or through the MCP 14. The electron beam incident on the fluorescent plate 15 is converted into an optical signal which is transmitted to a TDI sensor 17 through an FOP 16, and is converted into an electric signal by the TDI sensor 17 for transmission to a camera 19.

Figure 8:
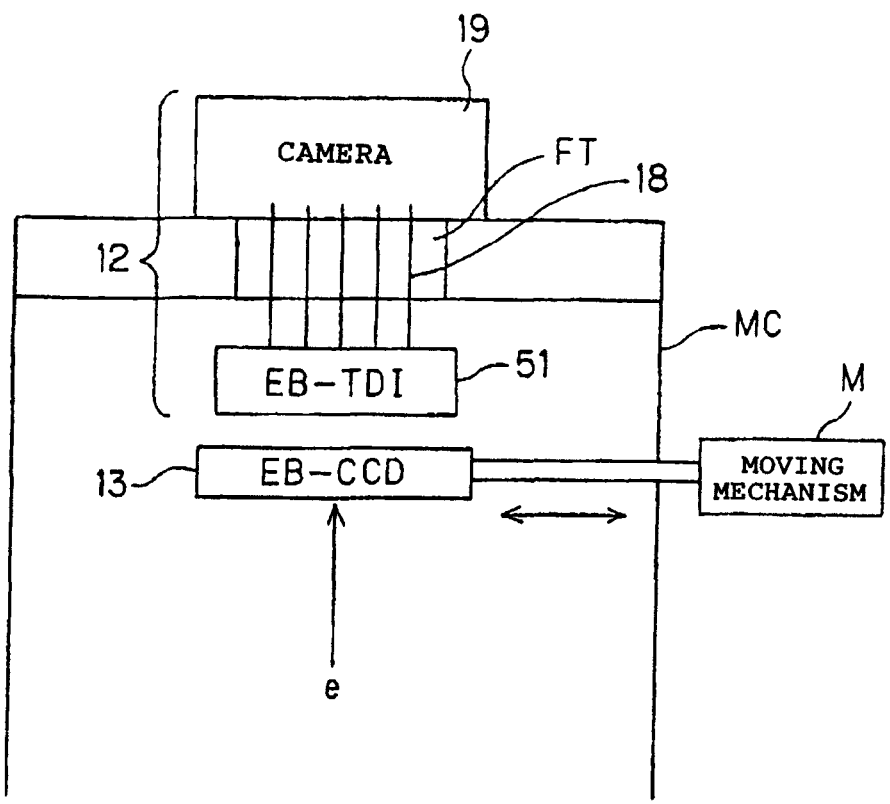
FIG. 8
A diagram schematically showing a sixth embodiment of an inspecting apparatus according to the present invention.

FIG. 8 is a diagram schematically showing a sixth embodiment of an inspecting apparatus according to the present invention, where a CCD detector 11 and a TDI detector 12 each comprise an electron sensor for receiving an electron beam. Specifically, the CCD detector 11 employs an EB-CCD sensor 13, whereas the TDI detector 12 employs an EB-TDI (electron bombardment time delay integration) sensor t1 as an electron sensor, causing an electron beam e to be directly incident on the EB-TDI sensor 51. In this configuration, the CCD detector 11 is used to adjust the optical axis of the electron beam, as well as adjust and optimize image capturing conditions. On the other hand, when the EB-TDI sensor 51 of the TDI detector 12 is used, the EB-CCD sensor 13 is moved by the moving mechanism M to a position away from the optical axis, as previously described, before an image capturing is performed by the TDI detector 12 using or referring to conditions which have been found when the CCD detector 11 is used, to perform evaluation or measurement.

As described above, in this embodiment, a semiconductor wafer can be inspected for defects by the EB-TDI sensor 51 using or referring to electro-optical conditions which have been found when the CCD detector 11 is used. Also, an evaluation on defects can be performed for the type, size and the like of the defects using the CCD detector 11 after the inspection for the defects by the TDI detector 12.

The EB-TDI sensor 51 is, for example, in a rectangular shape, with its pixels arranged in a two-dimensional array such that the electron beam e can be directly received thereby for use in forming an electron image, where the image size is in the range of 5-20 µm, the number of pixels is in the range of 1000-8000 in the horizontal direction and 1-8000 in the scanning direction, and he gain is in the range of 10-5000. The EB-TDI sensor 51 can be used at a line rate of 1 kHz to 1 MHz. The gain is dictated by the energy of incident electrons. For example, when an incident electron beam has energy of 4 kev, the gain can be set in the range of 200 to 900, and the gain can be adjusted by the sensor structure with the same energy. In this way, when the EB-TDI sensor is used in an apparatus for capturing an electron image, the apparatus can advantageously capture images in succession, as well as achieve higher MTF (or contrast) and a higher resolution, as compared with a TDI sensor for sensing light.

Actually, in this embodiment, the TDI detector 12 is also formed into the shape of package, so that the package itself serves as a feed through, with pins 18 of the package connected to the camera 19 on the atmosphere side. When configured as shown in FIG. 8, it is possible to eliminate disadvantages such as a loss in optical conversion due to FOP, optical glass for hermetic sealing, optical lenses and the like, aberration and distortion during optical transmissions and degradation in image resolution caused thereby, failed detection, high cost, increase in size, and the like, as compared with the first to fifth embodiments so far described.

Figure 9:
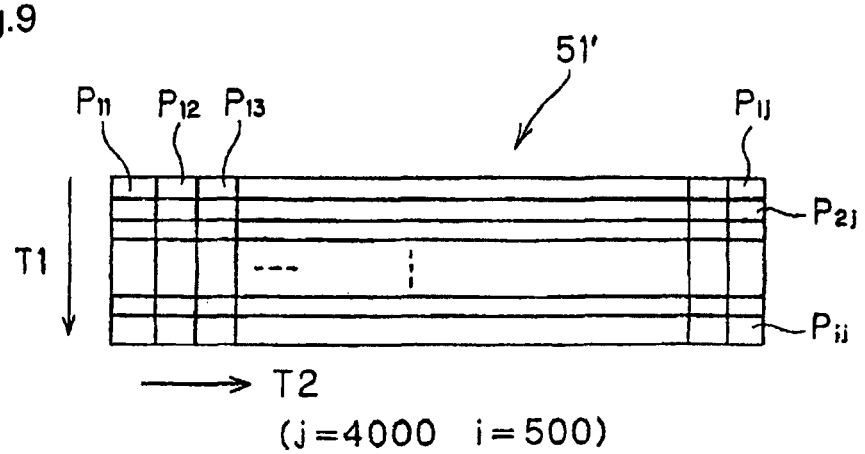
FIG. 9
A diagram schematically showing the configuration of an EB-TDI sensor shown in FIG. 8.

FIG. 9 is a plan view showing pixels P11-Pij on a sensor plane 51' of an EB-TDI sensor 51. In FIG. 9, an arrow T1 indicates an integration direction of the sensor plane 51', which is a direction perpendicular to a T2 integration direction T1, i.e., a direction in which a stage S is moved in succession. The pixels P11-Pij of the sensor t1 are arranged in 500 steps in the integration direction T1 (number of integration steps i=500), and 4000 (j=4000) in the successive movement direction T2 of the stage S.

Figure 10:
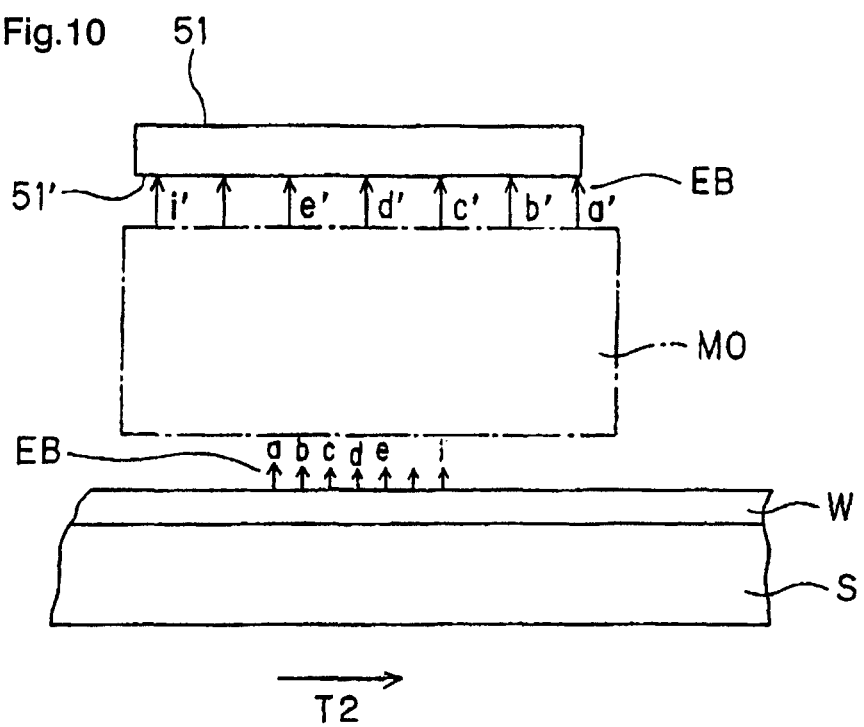
FIG. 10
A diagram for describing the operation of the EB-TDI sensor shown in FIG. 8.

FIG. 10 is a diagram schematically showing the positional relationship between the EB-TDI sensor 51 and a secondary electron beam. In FIG. 10, when a secondary electron beams EB emitted from a wafer W is emitted from the same positions of the wafer W for a certain time, the secondary electron beam EB is sequentially incident on a series of positions a, b, c, d, e, ... on a projection optical system MO in the order of a to in association with successive movements of the stage S. The secondary electron beam EB incident on the projection optical system MO is sequentially emitted from a series of positions a', b', c', d', e', ..., i' on the projection optical system MO. In this event, when a charge integration movement in the integration direction T1 of the EB-TDI sensor 51 is synchronized with the successive movements of the stage S, the secondary electron beams EB emitted from the positions a', b', c', d', e', ..., i' on the projection optical system MO are sequentially incident on the same positions on the sensor plane 51', so that the charge can be integrated by the number of integration steps i. In this way, each pixel P11-Pij on the sensor plane 51' can acquire more signals of radiated electrons, thereby accomplishing a higher S/N ratio, and capturing a two-dimensional image at high speeds. The projection optical system MO has a magnification of 300 times, by way of example.

Figure 11:
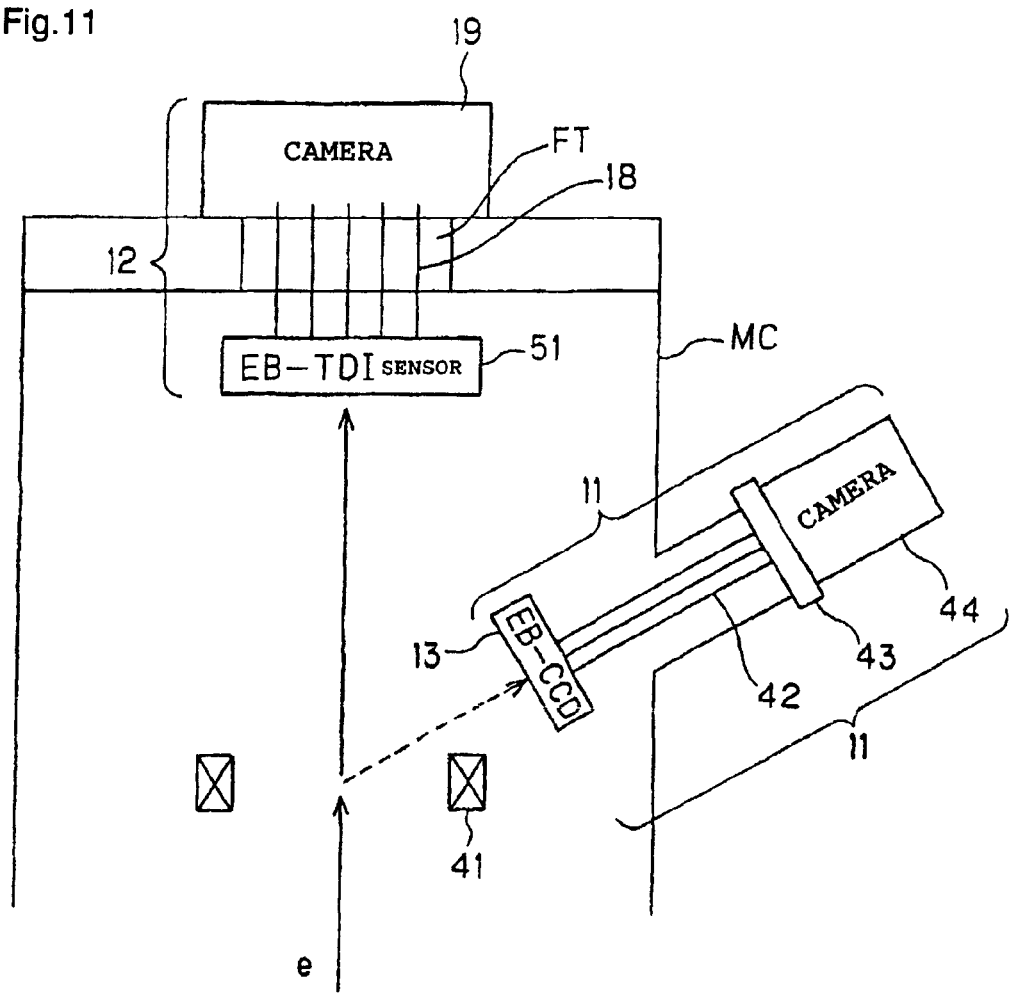
FIG. 11
A diagram schematically showing a seventh embodiment of an inspecting apparatus according to the present invention.

FIG. 11 is a diagram schematically showing a seventh embodiment of an inspecting apparatus according to the present invention. As can be seen from the figure, a TDI detector 12 comprising an electron sensor for detecting an electron beam is used instead of the TDI detector 12 comprising an optical sensor in the fifth embodiment shown in FIG. 7.

Likewise, in this embodiment, an EB-CCD sensor 13 of a CCD detector 11 is electrically connected to a camera 44 through a wire 42 and a feed through flange 43. When the CCD detector 11 is used, the trajectory of the electron beam is deflected by a deflector 41, such that the electron beam e is incident perpendicularly to the EB-CCD sensor 13. The incident electron beam is converted into an electric signal by the EB-CCD sensor 13 for transmission to the camera 44 through the wire 42. On the other hand, when the TDI detector 12 is used, the deflector is not operated, so that the electron beam e is directly incident on the EB-TDI sensor 51 for conversion into an electric signal which is then transmitted to a camera 19.

Figure 12:
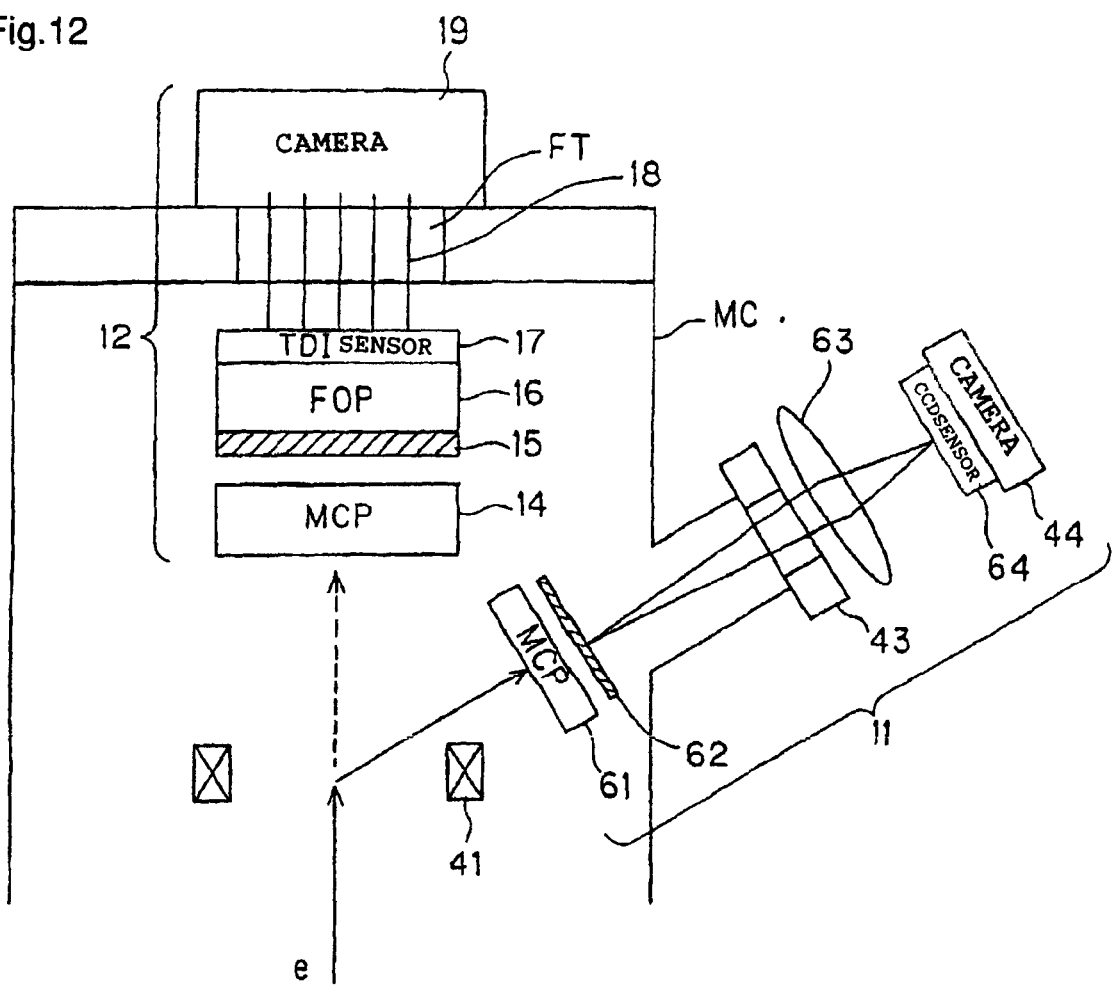
FIG. 12
A diagram schematically showing an eighth embodiment of an inspecting apparatus according to the present invention.

FIG. 12 is a diagram schematically showing an eighth embodiment of an inspecting apparatus according to the present invention, where a CCD detector 11 and a TDI detector 12 each comprises an optical sensor for detecting light, and are configured to be switched by making use of deflection of electron beam. Specifically, the CCD detector 11 comprises a CCD sensor for detecting light instead of the EB-CCD sensor 13. The CCD detector 11 comprises an MCP 61 for amplifying an electron beam; a fluorescent plate 62 for converting an amplified electron beam into light; an optical lens 63 for converging light exiting the fluorescent plate 62 and transmitting a light transmission area of a feed through flange 43; a CCD sensor 64 for converting light converged by the optical lens into an electric signal; and a camera 44 for capturing an image using the electric signal.

In this embodiment, the two detectors, i.e., the TDI detector 12 and CCD detector 11 are disposed in a single vacuum chamber, but three or more detectors may be provided as long as the size of the vacuum chamber permits. Also, as described above, the MCPs 14, 61 may be omitted if the amplification of electrons is not required.

A deflector 41 is provided in this embodiment for switching the trajectory of the electron beam to the TDI detector 12 or to the CCD detector 11. Thus, when the CCD detector 11 is used, the electron beam e is deflected by 5 to 30 degrees by the deflector 41 such that electrons are incident on the fluorescent plate 62 through the MCP 61 or without the intervention of the MCP 61. After an electro-optical conversion has been made herein, optical image information is converged by the optical lens 63 mounted in the feed through flange 43 and directed into the CCD sensor 64. The optical lens 63 and CCD sensor 64 are placed in the atmosphere. The optical lens 63 is provided with a lens (not shown) for adjusting aberration and focus.

On the other hand, when the TDI detector 12 is used, the deflector 41 is not operated, permitting the electron beam e to travel directly to be incident on the MCP 14, or on the fluorescent plate 15 when the MCP 14 is not used. An electro-optical conversion is performed by the fluorescent plate 15, and the optical information is transmitted to the TDI sensor 17 through the FOP 16.

In the eighth embodiment shown in FIG. 12, the CCD sensor 64 is placed on the atmosphere side, while the TDI sensor 17 is placed in a vacuum. On the other hand, in a ninth embodiment of an inspecting apparatus according to the present invention, schematically shown in FIG. 13, a TDI sensor 17 and a CCD sensor 64 are placed on the atmosphere side. In this embodiment, since the configuration of the CCD detector 11 is the same as that shown in FIG. 12, a description thereon is omitted herein. The TDI detector 12 comprises an MCP 14, a fluorescent plate 15, an optical lens 17, a TDI sensor 17, and a camera 19. An electron beam e, which travels straight without being deflected by the deflector 41, is amplified by the MCP 14, or is directly incident on the fluorescent plate 15, when the MCP 14 is not used, to undergo an electro-optical conversion thereby, and the optical information is converged by an optical lens 71 mounted in a hermetic flange 72, and is incident on the TDI sensor 17. In this way, the trajectory of the electron beam e is switched by the deflector 41 such that the CCD detector 11' and TDI detector 12 can be selectively used.

Figure 14:
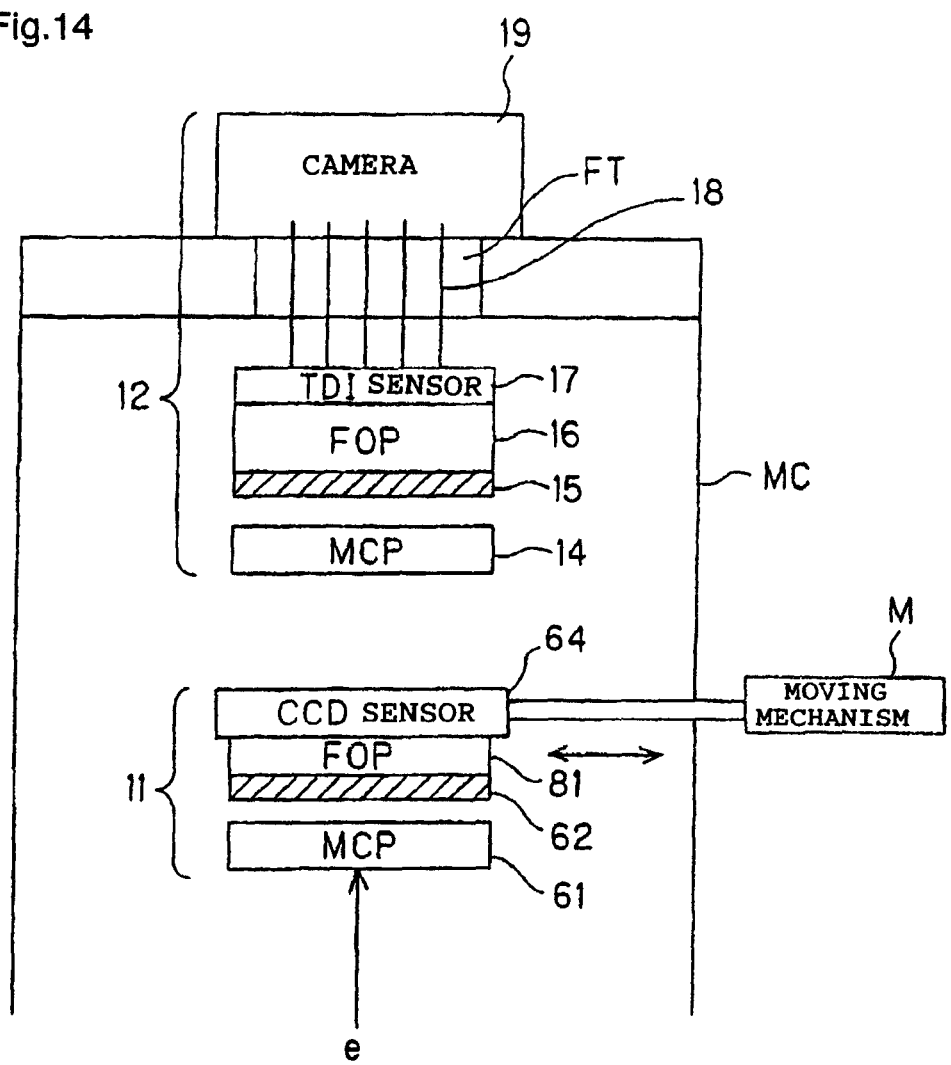
FIG. 14
A diagram schematically showing a tenth embodiment of an inspecting apparatus according to the present invention.

FIG. 14 is a diagram schematically showing a tenth embodiment of an inspecting apparatus according to the present invention, where a CCD detector 11 and a TDI detector 12 each comprise an optical sensor for detecting light. These optical sensors are disposed within a single chamber, and the detectors are switched through translation or rotation. Specifically, the CCD sensor 64 of the CCD detector 11 and the TDI sensor 17 of the TDI detector 12 are disposed within a single vacuum chamber MC. In this embodiment, since the TDI detector 12 is the same as that shown in FIG. 12, a repeated description is omitted herein. The CCD detector 11 comprises an MCP 61, a fluorescent plate 62, an FOP 81, and a CCD sensor 64. When the TDI detector 12 is used, the CCD detector 11 is moved by a moving mechanism M to go away from the optical axis of the electron beam e (to the right in the figure). In either of the detectors, during use, the electron beam e is amplified by MCP 14, 61, or is directly incident on the fluorescent plate 15, 62 without using the MCP 14, 61 to undergo an electro-optical conversion, and the resulting optical information is transmitted to the sensor 17, 64 through the FOP 16, 81 for conversion into an electric signal which is then captured by the camera.

Figure 15:
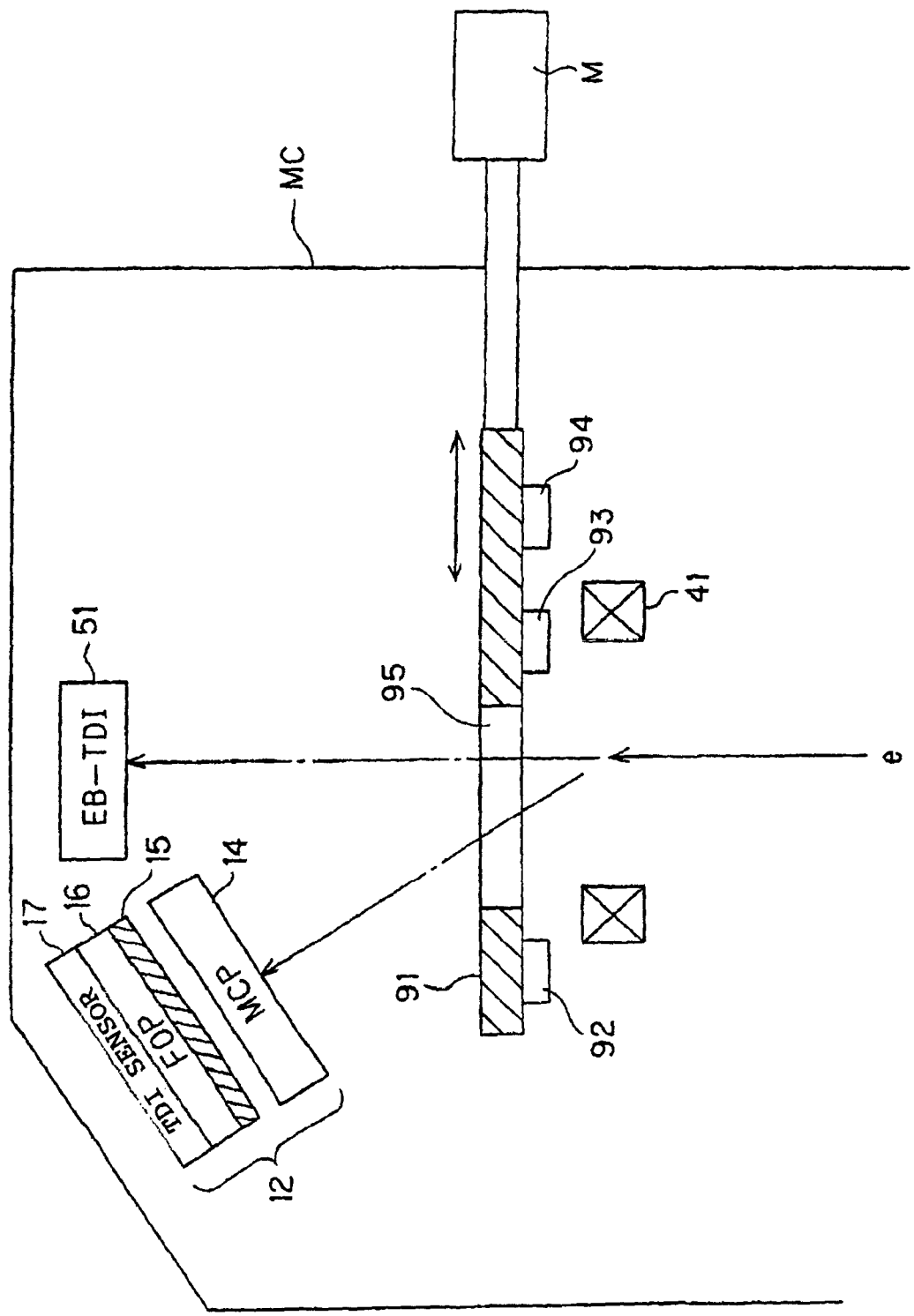
FIG. 15
A diagram schematically showing an eleventh embodiment of an inspecting apparatus according to the present invention.

FIG. 15 is a diagram schematically showing an eleventh embodiment of an inspecting apparatus according to the present invention, where a moving mechanism is used in combination with a deflector 41 as a switching mechanism such that one can be selected from five detectors. In FIG. 15, an EB-CCD sensor 92 of a first detector, an EB-CCD sensor 93 of a second detector, and an EB-CCD sensor 94 of a third detector are mounted in a cylindrical shield block 91 which translates in a direction indicated by an arrow by the moving mechanism M. A shield hole 95 is formed through the shield block 91 at a proper site for passing an electron beam e therethrough, and an EB-TDI sensor 51 of a fourth detector is provided on a trajectory along which the electron beam e travels straight after it has passed through the shield hole 95. Further, a TDI detector 12, which is a fifth detector, is provided at a position at which it receives the electron beam which has been deflected by the deflector 41 in the trajectory direction and passed through the shield hole 95. The shield block 91 used herein may be a cylindrical structure of 1-100 mm diameter, by way of example, which is preferably made of such a material as a metal such as titanium, phosphor bronze, aluminum or the like, or a non-magnetic material, or aluminum plated with gold or titanium plated with gold may also be used.

Thus, when an image is captured by any of the EB-CCD sensors 92-94 of the first to third detectors, the shield block 91 is moved by the moving mechanism M without actuating the deflector 41, such that the center of any EB-TDI sensor may be moved to the position of the trajectory of the electron beam e. When the electron beam is incident on the EB-TDI sensor of the fourth detector, the shield block 91 is moved by the moving mechanism M without actuating the deflector 41 to a position at which the electron beam can pass through the shield hole 95. Also, when an image is captured by the TDI detector 12 which is the fifth detector, the deflector 41 is actuated, and the shield block 91 is moved by the moving mechanism M to a position at which the electron beam can pass through the shield hole 95.

The EB-CCD sensors 92-94, TDI sensor 17, and EB-TDI sensor 51 used in this embodiment differ from one another in performance such as the element size, driving frequency, sensor size and the like, depending on their respective uses and purposes. One example is listed below.

First EB-CCD Sensor 92:
Pixel Size: 14 μm, Frame rate: 100 Hz, Sensor Size: 3500× 3500 μm;
Second EB-CCD Sensor 93:
Pixel Size: 7 μm, Frame rate: 33 Hz, Sensor Size: 3500× 3500 μm;
Third EB-CCD Sensor 94:
Pixel Size: 3 μm, Frame rate: 10 Hz, Sensor Size: 3000× 3000 μm;
EB-TDI Sensor 51:
Pixel Size: 14 μm, Scan Rate: 100-1000 kHz supported, Sensor Size: 56×28 mm; and
TDI sensor 17:
Pixel Size: 14 μm, Scan Rate: 1-100 kHz supported, Sensor Size: 56×28 mm.

Describing an exemplary usage of a plurality of sensors as mentioned above, the EB-CCD sensor 92 is used to adjust the electro-optical system of the optical beam, i.e., for optimization of lens conditions, aligner conditions, magnification, and stig conditions. While a lens voltage, an aligner voltage, a stig voltage and the like are controlled by image processing, such control and image processing are fully automated suing a personal computer which incorporates an automatic control function. Images are captured at high speeds using the EB-CCD sensor 92 which provides a high frame rate to adjust automatic conditions.

The EB-CCD sensor 93 operates at a frequently used frame rate of 33 Hz, a speed which can be sufficiently determined by the human's eyes. Therefore, a work for confirming adjustment, and observation of a sample, for example, observation, evaluation and the like of an image of defects after an inspection for defects are performed while viewing the image. When miniature defects are found during observation so that observation, evaluation, and classification of defects at higher resolution are desired, the EB-CCD sensor 94 is used. The EB-CCD sensor 94 has smaller pixels and accordingly a higher resolution, but requires a longer time for image capturing due to its lower frame rate. It is therefore necessary to select a site to be observed for image capturing.

The TDI detector 12 and EB-TDI sensor are properly used in accordance with their different scan rates (line rates). Generally, frequencies corresponding to the scan rate of a TDI sensor are limited in a frequency range supported by a circuit. Also, it is difficult to design a driving circuit which satisfies both low frequencies and high frequencies. As such, the E-TDI sensor 51 is used to inspect at high speeds and at high frequencies, while the TDI detector 12 is used to perform an inspection for defects at lower frequencies of 1-100 kHz. However, any of the TDI detector 12 and the EB-TDI sensor 51 may be used for high frequencies and low frequencies without any hitch. Nevertheless, since the electron beam directly enters the sensor, the EB-TDI sensor 51 presents a higher sensor temperature. Also, since the EB-TDI sensor 51 suffers from relatively much thermal noise, it is suited to high frequencies at which a short time is taken for capturing images.

In the eleventh embodiment shown in FIG. 15, an arbitrary number of detectors can be disposed within a single vacuum chamber as required. For example, one or more EB-CCD sensors can be mounted in the shield block 91 in accordance with its length and necessity, and any of the detector having the EB-TDI sensor 51 and the TDI detector 12 may be omitted.

Figure 16:
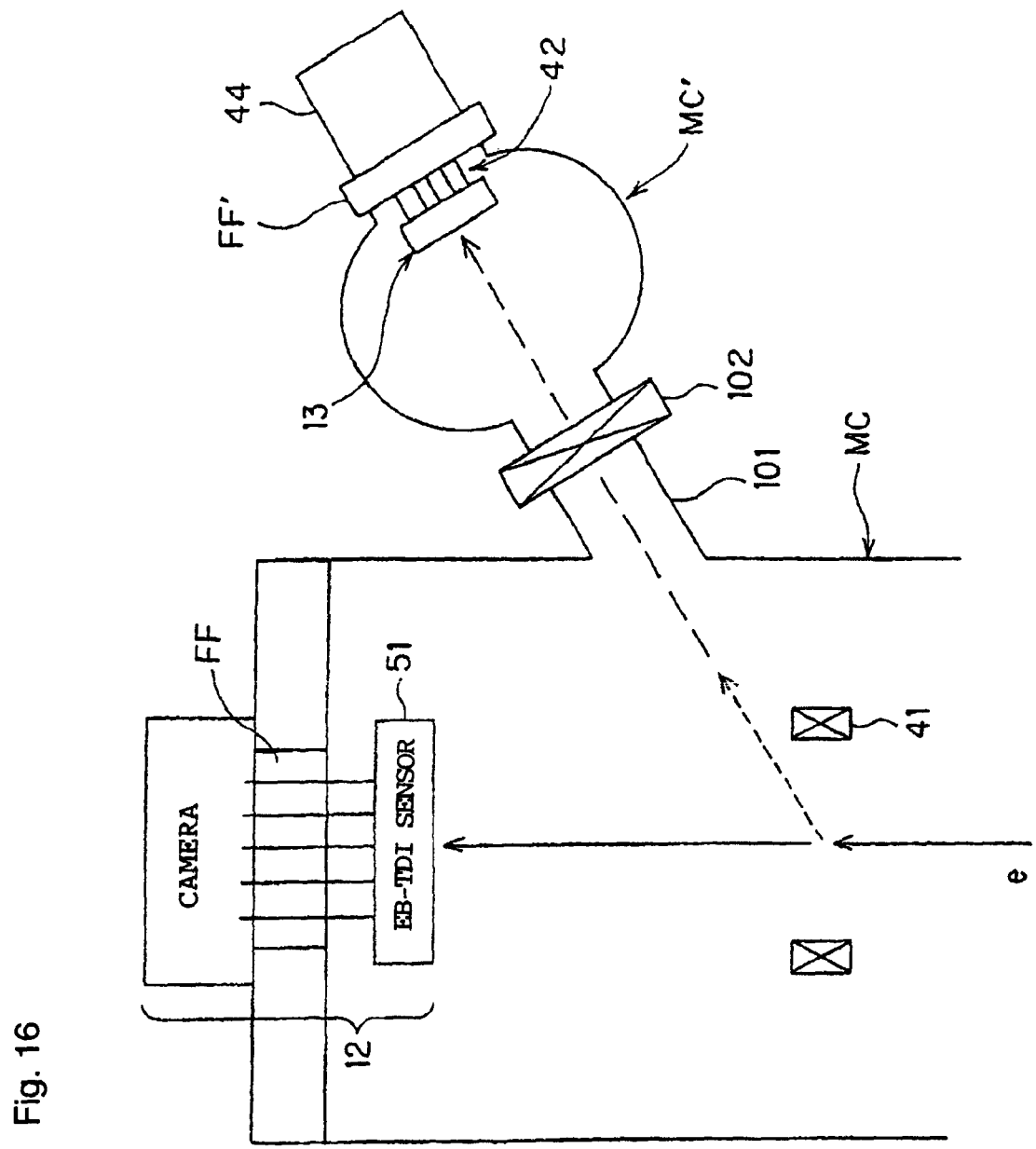
FIG. 16
A diagram schematically showing a twelfth embodiment of an inspecting apparatus according to the present invention.

FIG. 16 is a diagram schematically showing a twelfth embodiment of an inspecting apparatus according to the present invention. In the embodiments so far described, a plurality of detectors or sensors are disposed within a single vacuum chamber MC in all the embodiments except for the eighth and ninth embodiments. In this twelfth embodiment, two vacuum spaces are defined in a single vacuum chamber MC, such that a detector is disposed in each of the vacuum spaces. Specifically, an EB-TDI sensor 51 of a TDI detector 12 is disposed in one space of the vacuum chamber MC, while an EB-CCD sensor of a CCD detector 11 is disposed in the other vacuum space coupled to the vacuum chamber MC. For implementing this, a port 101 is provided so as to extend from the vacuum chamber MC at a proper position in FIG. 16, and one end thereof is connected to one end of a vacuum chamber MC', which provides the other vacuum space, through a gate valve 102. The other end of the vacuum chamber MC' is sealed by a feed through flange FF'. An EB-CCD sensor 13 is disposed within the vacuum chamber MC' which provides the other vacuum space, and the EB-CCD sensor 13 is connected to a camera 44 on the atmosphere side through a wire 42 which passes through the feed through flange FF'.

In FIG. 16, when the electron beam is incident on the EB-CCD sensor 13 disposed in the vacuum chamber MC', the traveling direction of the electron beam e is switched by the deflector 41, and the gate valve 102 is opened. An output signal from the EB-CCD sensor 13 is transmitted to the camera 44 through the wire 42.

Advantageously, with the EB-CCD sensor 13 which is disposed in a different vacuum space from the vacuum space in which the EB-TDI sensor 51 is disposed, the one vacuum space is not open to the atmosphere only if the gate valve 102 is closed, when the EB-CCD sensor 13 is changed. However, due to different conditions for focusing on the sensor plane (distance, magnification and the like), it is necessary to establish appropriate focusing conditions for the electron beam by controlling a voltage applied to a lens (not shown) placed in front of the deflector 41.

As described above, in the first to twelfth embodiments, the EB-CCD sensor, TDI sensor, EB-TDI sensor, and CCD sensor are disposed within a vacuum chamber, so that images can be captured with high contrast and high resolution, and a higher throughput and a lower cost can be accomplished because of the elimination of optical transmission loss, as compared with conventional approaches.

In regard to the number of pixels, arbitrary numbers of pixels may be selected for the TDI sensor, CCD sensor, EB-TDI sensor, and EB-CCD sensor used in the first to twelfth embodiments. The numbers of pixels used in general are shown below:

CCD Sensor:
640 (horizontal)×480 (vertical), 1000 (horizontal)×1000 (vertical), 2000 (horizontal)×2000 (vertical);
EB-CCD Sensor:
640 (horizontal)×480 (vertical), 1000 (horizontal)×1000 (vertical), 2000 (horizontal)×2000 (vertical);
TDI Sensor:
1000 (horizontal)×100 (vertical), 2000 (horizontal)×500 (vertical), 4000 (horizontal)×1000 (vertical), 4000 (horizontal)×2000 (vertical); and
EB-TDI Sensor:
1000 (horizontal)×100 (vertical), 2000 (horizontal)×500 (vertical), 4000 (horizontal)×1000 (vertical), 4000 (horizontal)×2000 (vertical).

The numbers of pixels listed above are merely exemplary, and intermediate values between the foregoing numbers of pixels, or larger numbers of pixels can be used as well. While the TDI sensor and EB-TDI sensor typically integrate (scan) in the vertical direction, they may have one pixel in the vertical direction (for example, 2000×1) if there are sufficient input signals. On the other hand, while the TDI sensor and EB-TDI sensor operate at line rates of 1 kHz to 1 MHz (moving speed in the integration direction), they are often used at 10 to 500 kHz. While the CCD sensor and EB-CCD sensor operate at frame rate of 1 to 1000 Hz, they are typically used at 1 to 100 Hz. These frequencies are selected to appropriate values depending on applications such as adjustments of the electro-optical system, observation of review, and the like.

When a sensor having a large pixel size is disposed in the vacuum chamber MC, a larger number of pins are required such as pins for transmitting sensor driving signals, control signals and output signals, common pins, and the like. For example, the number of pins can amount to approximately 100-500 in some cases. With the number of pins thus increased, difficulties are experienced in the connection with the feed through flange using a normal contact socket. Also, the normal contact socket suffers from a high insertion pressure which will exceeds 100 g/pin. If the insertion pressure exceeds 1 kg/cm² when a sensor package is fixed, the package can be damaged. For example, with a securing member for fixation of approximately 4 cm², a securing pressure must be limited to 4 kg/4 cm² or less. Assuming that there are 100 pins with a required insertion pressure of 100 g/pin, the securing pressure amounts to 10 kg, resulting in damages of the package. It is therefore important to use a connection socket which has a resilient member such as a spring for connection of the package with pins of the feed through flange. Such a connection socket incorporating a resilient member can be used with an insertion pressure of 5-30 g/pin, so that the package can be fixed without damages, and driving signals and output signals can be transmitted therethrough without problem. Also, when a sensor is used in vacuum, the emission of gas is problematic. Accordingly, a connection socket used therefor may be formed with a vent hole, the interior and periphery of which is plated with gold.

Generally, a sensor is placed in a ceramic package, where required wires are connected to wire pads of the ceramic packages by wire bonding or the like. The ceramic package has wires incorporated therein, and is provided with connection pins on the back surface thereof (opposite to the surface on which the sensor is mounted). The connection pins are connected to pins of a feed through flange by connection parts. Pins outside of the feed through flange (on the atmosphere side) are connected to a camera.

Figure 17:
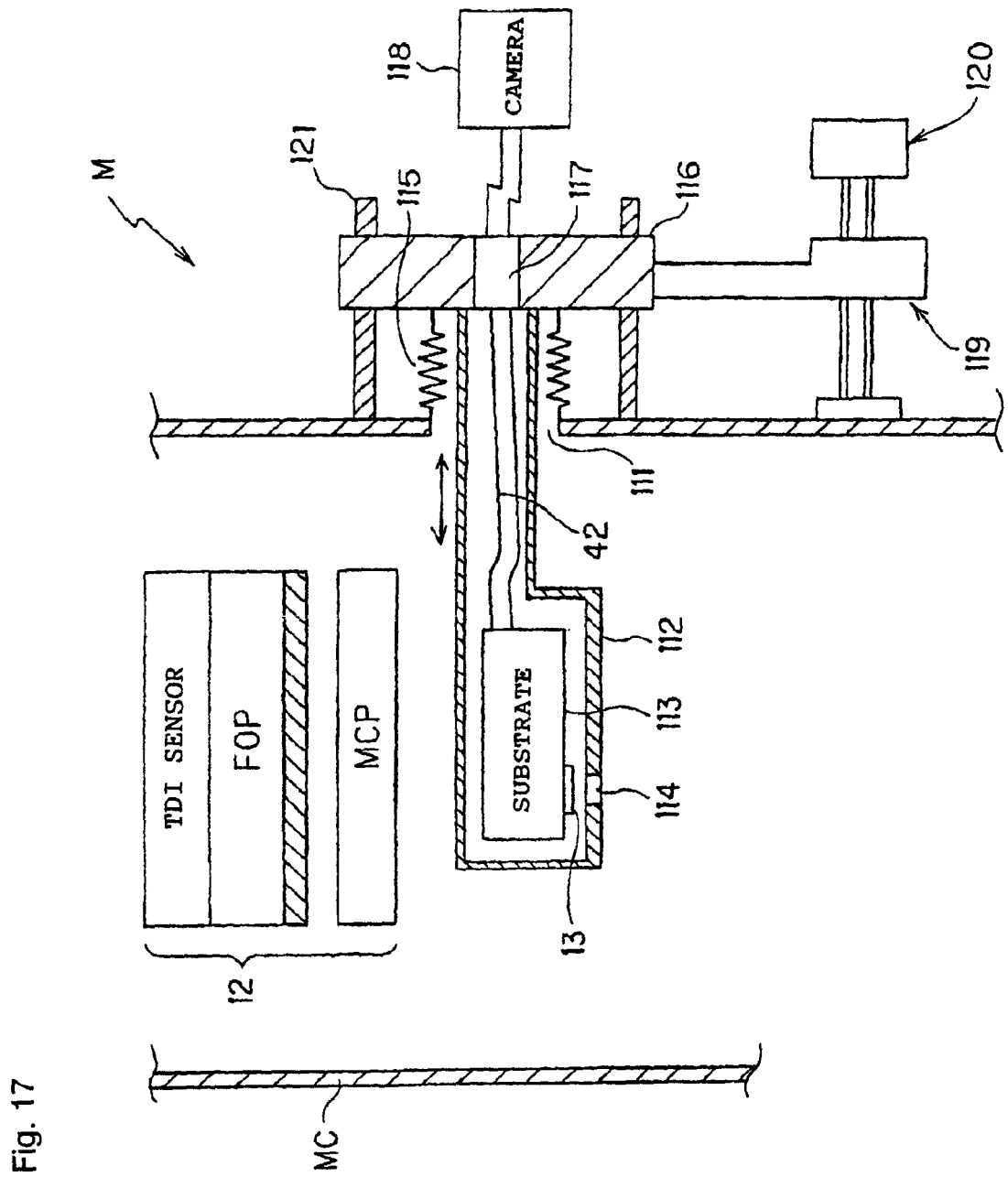
FIG. 17
A diagram showing an example of a moving mechanism for use in the inspecting apparatus according to the present invention.

Now, a description will be made on the moving mechanism M which is used in the embodiment so far described. FIG. 17 schematically shows the moving mechanism for translating the EB-CCD sensor 13. The moving mechanism M comprises a shield block 112 which is a cylindrical or hollow prism member extending through an opening 111 formed through a vacuum chamber MC at an appropriate position, and the EB-CCD sensor 13 and a circuit board 113 are provided in the shield block 112. The shield block 112 is formed with a shield hole 114 having a size similar to that of the EB-CCD sensor 13 or a size of approximately 0.5 to 1 mm, through which an electron beam is incident on the EB-CCD sensor 13. The shield hole 114 serves as a noise cut aperture for removing unwanted electrons. The shield block 112 is provided for preventing electron beams from impinging on insulated portions to cause charge-up to impede normal operations. In this regard, a preferable material for the shield block 112 is a metal such as titanium, phosphor bronze, aluminum or the like, or a non-magnetic material, in order to reduce the influence of a metal oxide film and sticking of contamination. Alternatively, aluminum plated with gold or titanium plated with gold may also be used for the shield block 112.

On end of the shield block 112 is coupled to a feed through flange 116 fixed to a bellows arranged to surround the periphery of the opening 111. Therefore, wires extending from the circuit board 113 are connected to a camera 118 through the feed through portion 117 of the feed through flange 116. The wires 42 are routed to pass through a hollow portion of the shield block 112, which is considered to prevent electron beams from impinging on the wires 42. This is because electron beams impinging on the wires 42 cause charge-up on the wires 42, resulting in adverse affects such as a change in the trajectory of the electron beams.

On end of the feed through flange 116 is coupled to a ball screw mechanism 119, and a rotary motor 120 or a rotary handle is connected to an end of the ball screw mechanism 119. Further, both ends of the feed through flange 116 are coupled to a guide rail 121 which extends from the vacuum chamber MC. As such, as the rotary motor 120 is actuated or the handle is turned, the ball screw mechanism 119 translates in a direction perpendicular to the wall surface of the vacuum chamber MC, and the feed through flange 116, in association therewith, moves along the guide rail 121, causing translations of the shield block 112 as well as the EB-CCD sensor 13 and circuit board 113 contained therein. As a result, it is possible to selectively create a scenario in which the electron beam is incident on the EB-CCD sensor 13, and a scenario in which the EB-CCD sensor 13 is moved such that the electron beam is incident on the TDI detector 12.

Figure 18:
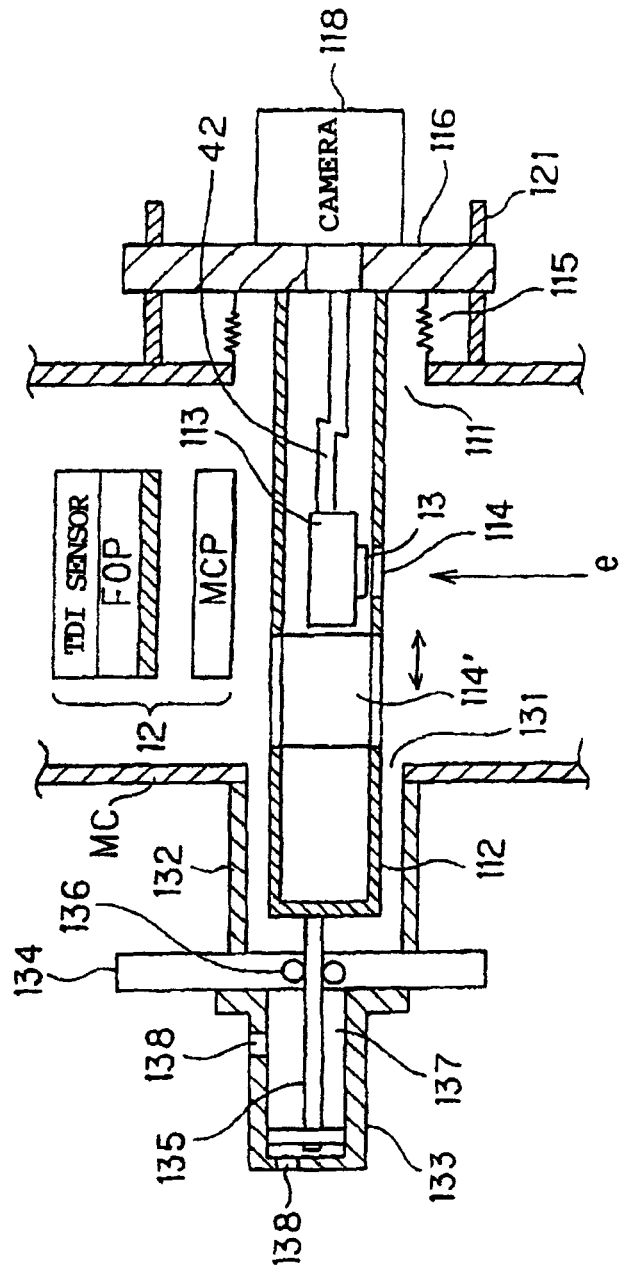
FIG. 18
A diagram showing another example of a moving mechanism for use in the inspecting apparatus according to the present invention.

Next, FIG. 18 schematically shows the configuration of a moving mechanism M for causing translations using an air actuator mechanism instead of the rotary motor. As described in connection with FIG. 17, the EB-CCD sensor 13 and circuit board 113 are disposed within the shield block 112 which passes through the opening 111 formed through the vacuum chamber MC at an appropriate position. The shield block 112 is formed with the shield hole 114 for causing the electron beam to be incident on the EB-CCD sensor 13. Also, one end of the shield block 112 is coupled to the feed through flange 116 fixed to the bellows 115 arranged to surround the periphery of the opening 111. The wires 42 extending from the circuit board 113 are connected to the camera 118 through the feed through portion 117 of the feed through flange 116. Further, a shield hole 114' is formed through the shield block 112 at an appropriate position for causing the electron beam to be incident on the TDI detector 12 when the EB-CCD sensor 13 is moved.

On the other hand, an opening 131 is also formed through a wall surface opposite to the opening 111, a hollow cylindrical member 132 is provided to surround the opening 131, and a flange 134 mounted with an air actuator mechanism 133 is fixed to one end of the cylindrical member 132. The air actuator mechanism 133 comprises a piston 135 coupled to an end of the shield block 112. The piston 135, which is vacuum shielded by an O-ring or omni-seal 136, is made movable relative to the flange 134. Also, the air actuator mechanism 133 comprises a hole 138 for introducing or exhausting compressed air into or from an air tight chamber 137 for moving the piston 135 to the left or right in the figure.

Thus, the air actuator mechanism 133 is actuated to introduce or exhaust compressed air into or from the air tight chamber through the hole 138 to move the piston 135 to the right, and simultaneously, the shield block 112 is moved in the same direction along the guide rail 121, causing the shield hole 114' to move to a position at which the electron beam is incident on the TDI detector 12. Conversely, for causing the electron beam to be incident on the EB-CCD sensor 13, the piston 135 may be moved to the left to place the shield hole 114 of the shield block 112 at a position on the optical axis of the electron beam. The air actuator mechanism 133 can be operated with air pressure of 0.1 to 0.5 MPa. For example, a pressure difference is generated on the piston 1335 by switching the introduction and exhaustion direction of the compressed air, for example, by an electromagnetic valve, to operate the air actuator mechanism 133. In this way, it is possible to selectively create a scenario in which the electron beam is incident on the EB-CCD sensor 13, and a scenario in which the EB-CCD sensor 13 is moved such that the electron beam is incident on the TDI detector 12.

Figure 19:
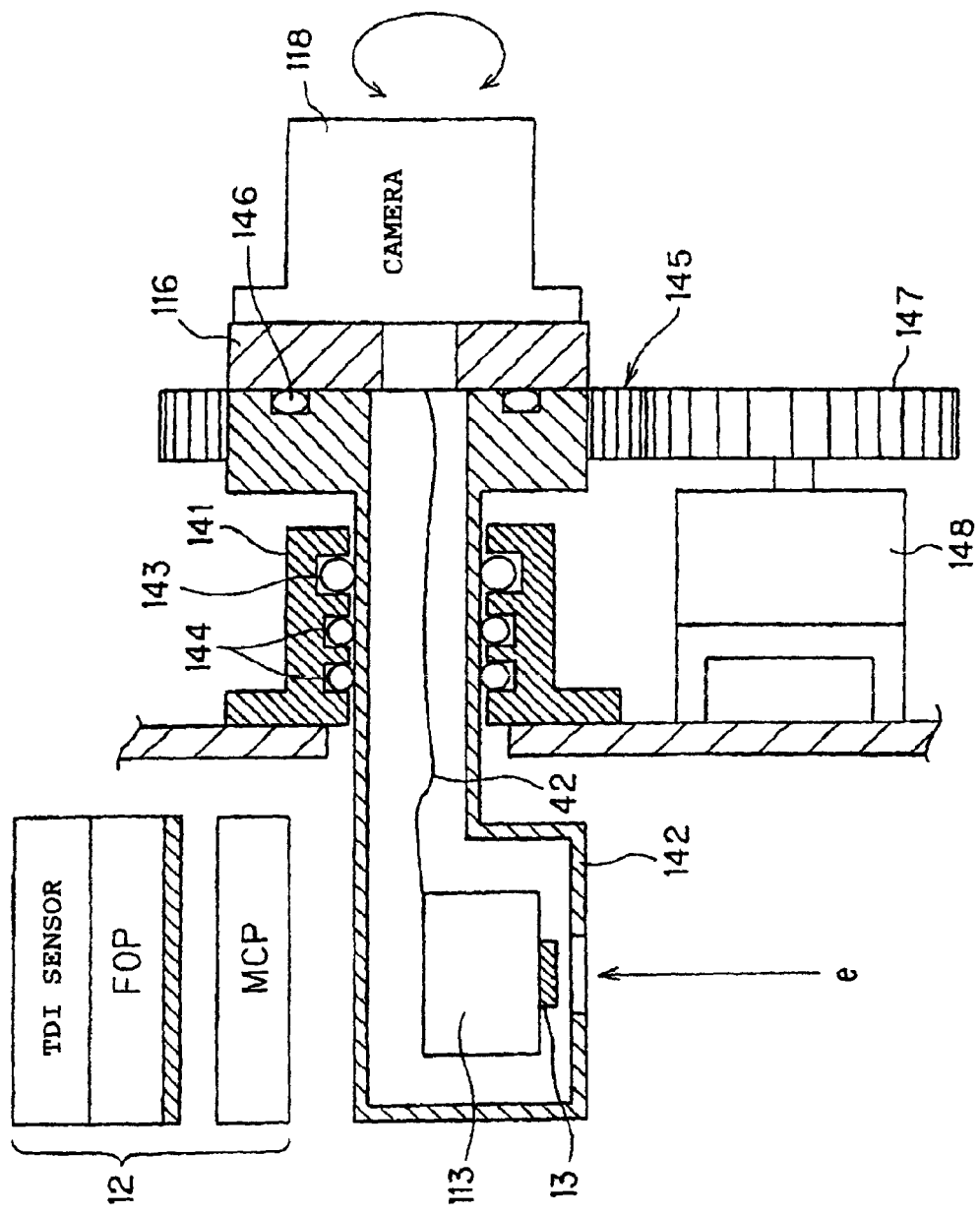
FIG. 19
A diagram showing a further example of a moving mechanism for use in the inspecting apparatus according to the present invention.

Further, FIG. 19 shows a moving mechanism which utilizes the rotation. An opening 111 is formed through the wall of a vacuum chamber MC at an appropriate position, and a cylindrical member 114 is protrusively arranged to surround the opening 111. A cylindrical shaft 142 is supported by a bearing 143 so as to be rotatable relative to the cylindrical member 141, and the cylindrical shaft 142 vacuum seals the cylinder member 141 with a sealing member 144. An omni-seal is a sealing member made of Teflon, and is effective for the sealing member 144 which involves movements such as rotation, translation and the like, because of its small coefficient of dynamic friction. Also, the use of the bearing 143 can stabilize the rotation of the cylindrical shaft 142, and keep fluctuations of the axis of rotation small.

An EB-CCD sensor 13, a circuit board 113, and wires 42 are disposed in the cylindrical shaft 142. The cylindrical shaft 142 has a flange-shaped end, and a gear 145 is fitted on the periphery of the cylindrical shaft 142. A feed through flange 116 is attached to the flange through an O-ring or ICF vacuum sealing structure 146, and a camera 118 is connected to the feed through flange 116. In the ICF vacuum seal structure, a sealing member for ICF is used for vacuum sealing. The wires 42 within the cylindrical shaft 142 are connected to the camera 118 by way of a plurality of pins of the feed through flange 116 for connection.

A gear 147 is provided in correspondence to the gear 145 fitted on the flange at the end of the cylindrical shaft 142. The gear 147 is driven by a rotary actuator 148. Thus, as a rotating shaft of the rotary actuator 148 rotates, the gear 147 rotates, causing the gear 145 to rotate. A rotating angle of the gear 145 can be adjusted by the rotary actuator 148, so that the actuator can be used with a desired defined angle such as 90 degrees, 180 degrees and the like. For example, assuming that the gear ratio is at 1:1, the rotating angle of the rotary actuator 148 may be 90°. In this way, by rotating the rotary actuator 148 by 90°, the electron beam can be selectively incident on any of the EB-CCD sensor 13 and TDI detector 12.

A description has been so far made, centered on the detectors, on its configuration and mechanisms for selective usage thereof. In the following, the general configuration of an inspecting apparatus comprising such a detector will be described, including an electro-optical system, with reference to FIGS. 20 to 23. In these figures, a detection unit DU is provided with any of the first to twelfth embodiments, and an electro-optical system is provided at the preceding stage to the detection unit DU. The detection unit DU preferably has the ability to form a two-dimensional image. For this purpose, it is necessary to employ a detector which receives an electron beam representative of a two-dimensional electron image to form a two-dimensional image. As previously described, there are a detector which employs an EB-CCD sensor and/or an EB-TDI sensor on which electrons are directly incident, and a detector which detects light converted from incident electrons using a CCD sensor and/or a TDI sensor.

Figure 20:
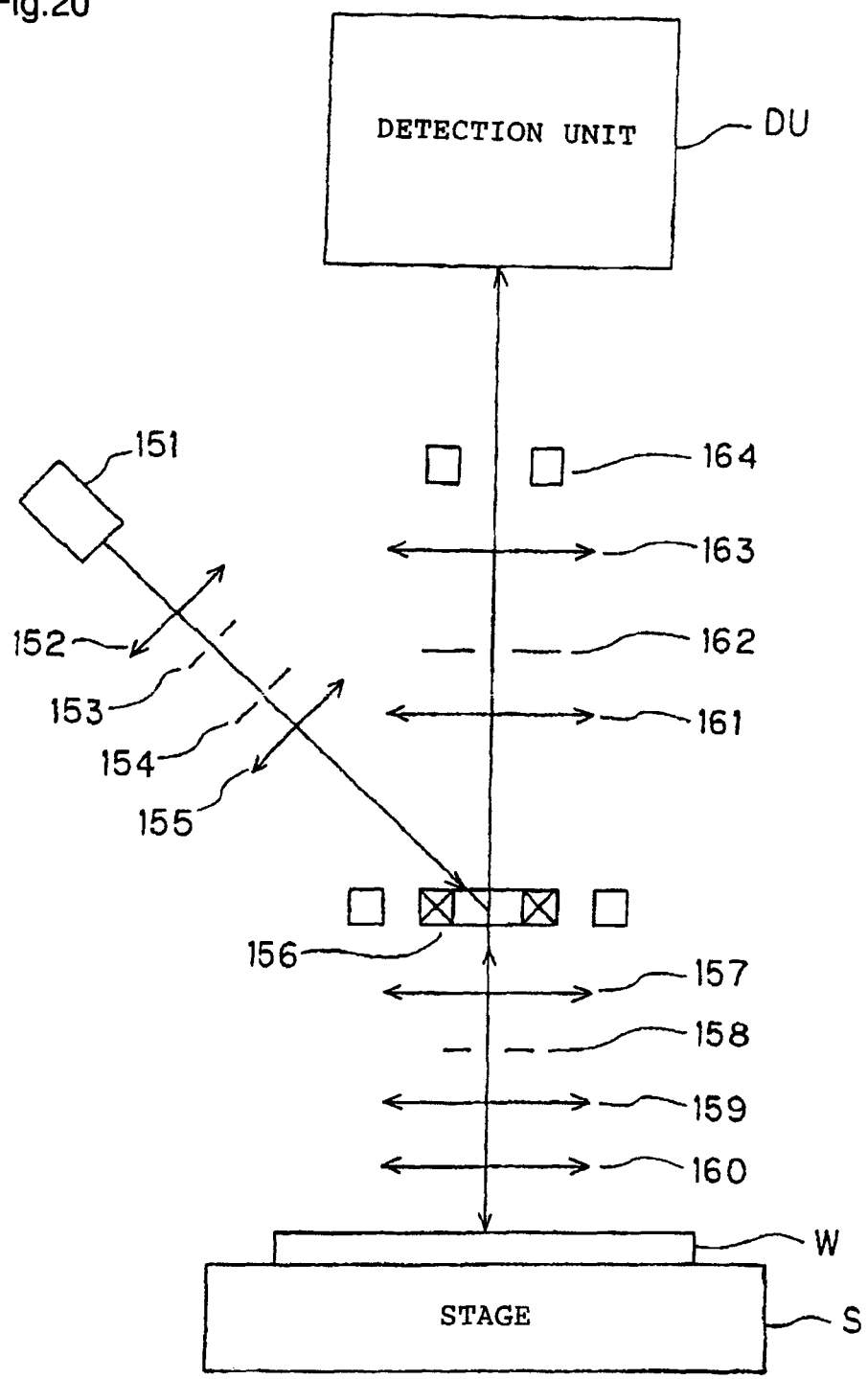
FIG. 20
A diagram showing a first example of the general configuration of an inspecting apparatus according to the present invention.

First, an inspecting apparatus shown in FIG. 20 is an example which is combined with a detection unit which includes an electron source, a projection optical system, and a plurality of detectors. A primary electron beam emitted from an electron gun 151 passes through a lens 152, an apertures 153, 154, and a lens 155 in this order, and is incident on an ExB filter 156. The primary electron beam, which travels in a direction deflected by the ExB filter 156, passes through a lens 157, an aperture 158, and lenses 159, 160, and is irradiated to the surface of a wafer W carried on an XYZθ stage S. The wafer W is, for example, an Si wafer of 300 mm diameter, which is formed thereon with a pattern structure in the middle of a semiconductor circuit manufacturing process. The stage S can move in three orthogonal directions, X-, Y-, Z-directions, and rotate in a θ-direction, and the wafer W is fixed on the stage S by an electrostatic chuck.

Electron beams emitted from the surface of the wafer W represents a two-dimensional electron image which reflects the shape of patterns formed in the surface of the wafer. The electron beams emitted from the wafer W pass through the lenses 160, 159, aperture 158, and lens 157, and travels straight, without being bent by the ExB filter 156, pass through a lens 161, an aperture 162, a lens 163, and an aligner 164, and is introduced into the detection unit DU. The electron beams thus introduced into the detection unit DU are incident on a detector selected from a plurality of detectors which have been described in the first to twelfth embodiments. The apertures 158, 162 perform noise cut operations.

It should be noted that voltages applied to the respective lenses are set to meet conditions for focusing the emitted electrons at a predefined magnification. Also, focus adjustment, distortion adjustment, aligner adjustment, aperture position adjustment, and ExB condition adjustment are performed as optical axis adjustments. The lenses 157, 159 are tablet lenses which are dual telecentric and accomplish low aberration and low distortions. This lens system can provide magnification of 5-1000 times. Distortions are corrected by a stig (not shown), and conditions for adjustment have been periodically calculated using a reference wafer. For adjusting the positions of the aligner and aperture, previously found values are used for a predefined magnification to be used, and ExB is adjusted using a voltage of the electron source 151, i.e., a value previously found for the energy of the primary electron beam.

When a wafer has a pattern of oxide films and/or nitride films, an optical correction for distortions alone is not sufficient, so that evaluation points are sampled from a captured image to evaluate shifts in position for correcting distortions. For example, the wafer may be compared with CAD data or review SEM image for evaluation with respect to the horizontal degree, vertical degree, coordinate position, and the like. Subsequently, an inspection can be made for defects on a die-to-die or a cell-to-cell basis or the like. IN the die-to-die inspection for defect, an inspection area is set within a die, and captured images of the same inspection areas from other dies are compared to determine the presence/absence and type of defects.

It should be noted that electron beams emitted from the wafer W may be any of secondary electrons, reflected electrons, back scattered electrons, and Auger electrons. Since these electrons differ in energy from one another, an electron image can be captured by selecting focusing conditions with the energy of desired electrons. Voltage conditions for focusing can be previously calculated through simulations or the like.

The detection of the image of the wafer W in the detection unit DU involves first moving the stage S such that a predetermined position of the wafer W can be detected, and next detecting a viewing field corresponding to a magnification at that position, for example, an image of an area of 200×200 μm at a magnification of 300 times. By repeating this operation at high speeds, a plurality of positions are detected on the wafer W. Likewise, a comparison of images involves repetitions of operations for moving the stage S to allow the detection unit DU to detect a desired area on the wafer W and capturing an image, and comparing captured data with one another. Through such an inspection process, it is possible to determine the presence/absence of defects such as debris, defective conduction, defective pattern, missing pattern and the like, determine the states of the defects, and classify the defects.

An example of specific operation conditions for the inspecting apparatus shown in FIG. 20 is listed below.

Pressure within Vacuum Chamber MC during Operation: $1\times10-1\times10-4$ Pa;

Stage Moving Speed: 0.1-100 mm/s;

Wafer Irradiated Current Density: $1\times10-5-1\times10-1$ A/cm$_2$;

Size of Irradiated Electron Beam: Ellipse of 500×300-10×5 μm;

Magnification: 10-2000;

Amount of Electrons Incident on Detection Unit: 10 pA-1 mA; and

Energy Incident on Detection Unit: 1-8 keV.

The irradiated current density is controlled by feeding back the output of the detection unit DU. When the outputs of the CCD detector and TDI detector are controlled to fall within 50-80% of their saturation values, they can be used within a range in which the input/output relationship of these detectors can maintain the linearity (i.e., a range in which a shift in linearity is 3% or less), so that images can be highly accurately evaluated. Particularly, with the performance of shading processing for subtracting background noise, or the like, the processing effect is low, and pseudo effects can occur to the contrary in a region with low linearity. Alternatively, the irradiated current density can be controlled using an image evaluation value by an image processing system or the like, instead of the output of the detection unit DU. The control of the irradiated current density using the contrast, maximum luminance, minimum luminance, average luminance, and the like of an image is effective in capturing stable images. It is also possible to perform stable image comparisons by standardizing the luminance and contrast of images to be compared, i.e., under the same conditions.

Figure 21:
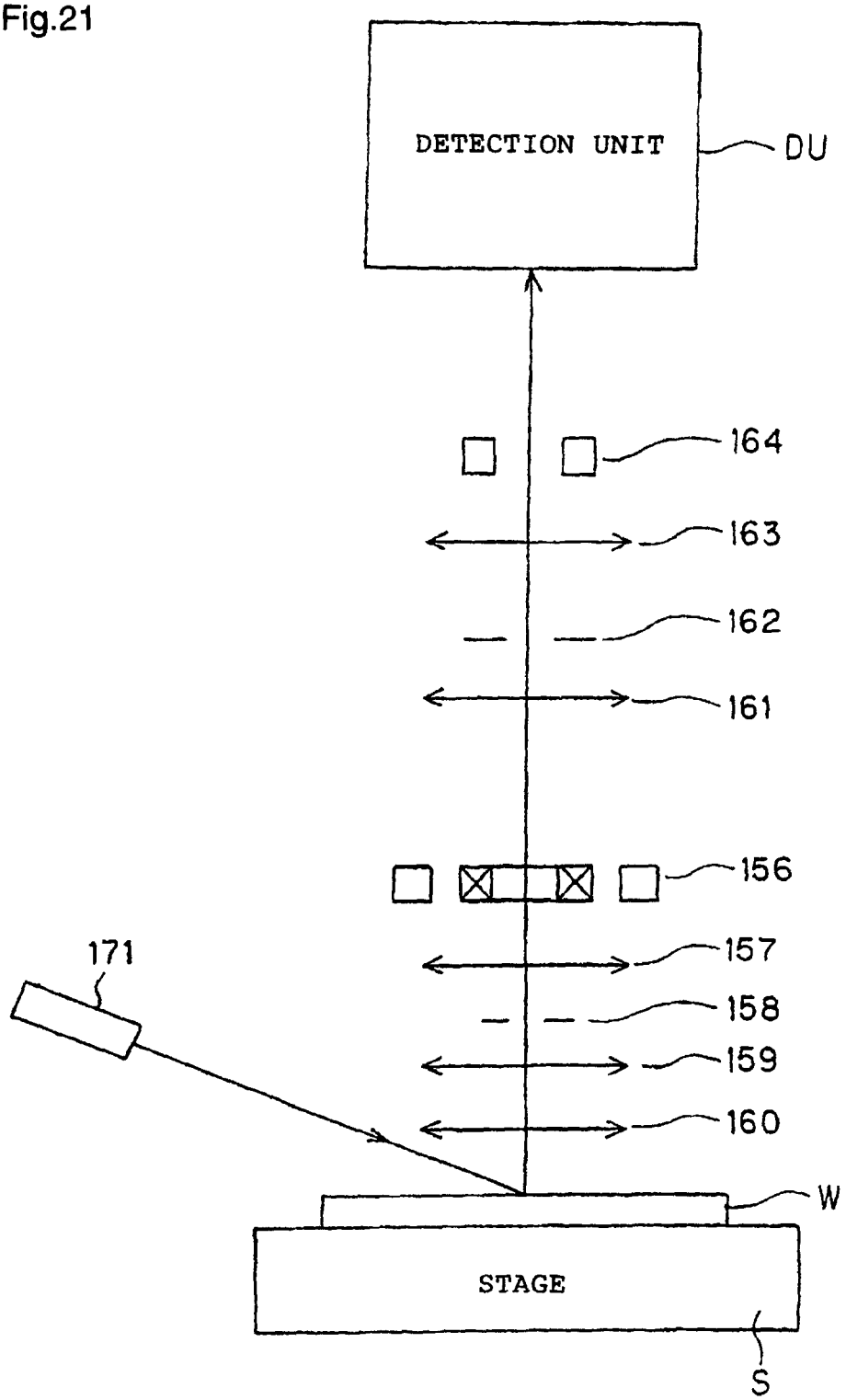
FIG. 21
A diagram showing a second example of the general configuration of an inspecting apparatus according to the present invention.

FIG. 21 shows an example which is configured to use one of UV light, UV laser light, and X-ray instead of an electron beam in the inspecting apparatus described in FIG. 20. Specifically, an UV light source 171 is provided, for irradiating a wafer W with UV light, by way of example, instead of the electron gun 151, lenses 152, 155, and apertures 153, 154. In this way, the UV light is incident on the surface of the wafer W as a primary beam, and optical electrons emitted from the wafer W are enlarged by a lens, an aperture or the like of an illustrated electro-optical system, and directed into a detection unit DU which detects an image of patterns on the wafer W.

The UV light from the UV light source 171 is actually transmitted to the wafer W through a hollow fiber, and is irradiated to a viewing field region near the center of the wafer W, for example, in a region of 300 μm diameter. In this regard, the X-ray or UV laser light may be used as a primary beam in a similar manner, where optical electrons emitted from a wafer W irradiated therewith can be utilized to capture an electron image of patterns on the wafer W.

Figure 22:
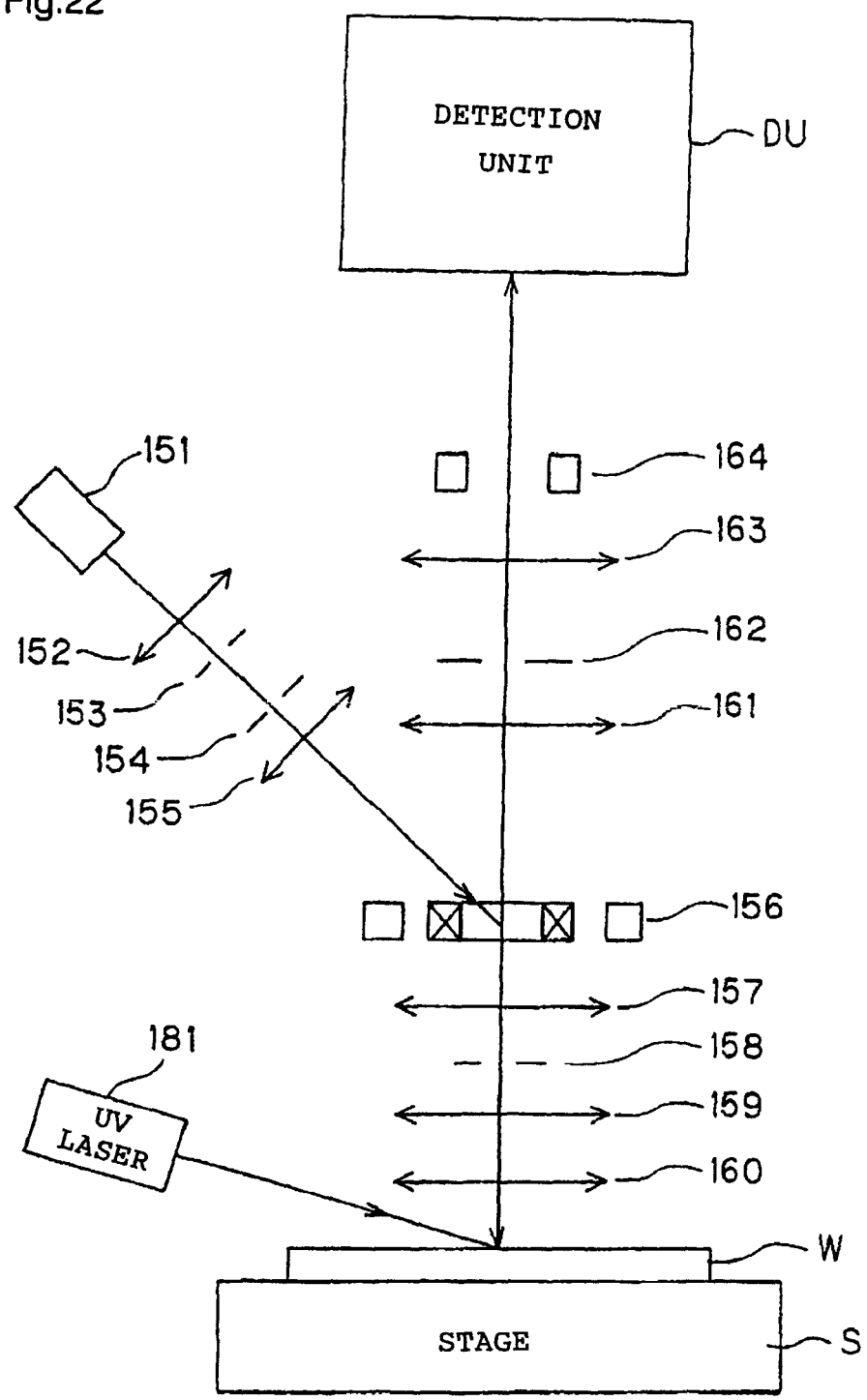
FIG. 22
A diagram showing a third example of the general configuration of an inspecting apparatus according to the present invention.

FIG. 22 in turn shows an example which employs in combination a primary electron beam from an electron gun 151, and UV laser light from a UV laser source 181 for irradiating the surface of a wafer W with the two types of beams. In this example, as will be understood from the descriptions made in connection with FIGS. 20 and 21, the primary electron beam emitted from the electron gun 151 is deflected by an ExB filter 156 to travel along the optical axis of an electro-optical system, and is irradiated to the wafer W. Electron beams emitted from the wafer W travels straight through the electro-optical system. The UV laser used in combination with the primary electron beam is also incident on the surface of the wafer W as a primary beam, and optical electrons emitted therefrom are enlarged by a lens, an aperture and the like of the illustrated electro-optical system, and are directed into a detection unit DU which detects an image of patterns on the wafer W. The UV laser light used herein may be a four-time wave of YAG or exima laser light which is introduced to the surface of the wafer W through a hollow fiber.

In the inspecting apparatus so far described in connection with FIGS. 20 to 22, the lens 160 operates as a control electrode. When the wafer W includes a number of oxide films and/or nitride films, the wafer W irradiated with an electron beam readily results in charge-up on the oxide film or the like on the surface. This will cause the trajectory of electron beams emitted from the surface of the wafer W to curve, or a discharge to occur between the wafer W and an electrode, for example, the lens 159 or the like. This influence is particularly grave in the projection optical system shown in FIGS. 20 to 22. This is because electron beam impinges on a wider region at one time, as compared with a SEM scheme, due to a rectangular or oval shape of the irradiated electron beam. In the SEM scheme, since converged electron beams are scanned, the charge-up is mitigated, resulting in a relatively small amount of charge-up. However, for the reason set forth above, the projection optical system is more susceptible to charge-up and largely affected thereby.

A discharge occurs between the wafer W and the lens 159 because a potential on the lens 160 is relatively low and can be freely changed, whereas the lens 159 is applied with a high voltage in the range of 15 to 30 kV which cannot be varied. In this event, a lens electric field distribution on the surface of the wafer W is determined by the voltage applied to the lens 159, and a voltage applied to the wafer W (for example, −3 kV), for example, 1-3 kV/mm. Therefore, the lens 160 is used to adjust the electric field distribution on the surface of the wafer W by adjusting the voltage applied to the lens. By adjusting the voltage of the lens 160, the electric field distribution on the surface of the wafer W can be adjusted in the range of 0.1 to 1 kV/mm, thus restraining the discharge. This is because, by debilitating the positive electric field distribution, an initial acceleration of electrons emitted from the surface of the wafer W can be reduced, i.e., an emitted electric field strength can be debilitated, to reduce the emission of electrons which contribute to the discharge.

Actually, it is thought that electrons are more likely to be emitted at corners and in regions with high electric field strength. For example, assuming that an insulating film is positively charged up, and a miniature plug structure electrically conducted to a lower layer exists below the insulating film, the plug is at a substrate potential (for example, −3 kV), with the surrounding insulator positively charged up. When the surface of the plug has a diameter of 100 nm, and the charge-up is +10 V, the average electric field strength of the plug is calculated to be 100 kV/mm. Further, if the electric field strength increases in fine gaps and asperities in a boundary region between the plug and the insulator beyond $10^8$-$10^9$ V/mm, by way of example, electrons will be emitted, causing a discharge to readily occur.

Figure 23:
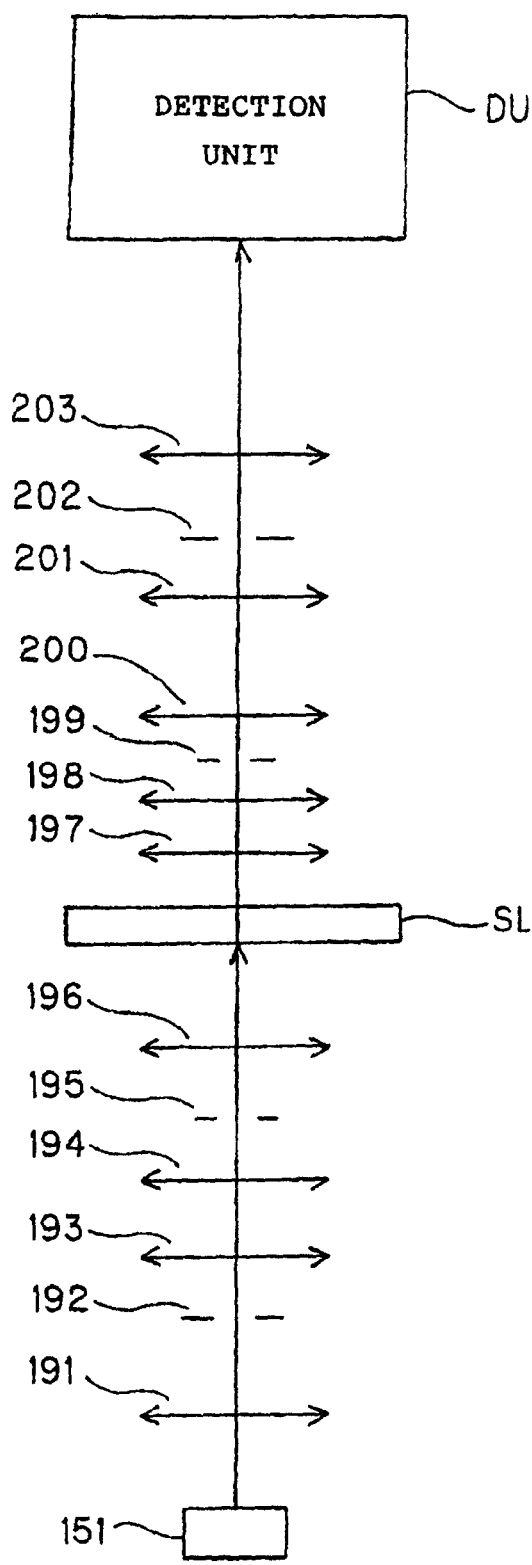
FIG. 23
A diagram showing a fourth example of the general configuration of an inspecting apparatus according to the present invention.

Next, FIG. 23 shows an example off a transmission-type inspecting apparatus. While the inspecting apparatus shown in FIGS. 20 to 22 irradiates a wafer with an electron beam, UV light, or UV laser light to use electrons emitted from the wafer, the inspecting apparatus shown in FIG. 23 inspects a sample utilizing electrons which are generated by an electron beam that has transmitted a sample. Specifically, an electron beam emitted from an electron gun 151 passes through a lens 191 and an aperture 192 to control the angle of electrons and the amount of electrons incident on zoom lenses 193, 194. An incident angle to the aperture 195 is controlled by these lenses. The electron beam, which has been adjusted for the amount of electrons by the aperture 195, is made parallel with the optical axis by a lens 196, and irradiated to a sample SL. By adjusting voltages applied to the zoom lenses 193, 194, the zooming magnification is change, for example, from one to 200 times, and the size of the electron beam irradiated to the sample SL is controlled to have the diameter, for example, in the range of 5 to 1000 μm.

The electron beam which has passed through or transmitted the sample SL is enlarged by a secondary optical system which comprises lenses 197, 198, 200, 201, 203, and apertures 199, 202, and is introduced into a detection unit DU. The lens 197 comprises an electrode for adjusting the electric field strength with the sample SL. The lenses 198, 200 are doublet lenses and satisfy dual centric conditions, and therefore provide electron images with low aberration. The lenses 201, 203 are lenses for enlarging an electron image. The lens 203 is adjusted such that the electron beam is focused on the sensor of the detection unit DU, the fluorescent plate, or the surface of the MCP. The apertures 199, 202 control aberration and the amount of electrons introduced into the detection unit DU.

The sample SL can be any arbitrary item such as an exposure mask, a stencil mask, a micro-machine having a miniature structure, MEMS parts and the like, in addition to a semiconductor wafer and a semiconductor device. It is necessary to adjust the energy of the electron beam irradiated to the sample in accordance with the characteristics of each sample, such as the material, pattern shape, and the like of the sample SL. For permitting the electron beam to transmit the sample SL, high energy is required, and can be 50-100 keV in some cases. With a sample SL having openings such as holes, slits and the like, and/or interstices, for capturing electron beams which have passed through such openings and interstices, the electron gun 151 is required to generate electrons of 10-10000 eV. For example, assume that a sample SL is irradiated with an electron beam having energy of 5 keV, generated from the electron gun 151. In this event, assuming that the potential of the sample is −4 kV, the electron beam is incident on the sample SL at 1 kev. The electron beam which has passed through the sample SL reflects patterns on the sample SL, and is introduced into the detection unit DU.

Figure 24:
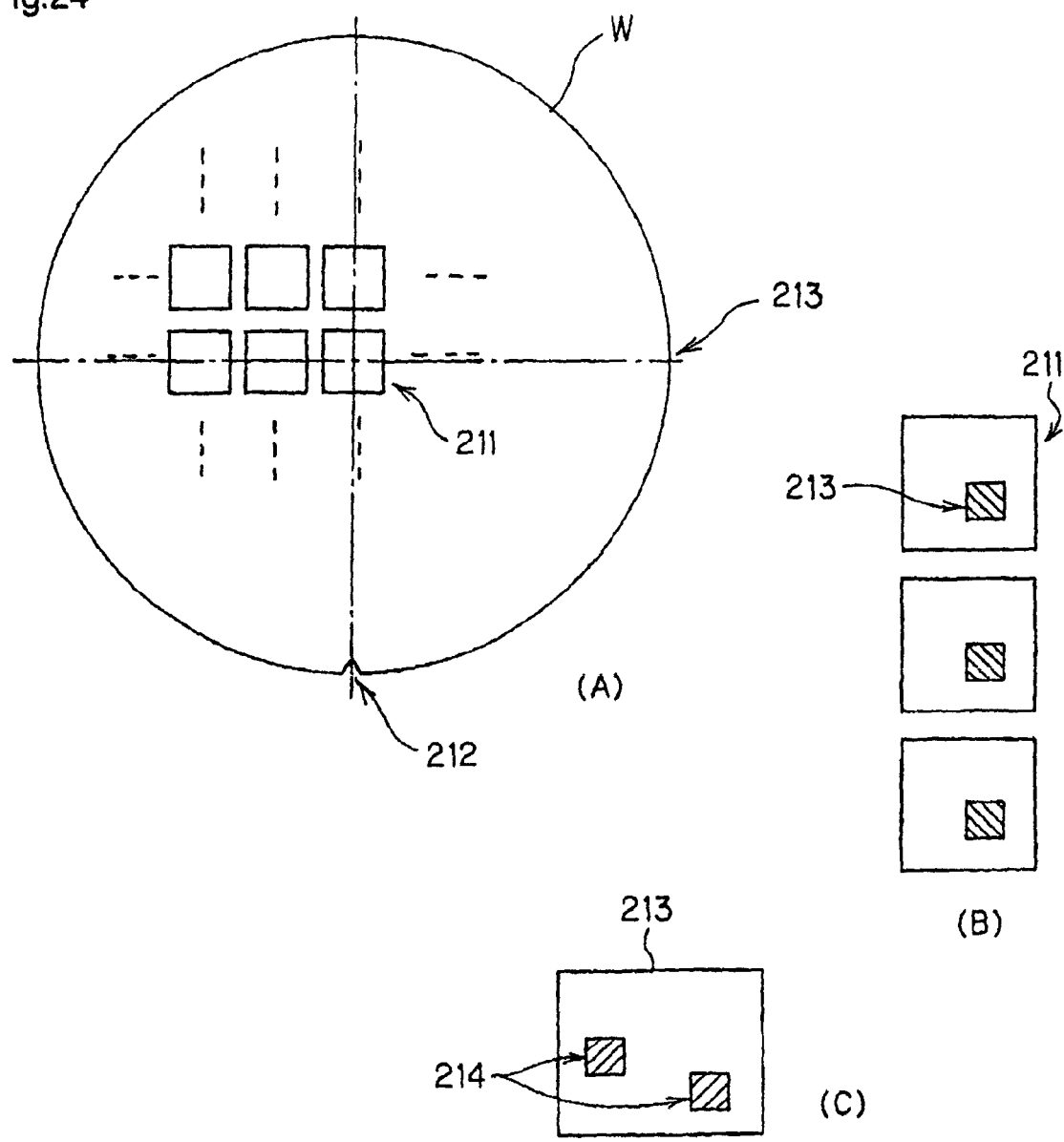

In the inspecting apparatus which has been described above with reference to a variety of embodiments, the CCD sensor or EB-CCD sensor is used to capture a still image, and adjustment of beam axis, observation of sample, inspection for defects, capturing of review image, review observation, measurement, and evaluation can be performed utilizing a step-and-repeat function. In the following, the step-and-repeat function will be described with reference to FIG. 24. FIG. 24(A) schematically shows the positional relationship between a wafer W and a plurality of dies 211. As shown, a notch 212 is formed in a right-hand region. The dies 211 include a plurality of patterns, classified into a cell pattern area and a random pattern area, and therefore, a plurality of types of cells and random pattern areas exist. The size of the dies is generally on the order of 1×1 mm to 30×30 mm, though it depends on a wafer of a process.

As shown in FIGS. 23(B) and 23(C), a care pattern 213 refers to a pattern portion for which an inspection, a measurement, or an evaluation is desired, within such a pattern, and a particular site 214 refers to a portion which should be particularly noted. The particular sites include, for example, a site which is highly likely to become defective during a process period due to difficulties in processing because of a small pattern size, a defective site after an inspection for defects, a site which is evaluated for a shift in position with an underlying lager in a lamination process, a turn site for evaluating distortion and aberration of the electro-optical system, and the like. For the particular sites as listed above, the step-and-repeat is performed using a CCD sensor or an EB-CCD sensor to compare required images, evaluate shifts, to observe details, and so on.

For inspecting a care area in a cell portion for defects, patterns are compared with one other in repeated pattern areas in the cell portion. For example, a viewing field of 5×5 to 500×500 μm on a sample surface can be observed in a capturing time of 10 to 100 minutes with a magnification of approximately 50 to 1000. As one still image (CCD image or EB-CCD image) has been captured, the observation area is moved by a predefined distance to capture the same pattern in a similar manner. With repeated patterns, the next one of successive patterns is captured. In this way, a plurality, generally, three or more, of the same patterns are captured, and the captured images are compared with one another. As the result of the comparison, if there is only one different pattern or contrast, or the like, this part is regarded as defective. Such an inspection is made simultaneously with the image capturing (on-line), or after capturing inspected images (off-line), to classify the coordinates and types of defective sites.

For inspecting random patterns for defects, random patterns in care areas of each die are compared with one another. In this event, a care area of a random pattern is captured on one die. This may be performed using any of an approach for capturing a plurality of still images at one time and an approach for capturing one by one. Next, the inspecting apparatus is moved to a random pattern in a care area of another die for capturing. By thus capturing three or more still images, comparing corresponding patterns with one another, and finding an failure which exists only on one image, defective patterns, debris, defective contrast, and the like are sensed. With this inspection, the coordinates of defects and the type of defects can be classified on-line or off-line. This is referred to as a die-to-die inspection based on step-and-repeat.

Otherwise, the inspecting apparatus may be used to evaluate a positional shift with an underlying layer in a process. In this event, alignment marks are placed on an underlying layer and an overlying layer laminated thereon. A positional shift is evaluated by measuring a degree to which these alignment marks overlap, for example, a shift of the position of center of gravity, a shift of the centers of representative lengths from one another, and the like. This evaluation is made after CMP in a wiring structure for the underlying layer, and after the formation of resist, or after resist covering and exposure for the overlying layer.

Figure 25:
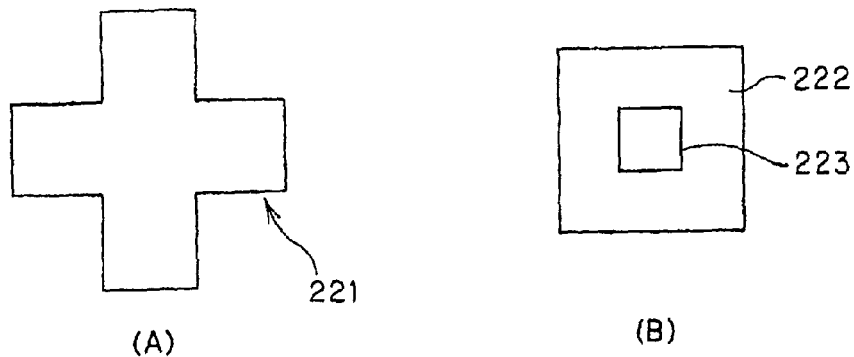

Examples of alignment marks are shown in FIG. 25. (A) shows a cross-shaped alignment mark, arranged on an overlying layer and an underlying layer, which comprises two rectangle of 15 μm long placed one on the other to appear as a cross shape. Based on how these alignment marks overlap, the amount of shift is found for a representative position such as a pattern center position or the like, calculated from the positions of the centers of gravity of the underlying layer and overlying layer, and the vertical and horizontal lengths to compare the overlying and underlying layers. (B) shows a square alignment mark 222 having a side of 20 μm attached to an underlying layer, and a square alignment mark 223 having a side of 7 μm attached to an overlying layer, which overlap one on the other. Likewise, in this event, a positional shift is evaluated by calculating the center position of the mark from a sift of the positions of the centers of gravity, and a die row length. In this regard, the size of the alignment marks is not limited to the values shown in FIG. 25, but an alignment mark of a smaller size may be used, for example, a total size of 1×1 μm.

10-50 of such alignment marks are attached to one wafer. A shift amount is calculated for each alignment mark, and if there is a relative directivity in the shift amount (for example, when a larger shift is found generally in the left-hand direction), the exposure position is adjusted to make a correction therefor. In this way, with the use of the step-and-repeat function, the CCD sensor or EB-CCD sensor provides a higher resolution and MTF, as compared with the TDI detector. When images can be captured in a situation in which a large number of electrons can be captured per pixel, inspection for defects, review inspection, position shift inspection can be performed with high accuracy, taking advantage of the characteristics of the CCD sensor and EB-CCD sensor.

As described above, the inspecting apparatus according to the present invention can use the CCD detector 11 and TDI detector 12 by switching one to the other, and therefore provides advantages as described below.

First, the CCD detector 11 using the CCD sensor or EB-CCD sensor can be used to capture a still image, while the TDI detector 12 using the TDI sensor or EB-TDI sensor can be used to capture sequential images by capturing images while moving the stage device. For switching these detectors to selectively capturing a still image and sequential images, the axes of the sensors used in the respective detectors must be in alignment. It is also necessary that the lens conditions (intensities of the lenses, beam deflection conditions, and the like) are the same when the CCD detector 11 is used and when the TDI detector 12 is used. Further, the primary optical system and secondary optical system must operate under the same conditions. In this regard, the sensors of the respective detectors can be corrected for a relative positional shift of their axes by comparing images captured by the sensor of the CCD detector 11 and the sensor of the TDI detector 12.

Describing the operation in the inspecting apparatus according to the present invention in a specific manner, first at step 91, the CCD detector 11 is placed in front of the TDI detector 12 to capture a still image to align the primary optical system to the secondary optical system. Next, after the secondary optical system is adjusted (for example, the size, magnification, and contrast of secondary beams, centering of lenses), the size and current density distribution of the primary beam are adjusted. Subsequently, at step S2, the CCD detector 11 is moved to direct secondary electron beams into the TDI detector 12, thereby capturing sequential images to ensure sample inspection images. Further subsequently, at step S3, the CCD detector 11 is removed and placed in front of the TDI detector 12 to capture a review image which is then compared with the inspection images captured by the TDI detector 12 to determine whether a defective site confirmed in an inspection image captured by the TDI detector 12 is a false defect or a true defect.

It should be noted that in general, the aforementioned step S1 is performed only for the first one of a plurality of wafers accommodated in a cassette, while steps S2 and S3 are performed for the second wafer onward. However, for confirming the stability of the inspection, step S1 may be performed on a periodic basis.

As described above, since still images can be captured by the CCD detector 11, the optical system can be adjusted by attaching a standard chip at an arbitrary end of the stage device, without the need for transferring a wafer. In other words, a still image of the standard chip can be captured while a wafer is being loaded, to confirm the reproductivity of the primary beam, secondary beam, and electron beam (free of variations). When a difference is found by confirming a difference between the image of the standard chip and the image of the wafer, no inspection is performed on the assumption that chucking conditions of the electrostatic chuck have varied. It is also possible to check variations in the current density of the primary beam and the beam size.

The size, position, and profile of the primary beam are adjusted with reference to the image captured by the CCD detector 11 at the aforementioned step 91. Also, when variations in these parameters exceed a certain basis, the electron gun or FA (aperture plate) is replaced. In a process of aligning the primary beam to the secondary beam, an image of low magnification, for example, 30 times, 80 times or the like is used. However, since the secondary beam locally impinges on MCP when a low-magnification image is captured, the MCP is locally damaged, resulting in a failure in detecting defects. Accordingly, the MCP must be replaced when an observation time at low magnifications has exceeded a certain time (for example, 1000 hours). On the other hand, the EB-CCD sensor can be used for a long term because it is not particularly damaged by the irradiation of the electron beam.

Also, the secondary beam is aligned with reference to the image captured by the CCD detector 11. For example, the centering of the lenses, optimization for operating conditions of the beam deflector (for example, the ExB separator 3 in FIG. 2) (for example, adjustments to conditions for projecting an image onto the center of the sensor) can be performed. In this way, highly accurate adjustments can be accomplished. For example, the MTF can be adjusted in the range of 30 to 50%. Also, by using the image captured by the CCD detector 11, it is possible to check fluctuations in the secondary beam, changes in stig condition, a shift of the center of lens, fluctuations in beam deflection conditions, and the like.

In regard to the image processing system (for example, the image processing unit 9 in FIG. 2), a step-and-repeat based inspection can be performed because a still image can be captured by the CCD detector 11. Also, since the detectors can be rapidly switched, an inspection can be performed after switching from the TDI detector 12 to the CCD detector 11 when the inspection involves a small number of points under inspection, such as an overlay inspection. Preferably, the TDI detector 12 is used for an inspection when the inspection speed is 10 MPPS (mega-pixel/sec) or higher, and the CCD detector 11 is used for an inspection when the inspection speed is 10 MPPS or lower. Also, since the sensor of the CCD detector 11 has been brought into alignment to the sensor of the TDI detector 12, the sensor of the CCD detector 11 need not be again aligned when a review image is captured at the aforementioned step S3.

By incorporating the inspecting apparatus according to the present invention into a factory network, operation situations such as axis adjustment, inspection, review and the like can be communicated to a manager through the factory network, thus permitting the manager to immediately know failures in apparatuses and defective adjustments and take appropriate actions therefor.

Now, an example of a semiconductor manufacturing method performed using the inspecting apparatus described above will be described with reference to flow diagrams of FIGS. 26 and 27. As shown in FIG. 26, the semiconductor device manufacturing method includes, as main processes, a wafer manufacturing process 231 for manufacturing wafers or a wafer preparing process for preparing wafers, a mask manufacturing process f236 or manufacturing masks and reticles for use in exposure or a mask preparing process for preparing masks, a wafer processing process 232 for performing processing required to the wafer, a chip assembling process 233 for cutting, one by one, chips formed on the wafer and making them operable, a chip inspecting process for inspecting chips manufactured in the chip assembling process, and a process for producing products (semiconductor devices) from chips which have passed the inspection. In this regard, since the wafer manufacturing process 231, wafer processing process 232, and lithography process $232_3$ are known, a description thereon is omitted here. These main processes are further comprised of several sub-processes, respectively.

A main process which exerts critical affections to the performance of resulting semiconductor devices is the wafer processing process. This process involves sequentially laminating designed circuit patterns on the wafer to form a large number of chips which operate as memories or MPUs. The wafer fabricating process includes sub-processes as shown in an area surrounded by dotted lines in the figure. Specifically, the wafer processing process 232 includes a thin film forming sub-process $232_1$ for forming dielectric thin films serving as insulating layers, metal thin films for forming wires or electrodes, and so on using CVD, sputtering and so on; an oxidation sub-process $232_2$ for oxidizing metal thin film layers and wafer substrate; a lithography sub-process $232_3$ for forming a resist pattern using masks or reticles for selectively fabricating the thin film layers and the wafer substrate; an etching sub-process $232_4$ for fabricating the thin film layers and the substrate in conformity to the resist pattern using, for example, dry etching techniques; an ion/impurity implantation/diffusion sub-process $232_5$; a resist striping sub-process; and an inspection sub-process $232_6$ for inspecting the fabricated wafer. As appreciated, the wafer processing process 232 is repeated a number of times equal to the number of required layers to manufacture semiconductor devices which operate as designed. By applying the inspecting apparatus according to the present invention to the inspection sub-process $232_6$, it is possible to inspect even a semiconductor device which has miniature patterns. Since a total inspection can be accomplished, it is possible to manufacture semiconductor devices which operate as designed to improve the yield rate of products and prevent defective products from being shipped.

Figure 27:
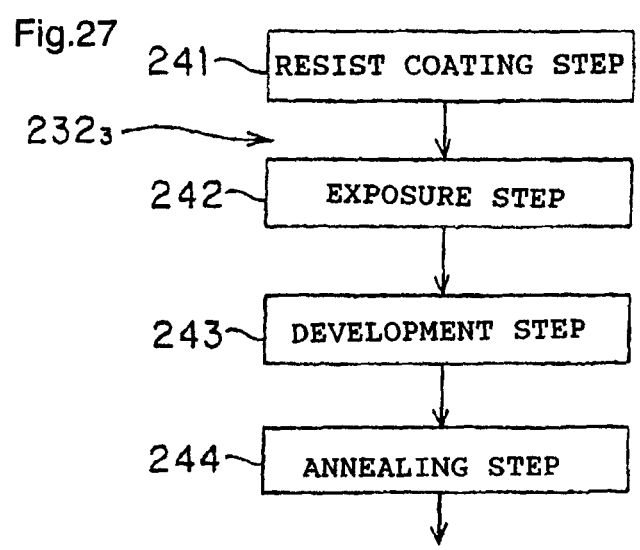
FIG. 27

FIG. 27 shows steps performed in the lithography sub-process $232_3$ in FIG. 26. The lithography sub-process $232_3$ includes a resist coating step 241 for coating a resist on the wafer on which circuit patterns have been formed in the previous process; a resist exposing step 242 for exposing the resist; a developing step 243 for developing the exposed resist to produce a resist pattern; and an annealing step 244 for stabilizing the developed resist pattern.

While the inspecting apparatuses according to the present invention have been described in connection with a variety of embodiments thereof with reference to the drawings, the present invention is not limited to such embodiments. For example, in the embodiments so far described, the sensors and electro-optical systems are disposed within the vacuum chamber, but the vacuum chamber is not necessarily used in an environment in which sensors such as the CCD sensor, TDI sensor and the like can operate.

Also, while the embodiments shown in FIGS. 3 to 7, FIG. 12, FIG. 14, FIG. 15, and FIGS. 17 to 19 uses the FOP at one stage, the FOP is not limited to one stage, but the FOPs can also be used at a plurality of stages. For example, it is possible to use two FOPs which comprise an FOP coated with a fluorescent agent for use in combination with MCP, and an FOP adhered to a TDI sensor and in close contact with the former FOP. In doing so, the assembly is improved in accuracy and efficiency. Specifically, if a FOP coated with a fluorescent agent is adhered to a TDI sensor, contamination and adhesive, if sticking to the fluorescent agent of the FOP, would be difficult to wash away. Also, when a fluorescent agent is coated after adhesion, a special process and technique will be required such that the fluorescent agent is not coated on the TDI sensor itself. Further, a high level of stringency is required for an assembling accuracy for the parallelism of the FOP coated with the fluorescent agent with an MCP and the like, so as not to affect the resolution and anti-discharge performance. Such intricacy is eliminated by the use of the aforementioned FOPs at two stages. This is true when a plurality of FOPs are used.

INDUSTRIAL AVAILABILITY

As will be understood from the foregoing description, the present invention relies on a moving mechanism or a deflecting means to select a detector which provides appropriate performance without requiring a work for changing one detector to another as before, thus making it possible to reduce a long time taken for the restoration of a vacuum state after the exposure to the atmosphere due to the change of the detector, and to efficiently perform works such as adjustments to certain electro-optical systems, sequential inspections, defect evaluation, and the like. Also, the present invention has a great significance in a technological and industrial sense such as the accomplishment of remarkable improvements on work efficiency, reduction in cost, higher performance of surface inspection, higher throughput, and the like.

The invention claimed is:

1. An inspecting apparatus comprising:
a plurality of detectors each for receiving an electron beam emitted from a sample to acquire image data representative of the sample; and
a switching mechanism for causing the electron beam to be incident on one of said plurality of detectors, wherein said plurality of detectors are disposed within the same vacuum chamber and wherein said switching mechanism comprises a deflector for selectively switching a traveling direction of the electron beam between one of said plurality of detectors and another one of said plurality of detectors, said one of said plurality of detectors being disposed at an angle with respect to an optical axis of said vacuum chamber and said another one of said plurality of detectors being disposed on said optical axis.

2. An inspecting apparatus as claimed in claim 1, wherein said one of said plurality of detectors comprises an EB-CCD sensor.

3. An inspecting apparatus as claimed in claim 2, wherein said EB-CCD sensor is operable to obtain 20-10000 electrons per pixel.

4. An inspecting apparatus as claimed in claim 1, wherein said another one of said plurality of detectors comprises any one of an EB-TDI sensor and a TDI sensor.

5. An inspecting apparatus as claimed in claim 4, wherein said TDI sensor is operable to obtain 10-1000 electrons per pixel.

6. An inspecting apparatus as claimed in claim 1, wherein said one of said plurality of detectors comprises an EB-CCD sensor and said another one of said plurality of detectors comprises any one of an EB-TDI sensor and a TDI sensor.

7. An inspecting apparatus as claimed in claim 6, wherein said EB-CCD sensor is operable to obtain 20-10000 electrons per pixel and said TDI sensor is operable to obtain 10-1000 electrons per pixel.

8. An inspecting apparatus as claimed in claim 1, wherein said electron comprises any one of a secondary electron, a reflected electron, a back-scattered electron and an Auger electron.

9. An inspecting apparatus as claimed in claim 1, wherein said electron comprises a photoelectron.

10. An inspecting apparatus as claimed in claim 1, further comprising a mapping optical system having a tablet lens which is dual telecentric.

11. An inspecting apparatus as claimed in claim 10, wherein said mapping optical system further comprises an ExB.

12. An inspecting apparatus as claimed in claim 1, wherein electrons emitted from the sample reach said plurality of detectors at least through a first lens, a first aperture, a second lens, a third lens, a second aperture and a fourth lens.

13. An inspecting apparatus as claimed in claim 1, further comprising an electric field adjusting lens.

14. An inspecting apparatus as claimed in claim 1, further comprising an electron source for irradiating electrons to the sample.

15. An inspecting apparatus as claimed in claim 1, wherein said electron beam has a rectangular or elliptic cross-section.

16. An inspecting apparatus as claimed in claim 1, further comprising an electromagnetic wave source for irradiating an electromagnetic wave to the sample.

17. An inspecting apparatus as claimed in claim 16, wherein the electromagnetic wave comprises any one of a UV ray, a DUV ray, an X ray and a laser beam.

18. An inspecting apparatus as claimed in claim 1, further comprising an electron source for irradiating electrons to the sample and an electromagnetic wave source for irradiating an electromagnetic wave to the sample.

19. An inspecting apparatus as claimed in claim 18, wherein the electromagnetic wave comprises any one of a UV ray, a DUV ray, an X ray and a laser beam.

20. An inspecting apparatus as claimed in claim 1, wherein the sample comprises any one of a wafer and an exposure mask.

21. An inspecting apparatus as claimed in claim 1, wherein said inspecting apparatus is used for a foreign material inspection.

22. An inspecting apparatus as claimed in claim 1, wherein said inspecting apparatus is used for defect inspection of a surface of the sample using a scattered beam from the sample.

23. An inspecting apparatus as claimed in claim 1, wherein said inspecting apparatus is used for pattern defect inspection.

24. An inspecting apparatus as claimed in claim 1, wherein said one of said plurality of detectors comprises any one of CCD sensors and EB-CCD sensors for conducting step-and-repeat inspection.

25. An inspecting apparatus as claimed in claim 1, wherein inspection is conducted on a cell by cell basis or a die by die basis.

26. An inspecting apparatus as claimed in claim 1, wherein inspection is conducted to detect misalignment in position of marks on upper and lower layers.

* * * * *